United States Patent
Song et al.

(10) Patent No.: US 9,761,603 B2
(45) Date of Patent: Sep. 12, 2017

(54) METHODS FOR FABRICATING A SEMICONDUCTOR DEVICE AND SEMICONDUCTOR DEVICES FABRICATED BY THE SAME

(71) Applicants: Min-Sung Song, Hwaseong-si (KR); Jae-Hwang Sim, Hwaseong-si (KR); Joon-Sung Lim, Yongin-si (KR)

(72) Inventors: Min-Sung Song, Hwaseong-si (KR); Jae-Hwang Sim, Hwaseong-si (KR); Joon-Sung Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/964,624

(22) Filed: Dec. 10, 2015

(65) Prior Publication Data

US 2016/0190004 A1    Jun. 30, 2016

(30) Foreign Application Priority Data

Dec. 26, 2014  (KR) .................. 10-2014-0190608

(51) Int. Cl.
| | | |
|---|---|---|
| *H01L 21/4763* | (2006.01) | |
| *H01L 27/11573* | (2017.01) | |
| *H01L 21/311* | (2006.01) | |
| *H01L 27/11526* | (2017.01) | |
| *H01L 21/033* | (2006.01) | |
| *H01L 21/768* | (2006.01) | |

(52) U.S. Cl.
CPC .... *H01L 27/11573* (2013.01); *H01L 21/0337* (2013.01); *H01L 21/31144* (2013.01); *H01L 21/76816* (2013.01); *H01L 27/11526* (2013.01)

(58) Field of Classification Search
CPC .......... H01L 21/0337; H01L 21/31144; H01L 21/76816; H01L 27/11526; H01L 27/11573

See application file for complete search history.

(56) References Cited

U.S. PATENT DOCUMENTS

| | | |
|---|---|---|
| 7,651,950 B2 | 1/2010 | Ban |
| 8,183,152 B2 | 5/2012 | Sim et al. |
| 8,227,354 B2 | 7/2012 | Kim et al. |
| 8,368,182 B2 | 2/2013 | Lee et al. |
| 8,389,383 B1* | 3/2013 | Hopkins ................. H01L 29/02 257/797 |
| 8,398,874 B2 | 3/2013 | Kwon et al. |
| 8,697,580 B2 | 4/2014 | Lee et al. |
| 2008/0017992 A1* | 1/2008 | Kito .................. H01L 21/32139 257/773 |
| 2010/0221919 A1* | 9/2010 | Lee ..................... H01L 21/0337 438/694 |
| 2011/0129991 A1* | 6/2011 | Armstrong .......... H01L 21/0273 438/585 |
| 2013/0237051 A1 | 9/2013 | Kikutani et al. |

(Continued)

*Primary Examiner* — Duy T Nguyen
(74) *Attorney, Agent, or Firm* — Myers Bigel, P.A.

(57) ABSTRACT

The inventive concepts provide methods for fabricating a semiconductor device and semiconductor devices fabricated by the same. According to the method, conductive lines having a fine pitch smaller than the minimum pitch realized by an exposure process may be formed using two or three photolithography processes and two spacer formation processes. In addition, node separation regions of the conductive lines may be easily formed without a misalignment problem.

20 Claims, 38 Drawing Sheets

(56) References Cited

U.S. PATENT DOCUMENTS

2013/0260557 A1 10/2013 Wang et al.
2014/0154885 A1 6/2014 Sim et al.
2014/0248773 A1 9/2014 Tsai

* cited by examiner

METHODS FOR FABRICATING A SEMICONDUCTOR DEVICE AND SEMICONDUCTOR DEVICES FABRICATED BY THE SAME

CROSS-REFERENCE TO RELATED APPLICATION

This U.S. non-provisional patent application claims priority under 35 U.S.C. §119 to Korean Patent Application No. 10-2014-0190608, filed on Dec. 26, 2014 in the Korean Intellectual Property Office, the disclosure of which is hereby incorporated by reference in its entirety.

BACKGROUND

The inventive concepts relate to methods for fabricating a semiconductor device and semiconductor devices fabricated by the same.

A double patterning technique may be used to form patterns having a pitch that is smaller than the minimum pitch that may be realized by an exposure apparatus. For example, spacers may be formed on both sidewalls of a sacrificial pattern formed using a photolithography process, and an etch target layer may be etched using the spacers as each masks to form fine patterns. However, as semiconductor devices have been highly integrated, new techniques capable of forming finer patterns have been demanded.

SUMMARY

Embodiments of the inventive concepts may provide methods for fabricating a semiconductor device capable of reducing or eliminating a misalignment problem and of simply forming fine patterns.

Embodiments of the inventive concepts may also provide semiconductor devices having improved reliability and integration density.

In one aspect, a method for fabricating a semiconductor device may include: sequentially forming an etch target layer, a lower mold layer, and an intermediate mold layer on a substrate, the etch target layer including a separation region; forming first mold patterns on the intermediate mold layer; forming first spacers on sidewalls of the first mold patterns; etching the intermediate mold layer using the first spacers as etch masks to form second mold patterns; forming second spacers on sidewalls of the second mold patterns; etching the lower mold layer using the second spacers as etch masks to form third mold patterns; forming a fourth mold pattern that at least partially covers at least one of the third mold patterns, the fourth mold pattern vertically overlapping the separation region; etching the etch target layer using the fourth mold pattern and ones of the third mold patterns that are exposed by the fourth mold pattern as etch masks to form insulating patterns; and forming conductive lines in spaces between the insulating patterns.

In an embodiment, the substrate may include a cell array region and a peripheral circuit region, and the separation region may be on the cell array region. The fourth mold pattern may include a plurality of fourth mold patterns, and a one of the fourth mold patterns that is on the peripheral circuit region may expose a portion of the etch target layer that is on the peripheral circuit region.

In an embodiment, the first, second and third mold patterns may be formed on the cell array region.

In an embodiment, forming the first mold patterns may include: forming an upper mold layer on the intermediate mold layer; forming photoresist patterns on the upper mold layer, the photoresist patterns covering the upper mold layer of the peripheral circuit region but exposing portions of the upper mold layer of the cell array region; and etching the upper mold layer using the photoresist patterns as etch masks to form the first mold patterns on the cell array region.

In an embodiment, the portion of the lower mold layer that is on the peripheral circuit region may be completely etched when the third mold patterns are formed.

In an embodiment, forming the fourth mold patterns may include: forming a preliminary mold layer on the third mold patterns; forming photoresist patterns on the preliminary mold layer; and etching the preliminary mold layer using the photoresist patterns as etch masks to form fourth mold patterns. The photoresist pattern on the cell array region may vertically overlap the separation region.

In an embodiment, the third mold patterns may include a first extension pattern and a second extension pattern that extend in parallel to each other in one direction, and one sidewall of the fourth mold pattern may be disposed between the first extension pattern and the second extension pattern.

In an embodiment, etching the etch target layer to form the insulating patterns may include: etching a portion of the etch target layer, which is exposed by the fourth mold pattern between the first and second extension patterns, to form a dummy trench.

In an embodiment, a width of a portion of the dummy trench may be substantially equal to a maximum width of the first spacer, and a width of another portion of the dummy trench may be smaller than the maximum width of the first spacer.

In an embodiment, forming the conductive lines may include: forming a dummy interconnection in the dummy trench. The dummy interconnection may be between the separation region and a first of the insulating patterns that is adjacent the separation region.

In an embodiment, the method may further include: forming a first mask layer on the intermediate mold layer before forming the first mold patterns; and etching the first mask layer using the first spacers as etch masks to form first mask patterns. The first mask patterns may be also used as etch masks when the intermediate mold layer is etched.

In an embodiment, a width of at least one of the first mold patterns may be about three times a maximum width of one of the first spacers.

In an embodiment, a distance between adjacent ones of the first mold patterns may be about five times a maximum width of one of the first spacers.

In an embodiment, a width of at least one of the second mold patterns and a width of the third mold pattern may be substantially equal to a maximum width of one of the first spacers.

In an embodiment, a distance between adjacent ones of the second mold patterns may be about three times a maximum width of one of the first spacers.

In an embodiment, a distance between adjacent ones of the third mold patterns may be substantially equal to a maximum width of one of the first spacers.

In an embodiment, a maximum width of at least one of the second spacers may be substantially equal to a maximum width of one of the first spacers.

In another aspect, a semiconductor device may include: insulating patterns on a substrate; and a plurality of conductive lines in spaces between the insulating patterns, the conductive lines extending parallel to each other. The conductive lines may include a first dummy interconnection, a second dummy interconnection, and cell interconnections disposed between the first and second dummy interconnections. The insulating patterns may include a separation insulating pattern. The first and second dummy interconnections may be spaced apart from each other with the separation insulating pattern interposed therebetween.

In an embodiment, a width of a portion of the first dummy interconnection may be substantially equal to a width of each of the cell interconnections, and a width of a portion of the second dummy interconnection may be substantially equal to the width of each of the cell interconnections, and a width of another portion of the first dummy interconnection may be smaller than the width of the cell interconnection and a width of another portion of the second dummy interconnection may be smaller than the width of the cell interconnection.

In an embodiment, a distance between the first dummy interconnection and a first of the cell interconnections that is adjacent the first dummy interconnection is substantially equal to a width of the cell interconnection, and a distance between the second dummy interconnection and a second of the cell interconnections that is adjacent the second dummy interconnection may be substantially equal to the width of the cell interconnection.

In an embodiment, the substrate may include a cell array region and a peripheral circuit region, and the conductive lines may further include: a peripheral interconnection on the peripheral circuit region.

In still another aspect, a method for fabricating a semiconductor device may include: sequentially forming an etch target layer and a lower mold layer on a substrate, the etch target layer including a separation region; forming a first etch stop pattern on the lower mold layer, the first etch stop pattern vertically overlapping the separation region; forming an intermediate mold layer on the lower mold layer, the intermediate mold layer at least partially covering the first etch stop pattern; forming first mold patterns on the intermediate mold layer; forming first spacers on sidewalls of the first mold patterns; etching the intermediate mold layer using the first spacers as etch masks to form second mold patterns, where portions of the second mold patterns are on the first etch stop pattern; forming second spacers on sidewalls of the second mold patterns; etching portions of the first etch stop pattern to form second etch stop patterns during the formation of the second spacers; etching the lower mold layer using the second spacers and the second etch stop patterns as etch masks to form third mold patterns; etching the etch target layer using the third mold patterns as etch masks to form insulating patterns; and forming conductive lines in spaces between the insulating patterns.

In an embodiment, a pair of the second spacers may be disposed on respective ones of the second etch stop patterns, and outer sidewalls of each pair of second spacers may be coplanar with outer sidewalls of respective ones of the second etch stop patterns. A distance between adjacent ones of the pairs of second spacers may be substantially equal to a maximum width of the second spacer.

In an embodiment, forming the first etch stop pattern may include: sequentially forming an etch stop layer and a preliminary mold layer on the lower mold layer; forming a first photoresist pattern on the preliminary mold layer; etching the preliminary mold layer using the first photoresist pattern as an etch mask to form a fourth mold pattern; and etching the etch stop layer using the fourth mold pattern as an etch mask to form the first etch stop pattern. The first photoresist pattern may vertically overlap the separation region.

In an embodiment, the substrate may include a cell array region and a peripheral circuit region, and the separation region may be on the cell array region.

In an embodiment, the first etch stop pattern may include a plurality of first etch stop patterns, and one of the first etch stop patterns that is on the peripheral circuit region may expose a portion of the lower mold layer that is on the peripheral circuit region.

In an embodiment, the first and second mold patterns may be formed on the cell array region, and the one of the first etch stop patterns that is on the peripheral circuit region may remain when the second etch stop patterns are formed on the cell array region.

In an embodiment, forming the first mold patterns may include: forming an upper mold layer on the intermediate mold layer; forming second photoresist patterns on the upper mold layer, the second photoresist patterns covering the portions of the upper mold layer that are on the peripheral circuit region but exposing portions of the upper mold layer of the cell array region; and etching the upper mold layer using the second photoresist patterns as etch masks to form the first mold patterns on the cell array region.

In an embodiment, forming the first spacers may include: forming a first spacer layer covering the first mold patterns; forming a third photoresist pattern covering portions of the first spacer layer that are on the peripheral circuit region, the third photoresist pattern exposing at least a portion of the first spacer layer that is on the cell array region; and anisotropically etching the first spacer layer using the third photoresist pattern as an etch mask to form the first spacers.

In an embodiment, the method may further include: forming a first mask layer on the intermediate mold layer before forming the first mold patterns; and etching the first mask layer using the first spacers as etch masks to form first mask patterns. The first mask patterns may be also used as etch masks when the intermediate mold layer is etched, and the first mask patterns may remain on the second mold patterns after the formation of the second mold patterns.

In an embodiment, forming the second spacers and the second etch stop patterns may include: forming a second spacer layer on the second mold patterns and the first mask patterns; anisotropically etching the second spacer layer until the first mask patterns are exposed, thereby forming the second spacers; and anisotropically etching portions of the first etch stop pattern that are exposed by the first mask patterns, the second spacers and the second mold patterns to form the second etch stop patterns.

In an embodiment, a width of at least one of the first mold patterns may be about three times a maximum width of one of the first spacers.

In an embodiment, a distance between adjacent ones of the first mold patterns may be about five times a maximum width of one of the first spacers.

In an embodiment, a width of at least one of the second mold patterns may be substantially equal to a maximum width of one of the first spacers.

In an embodiment, a distance between adjacent ones of the second mold patterns may be about three times a maximum width of one of the first spacers.

In an embodiment, a maximum width of at least one of the second spacers may be substantially equal to a maximum width of one of the first spacers.

In an embodiment, a width of at least one of the second etch stop patterns may be about three times a maximum width of one of the first spacers.

In an embodiment, a distance between adjacent ones of the second etch stop patterns may be substantially equal to a maximum width of one of the first spacers.

In an embodiment, a width of at least one of the third mold patterns that is on the separation region may be about three times a maximum width of the first spacer, and a width of one of the third mold patterns that is adjacent the separation region may be substantially equal to the maximum width of one of the first spacers.

In an embodiment, a distance between adjacent ones of the third mold patterns may be substantially equal to a maximum width of one of the first spacers.

In an embodiment, forming the first spacers may include: forming a first spacer layer on the first mold patterns; forming a third photoresist pattern on the first spacer layer, the third photoresist pattern vertically overlapping a portion of the separation region; and anisotropically etching the first spacer layer using the third photoresist pattern as an etch mask to form the first spacers.

In an embodiment, a portion of the first spacer layer which is not etched by the photoresist pattern comprises a separation spacer layer. Etching the intermediate mold layer to form the second mold patterns may include: etching the intermediate mold layer using the first spacers and the separation spacer layer as etch masks to form the second mold patterns and a separation mold pattern. The separation mold pattern may be on the first etch stop pattern.

In an embodiment, the second etch stop patterns may include a separation etch stop pattern, and the separation etch stop pattern may vertically overlap the separation mold pattern and a pair of the second spacers covering opposed sidewalls of the separation mold pattern.

In an embodiment, the pair of the second spacers may be on the separation etch stop pattern, and outer sidewalls of the pair of second spacers may be coplanar with outer sidewalls of the separation etch stop pattern. A distance between the pair of second spacers may be greater than a maximum width of the second spacer.

In an embodiment, a width of the separation etch stop pattern may be greater than about three times a maximum width of one of the first spacers.

In an embodiment, the insulating patterns may include a separation insulating pattern corresponding to the separation etch stop pattern, and the conductive lines adjacent to the separation insulating pattern may be spaced apart from each other by the separation insulating pattern.

In yet another aspect, a semiconductor device may include: insulating patterns on a substrate; and a plurality of conductive lines in spaces between the insulating patterns, the conductive lines extending parallel to each other. The conductive lines may include a first cell interconnection, a second cell interconnection, and a third cell interconnection that is disposed between the first and second cell interconnections. One end portion of the second cell interconnection may protrude more than one end portion of the third cell interconnection in a direction parallel to the first to third cell interconnections when viewed in plan view. One end portion of the first cell interconnection may protrude more than the one end portion of the second cell interconnection in the direction parallel to the first to third cell interconnections when viewed in plan view.

In an embodiment, a distance between the first and second cell interconnections may be about three times a width of the first cell interconnection.

In an embodiment, the insulating patterns may include a separation insulating pattern, and the conductive lines adjacent to the separation insulating pattern may be spaced apart from each other by the separation insulating pattern.

In an embodiment, a distance between the conductive lines respectively adjacent to both sidewalls of the separation insulating pattern may be greater than about three times a minimum width of the conductive lines.

In still another aspect, a method for fabricating a semiconductor device may include: forming an etch target layer on a substrate, the etch target layer including a separation region; forming a lower mold layer on the etch target layer opposite the substrate; forming an intermediate mold layer on the lower mold layer opposite the etch target layer; forming first mold patterns on the intermediate mold layer; forming first spacers on sidewalls of the first mold patterns, wherein a first of the first spacers that is on a sidewall of a first of the first mold patterns has a maximum width that is about one third a maximum width of the first of the first mold patterns; etching the intermediate mold layer using the first spacers as etch masks to form second mold patterns, wherein a first of the second mold patterns has a width that is substantially equal to the maximum width of the first of the first spacers; forming second spacers on sidewalls of the second mold patterns, wherein a first of the second spacers has a width that is substantially equal to the maximum width of the first of the first spacers; etching the lower mold layer using at least the second spacers as etch masks to form third mold patterns; etching the etch target layer using at least some of the third mold patterns as etch masks to form etch target layer patterns; and forming conductive lines in spaces between the etch target layer patterns.

In an embodiment, a distance between adjacent ones of the first mold patterns may be about five times a maximum width of the first of the first spacers, and a distance between adjacent ones of the second mold patterns may be about three times a maximum width of the first of the first spacers.

In some embodiments, the method may further include, after forming the third mold patterns: forming a fourth mold pattern on at least one of the third mold patterns, the fourth mold pattern vertically overlapping the separation region. In such embodiments, etching the etch target layer using at least some of the third mold patterns as etch masks to form etch target layer patterns may comprise etching the etch target layer using the fourth mold pattern and ones of the third mold patterns that are exposed by the fourth mold pattern as etch masks to form the etch target layer patterns.

In some embodiments, the method may further include, after forming the lower mold layer but before forming the intermediate mold layer, forming a first etch stop pattern on the lower mold layer, the first etch stop pattern vertically overlapping the separation region. In such embodiments, the intermediate mold layer may at least partially cover the first etch stop pattern.

In some embodiments, portions of the second mold patterns may be on the first etch stop pattern.

In same embodiments, the method may further include, etching portions of the first etch stop pattern to form second etch stop patterns during the formation of the second spacers.

In some embodiments, etching the lower mold layer using at least the second spacers as etch masks to form third mold patterns may comprise etching the lower mold layer using the second spacers and the second etch stop patterns as etch masks to form the third mold patterns.

BRIEF DESCRIPTION OF THE DRAWINGS

The inventive concepts will become more apparent in view of the attached drawings and accompanying detailed description.

FIGS. 1A to 12A are plan views illustrating a method for fabricating a semiconductor device according to some embodiments of the inventive concepts;

FIGS. 1B to 8B are cross-sectional views taken along lines A-A' and B-B' of FIGS. 1A to 8A, respectively;

FIGS. 9B to 12B are cross-sectional views taken along lines A-A', B-B', and C-C' of FIGS. 9A to 12A, respectively;

FIGS. 13A to 22A are plan views illustrating a method for fabricating a semiconductor device according to other embodiments of the inventive concepts;

FIGS. 13B to 22B are cross-sectional views taken along lines A-A', B-B', and C-C' of FIGS. 13A to 22A, respectively;

FIGS. 24A to 29A are plan views illustrating a method for fabricating a semiconductor device according to still other embodiments of the inventive concepts;

FIGS. 24B to 29B are cross-sectional views taken along lines A-A', B-B', and C-C' of FIGS. 24A to 29A, respectively;

DETAILED DESCRIPTION OF THE EMBODIMENTS

Figure 1A:
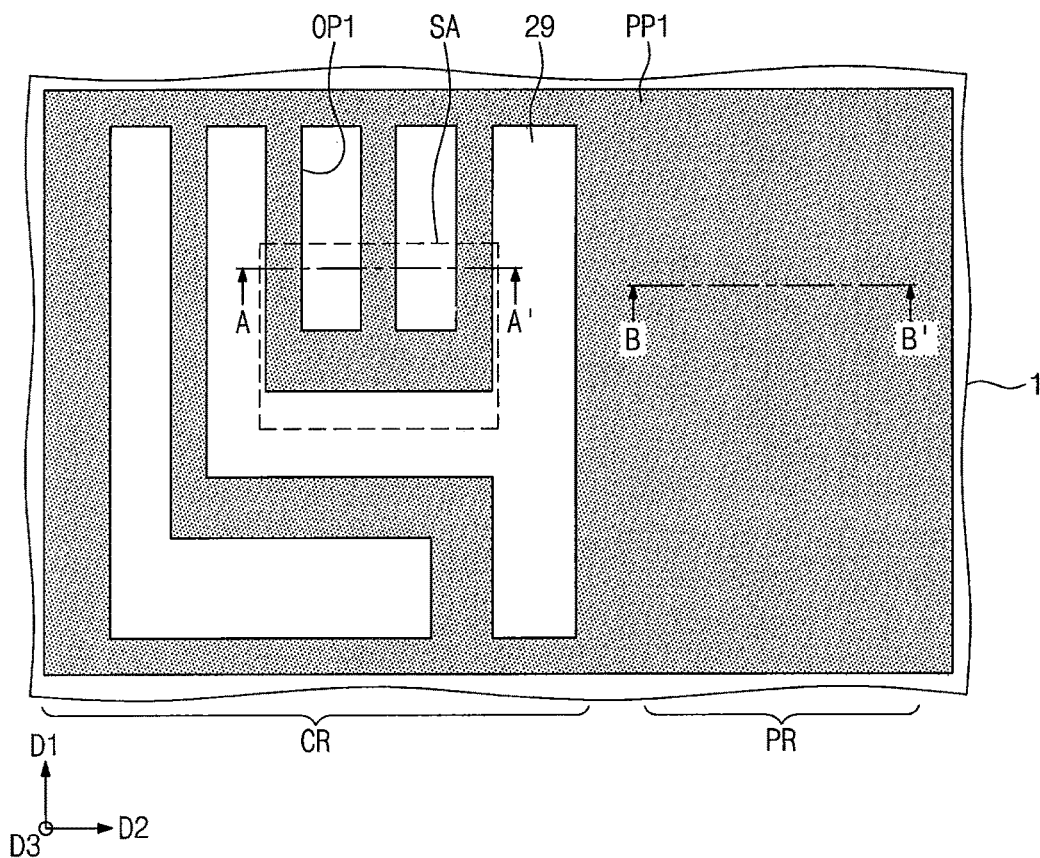

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts. The same reference numerals or the same reference designators denote the same elements throughout the specification. Note that the different widths (e.g., width W7 described later herein) discussed in different embodiments may refer to different widths in the different embodiments.

Moreover, exemplary embodiments are described herein with reference to cross-sectional illustrations and/or plane illustrations that may be idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etched region that is illustrated as having vertical sidewalls will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIGS. 1A to 12A are plan views illustrating a method for fabricating a semiconductor device according to some embodiments of the inventive concepts. FIGS. 1B to 8B are cross-sectional views taken along lines A-A' and B-B' of FIGS. 1A to 8A, respectively. FIGS. 9B to 12B are cross-sectional views taken along lines A-A', B-B', and C-C' of FIGS. 9A to 12A, respectively.

Figure 1B:
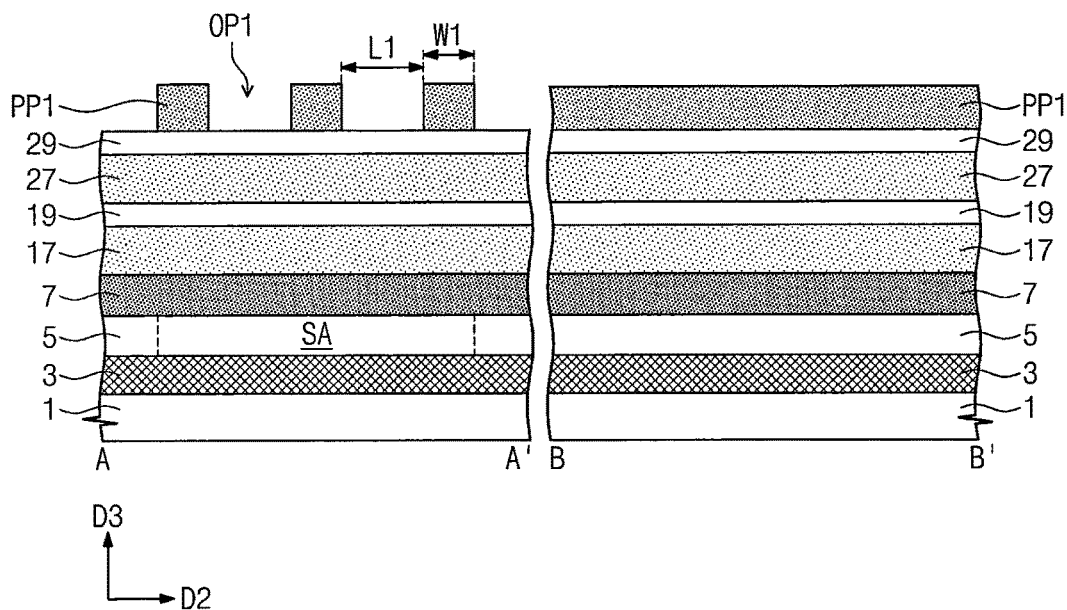

Referring to FIGS. 1A and 1B, an interlayer insulating layer 3, an etch target layer 5, a lower mold layer 7, an intermediate mold layer 17, a first mask layer 19, an upper mold layer 27, and a second mask layer 29 may be sequentially formed on a substrate 1.

The substrate 1 may include a cell array region CR and a peripheral circuit region PR. Although not shown in the drawings, a plurality of transistors may be formed on the cell array region CR of the substrate 1. The interlayer insulating layer 3 may be a silicon oxide layer that covers the transistors. A plurality of contacts (not shown) may penetrate the interlayer insulating layer 3 so as to be connected to the transistors. The substrate 1 may be a single-crystalline silicon wafer or a silicon-on-insulator (SOI) substrate.

The portion of the etch target layer 5 that is disposed on the cell array region CR may include a separation region SA. The separation region SA may be defined as a region in which conductive lines 51, 53a, 53b and 55 that are described later herein are not formed. Since the conductive lines 51, 53a, 53b and 55 are not formed in the separation region SA, node separation may be realized through the separation region SA.

For example, the etch target layer 5 may be a silicon oxide layer, a silicon oxynitride layer, a silicon nitride layer, or a plasma-enhanced oxide (PE-oxide) layer. The lower mold layer 7 may be a poly-silicon layer. The intermediate mold layer 17 and the upper mold layer 27 may be the same material. For example, the intermediate mold layer 17 and the upper mold layer 27 may each be a spin-on-hardmask (SOH) layer or a spin-on-carbon (SOC) layer. The first and second mask layers 19 and 29 may be the same material. For example, the first and second mask layers 19 and 29 may be a silicon oxynitride layer.

First photoresist patterns PP1 may be formed on the second mask layer 29. The first photoresist pattern PP1 of the peripheral circuit region PR may completely cover the second mask layer 29 of the peripheral circuit region PR when viewed in plan view. The first photoresist patterns PP1 disposed on the cell array region CR may define first openings OP1. The first openings OP1 may expose portions of a top surface of the second mask layer 29. The first photoresist patterns PP1 of the cell array region CR may define outlines of the conductive lines 51, 53a, 53b and 55 that are described later herein.

Referring again to FIG. 1I, a width W1 of one or more of the first photoresist patterns PP1 may be about three times the maximum width W2 of a first spacer 31p that will be described later. A distance L1 between adjacent ones of the first photoresist patterns PP1 may be about five times the maximum width W2 of the first spacer 31P.

Figure 2A:
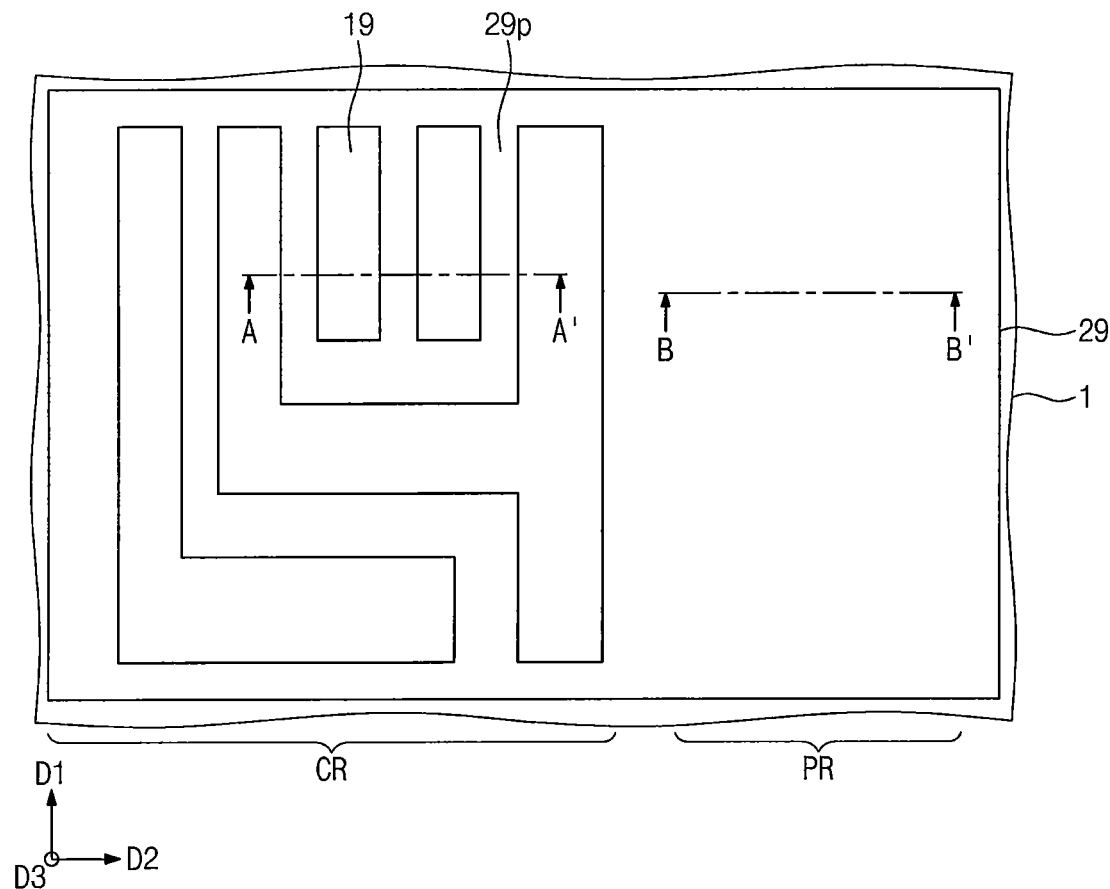
Figure 2B:
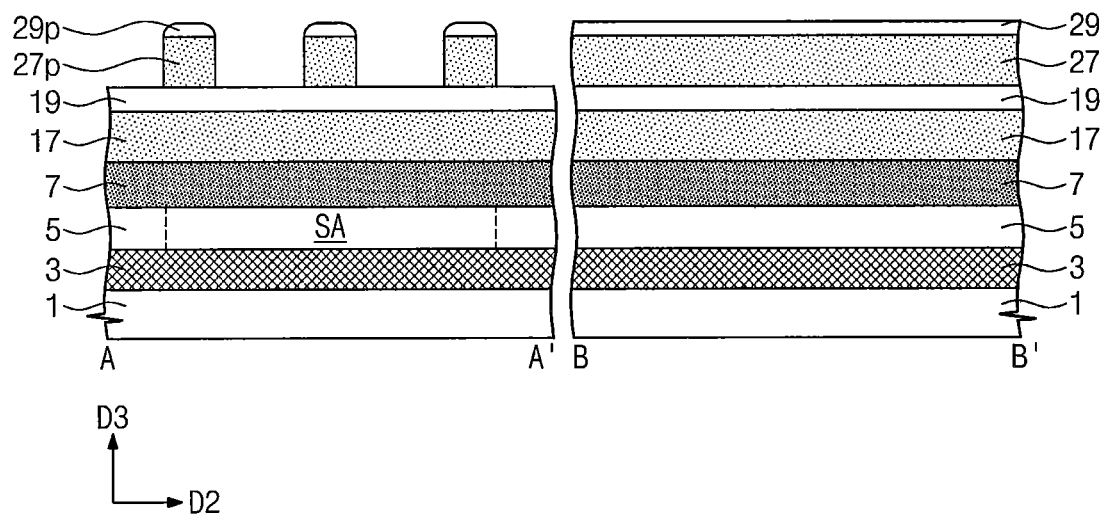

Referring to FIGS. 2A and 2I, the second mask layer 29 may be etched using the first photoresist patterns PP1 as etch masks to form second mask patterns 29p. Shapes of the second mask patterns 29P may corresponding to those of the first photoresist patterns PP1 when viewed in plan view. The second mask layer 29 disposed on the peripheral circuit region PR may not be etched but may remain.

Next, the upper mold layer 27 may be etched using the second mask patterns 29P as etch masks to form first mold patterns 27p. Shapes of the first mold patterns 27p may correspond to those of the second mask patterns 29p when viewed in plan view. The first mold patterns 27p may expose portions of a top surface of the first mask layer 19 through openings defined between the first mold patterns 27p. The upper mold layer 27 disposed on the peripheral region PR may not be etched but may remain.

The first photoresist patterns PP1 may be completely removed during the formation of the first mold patterns 27p, so top surfaces of the second mask patterns 29p may be exposed. Alternatively, the first photoresist patterns PP1 may be removed before the formation of the first mold patterns 27p. Portions of the second mask patterns 29p may be etched during the formation of the first mold patterns 27p.

Figure 3A:
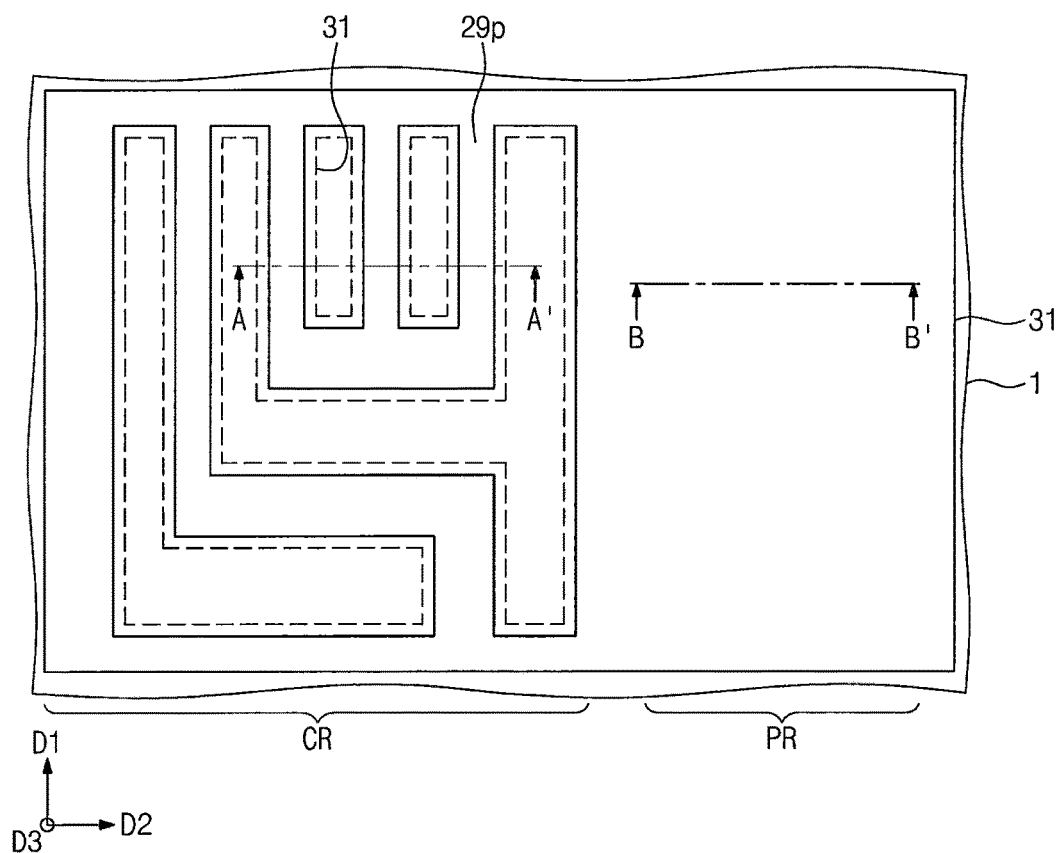
Figure 3B:
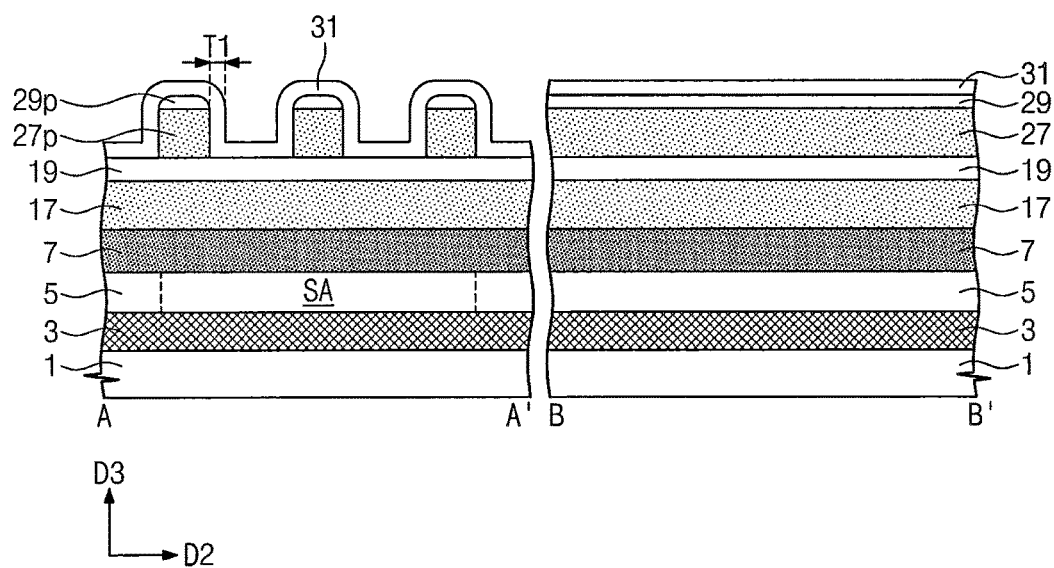

Referring to FIGS. 3A and 3I, a first spacer layer 31 may be conformally formed on an entire top surface of the substrate 1. In some embodiments, the first spacer layer 31 may be formed of a material having an etch selectivity with respect to the first mask layer 19, the upper mold layer 27 and the second mask layer 29. For example, the first spacer layer 31 may include a silicon oxide layer which is formed by an atomic layer deposition (ALD) method. A thickness T1 of the first spacer layer 31 may be substantially equal to the maximum width W2 of the first spacer 31p that is described later.

Figure 4A:
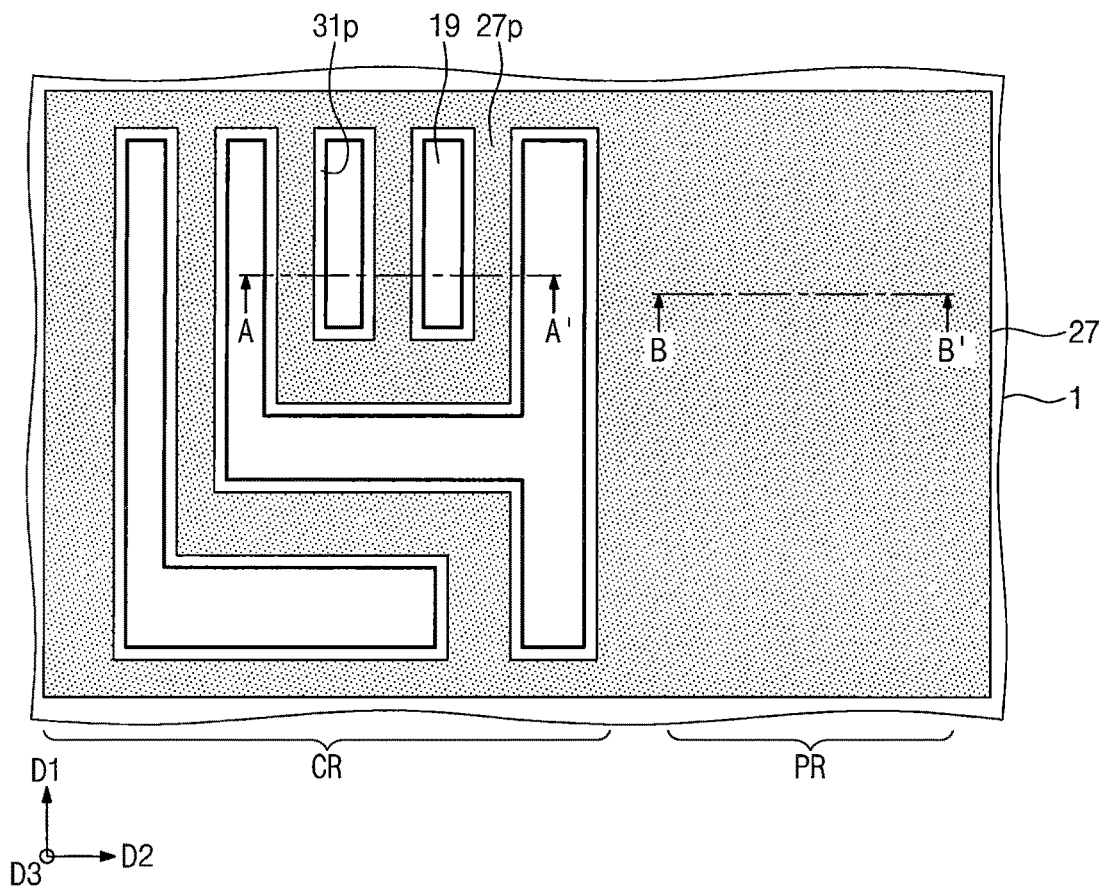
Figure 4B:
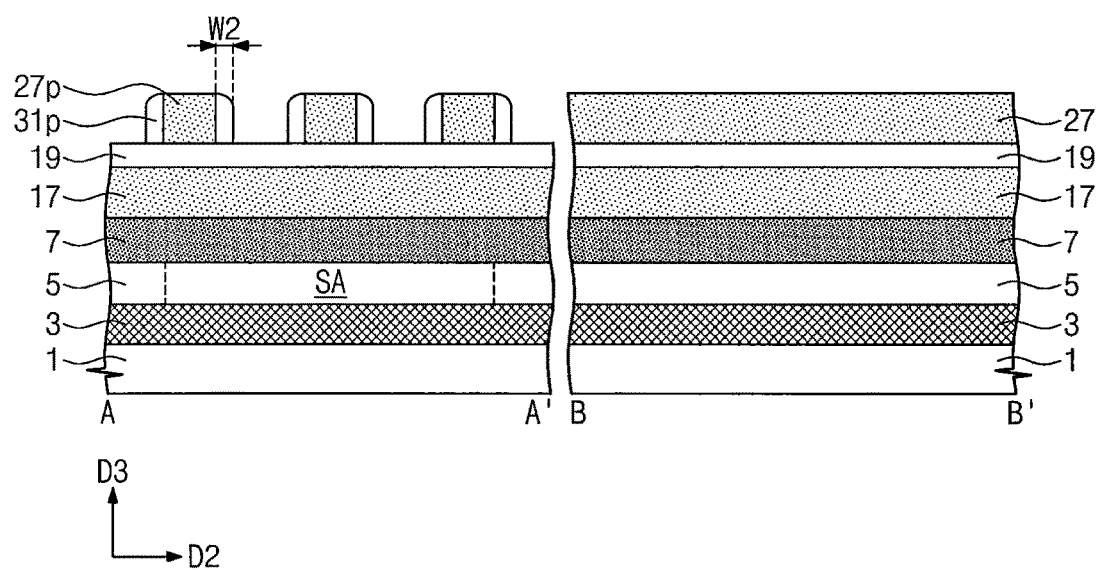

Referring to FIGS. 4A and 4B, the first spacer layer 31 may be anisotropically etched to form first spacers 31P which cover sidewalls of the first mold patterns 27p. The maximum width W2 of the first spacer 31p may correspond to a width of a bottom surface of the first spacer 31p. The maximum width W2 of each of the first spacers 31p may be defined as '1F'.

Subsequently, the second mask patterns 29p may be selectively etched to expose top surfaces of the first mold patterns 27p. Meanwhile, the portion of the second mask layer 29 that is disposed on the peripheral circuit region PR may be selectively removed to expose a top surface of the upper mold layer 27 of the peripheral circuit region PR.

Figure 5A:
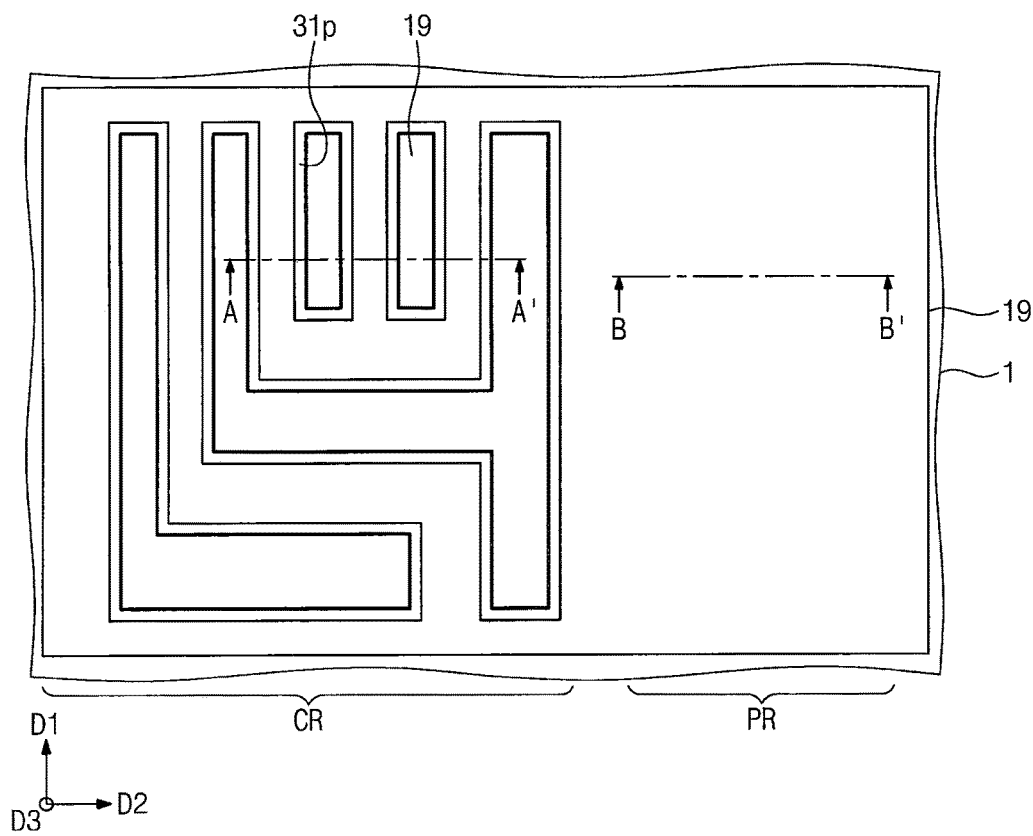
Figure 5B:
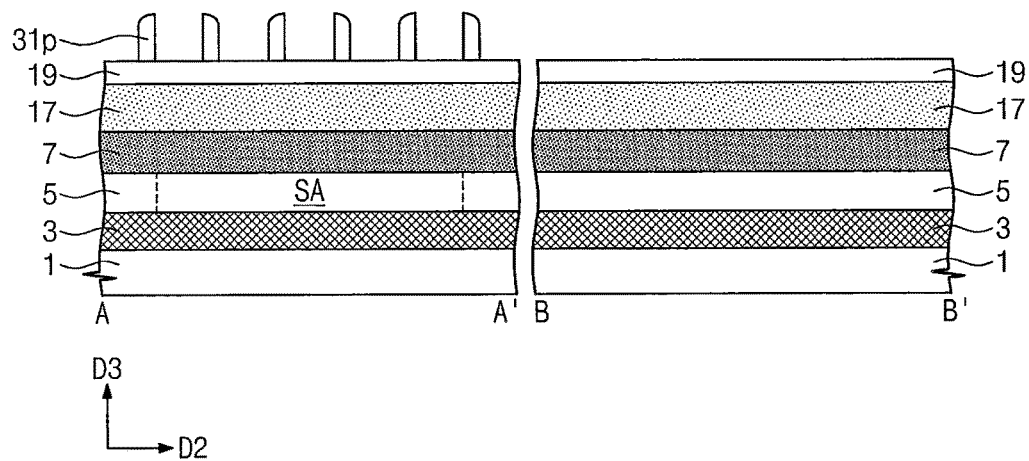

Referring to FIGS. 5A and 5B, the first mold patterns 27p of the cell array region CR and the upper mold layer 27 of the peripheral circuit region PR may be selectively removed to expose a top surface of the first mask layer 19 and the first spacers 31p. If the upper mold layer 27 is an SOH layer, the first mold patterns 27p and the upper mold layer 27 may be removed by an ashing process using oxygen.

Figure 6A:
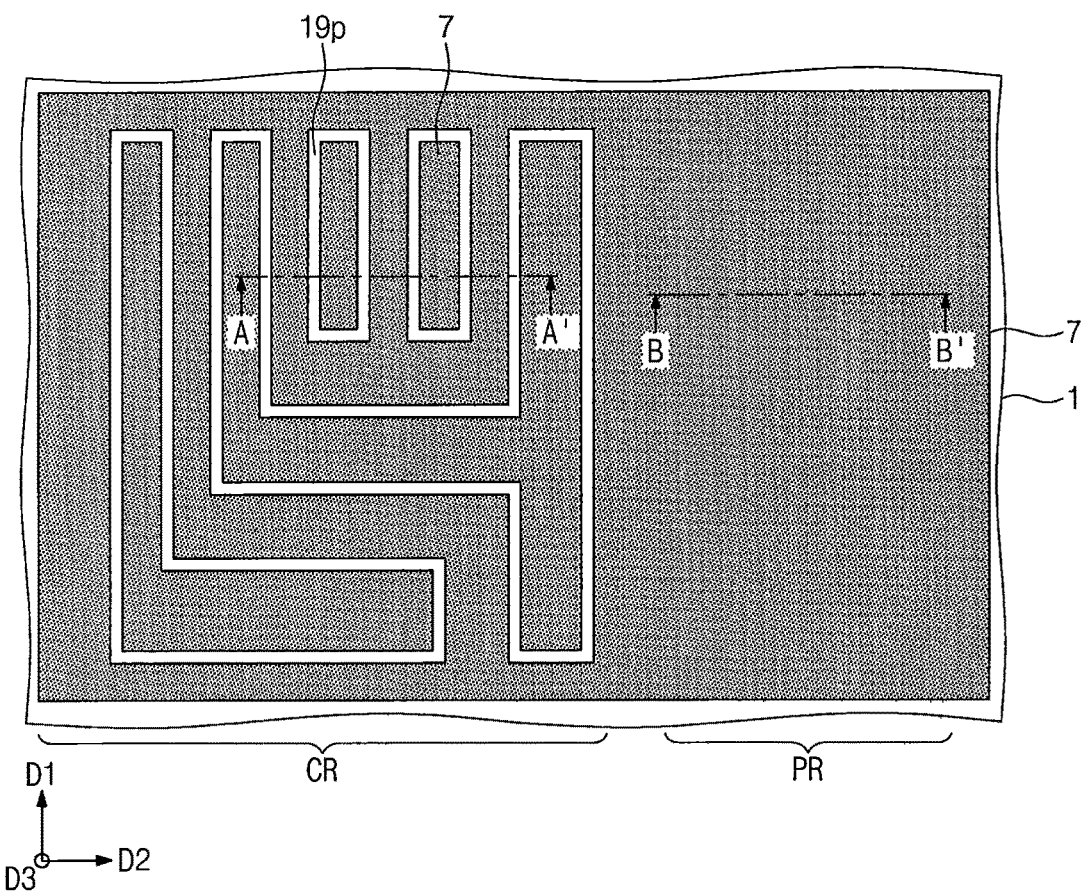
Figure 6B:
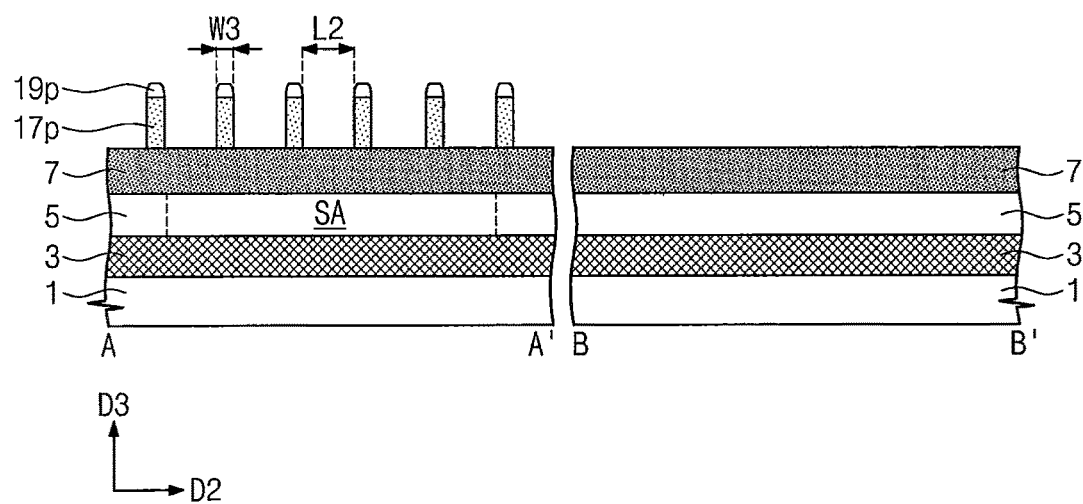

Referring to FIGS. 6A and 6B, the first mask layer 19 may be etched using the first spacers 31p as etch masks to form first mask patterns 19p on the cell array region CR. Shapes of the first mask patterns 19p may correspond to those of the first spacers 31p when viewed in plan view. The first mask layer 19 may be completely removed in the peripheral circuit region PR.

Next, the intermediate mold layer 17 may be etched using the first mask patterns 19p as etch masks to form second mold patterns 17p. Shapes of the second mold patterns 17p may correspond to those of the first mask patterns 19p when viewed in plan view. The second mold patterns 17p may expose portions of a top surface of the lower mold layer 7 through openings defined between the second mold patterns 17p. The intermediate mold layer 17 may be completely removed in the peripheral circuit region PR to expose a top surface of the lower mold layer 7 in the peripheral circuit region PR.

A width W3 of each of the second mold patterns 17p may be substantially equal to the maximum width W2 of the first spacer 31p (e.g., W3=1F). A distance L2 between adjacent ones of the second mold patterns 17p may be about three times the maximum width W2 of the first spacer 31p (e.g., L2=3F).

Figure 7A:
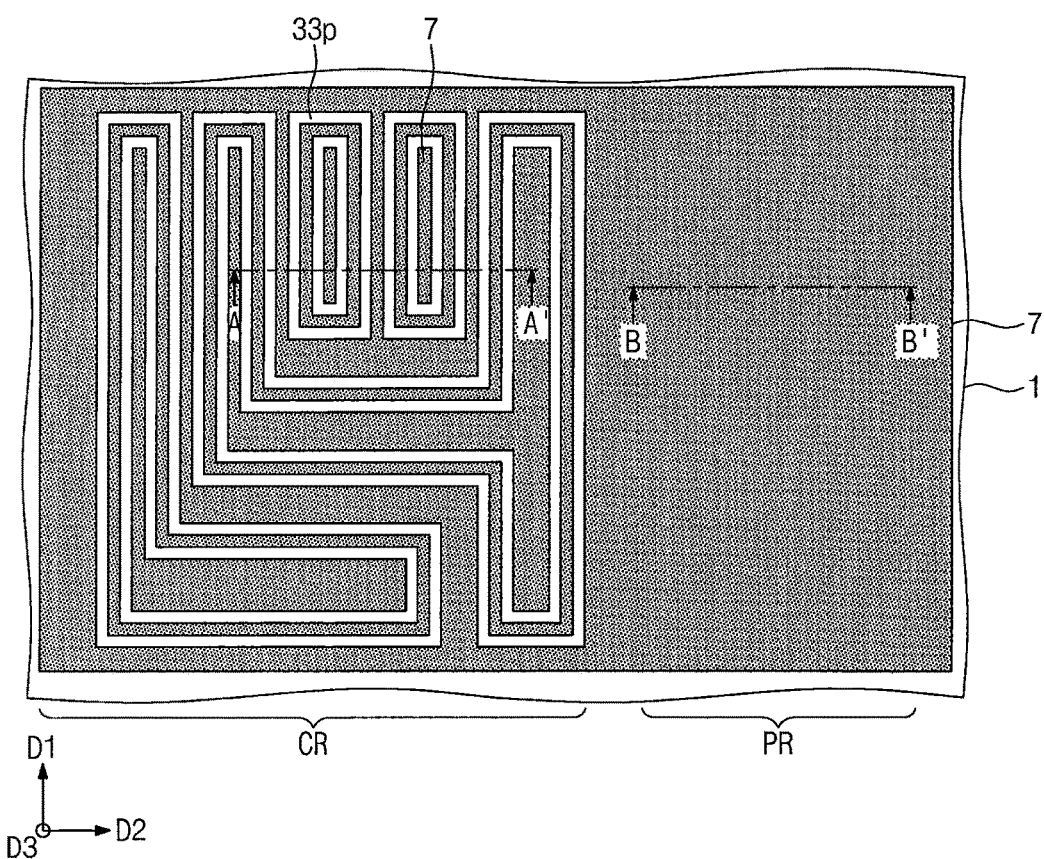
Figure 7B:
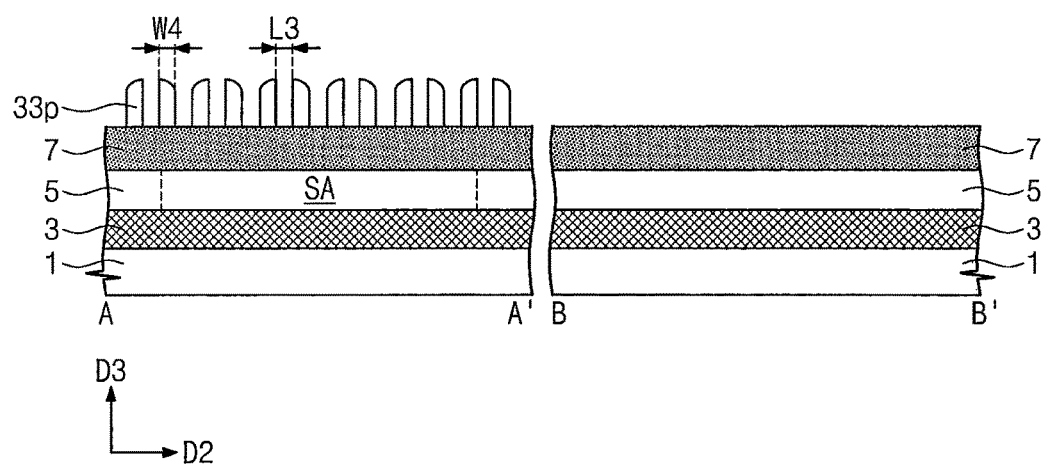

Referring to FIGS. 7A and 7B, a second spacer layer may be conformally formed on an entire top surface of the substrate 1. The second spacer layer may comprise a material having an etch selectivity with respect to the intermediate mold layer 17 and the lower mold layer 7. For example, the second spacer layer may include a silicon oxide layer which is formed by an ALD method.

Subsequently, the second spacer layer may be anisotropically etched to form second spacers 33p covering sidewalls of the second mold patterns 17p. The maximum width W4 of each of the second spacers 33p may be substantially equal to the maximum width W2 of the first spacer 31p (e.g., W4=1F). A distance L3 between adjacent ones of the second spacers 33p may be substantially equal to the maximum width W2 of the first spacer 31p (e.g., L3=1F).

The first mask patterns 19p may be selectively removed to expose top surfaces of the second mold patterns 17p. In addition, the second mold patterns 17p may be removed. Since the second mold patterns 17p are selectively removed, a top surface of the lower mold layer 7 and the second spacers 33p may be exposed. If the intermediate mold layer 17 is an SOH layer, the second mold patterns 17p may be removed by an ashing process using oxygen.

The lower mold layer 7 may have an etch selectivity with respect to the second spacer layer, the first mask patterns 19p and the second mold patterns 17p. Thus, the lower mold layer 7 may remain on the cell array region CR and the peripheral circuit region PR during the formation of the second spacers 33p.

Figure 8A:
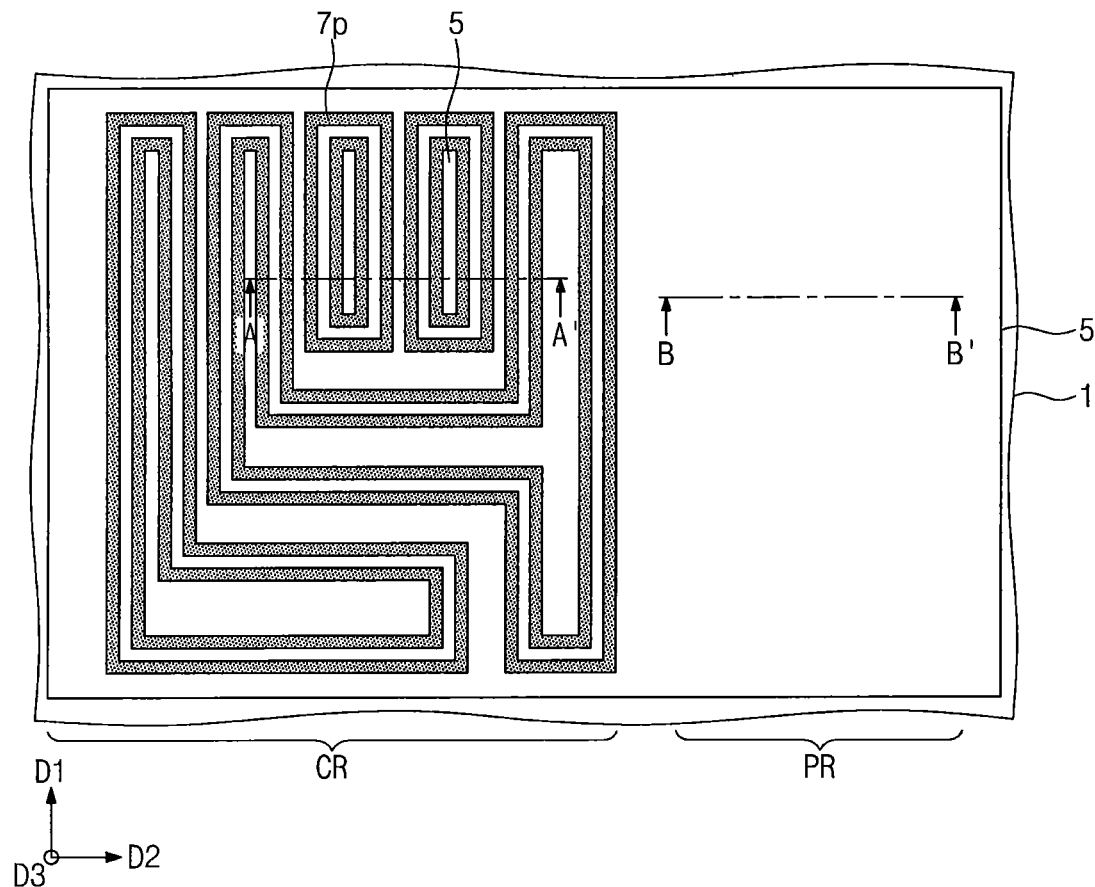
Figure 8B:
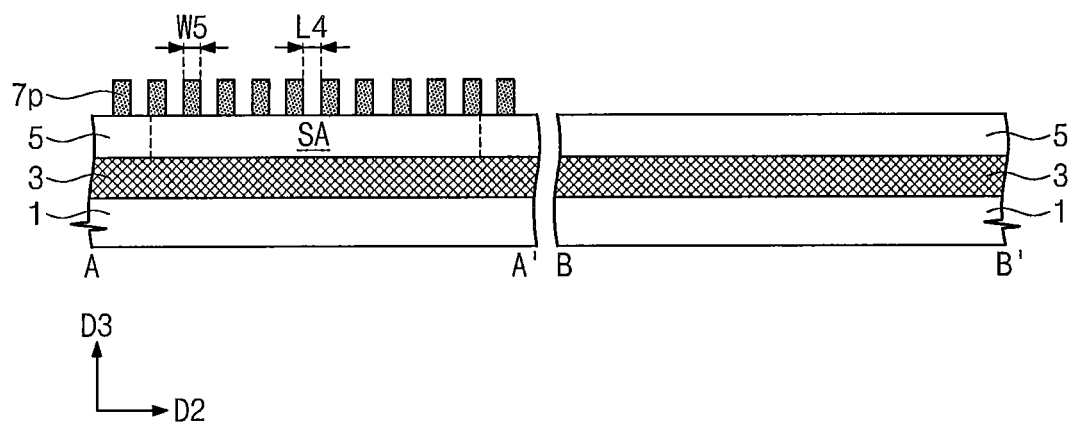

Referring to FIGS. 8A and 8B, the lower mold layer 7 may be etched using the second spacers 33p as etch masks to form third mold patterns 7p on the cell array region CR. Shapes of the third mold patterns 7p may correspond to those of the second spacers 33p when viewed in plan view. The third mold patterns 7p may expose portions of a top surface of the etch target layer 5 through openings defined between the third mold patterns 7p. The lower mold layer 7 may be removed in the peripheral circuit region PR to completely expose a top surface of the etch target layer 5 in the peripheral circuit region PR.

A width W5 of each of the third mold patterns 7p may be substantially equal to the maximum width W2 of the first spacer 31p (e.g., W5=1F). A distance L4 between adjacent ones of the third mold patterns 7p may be substantially equal to the maximum width W2 of the first spacer 31p (e.g., L4=1F).

Figure 9A:
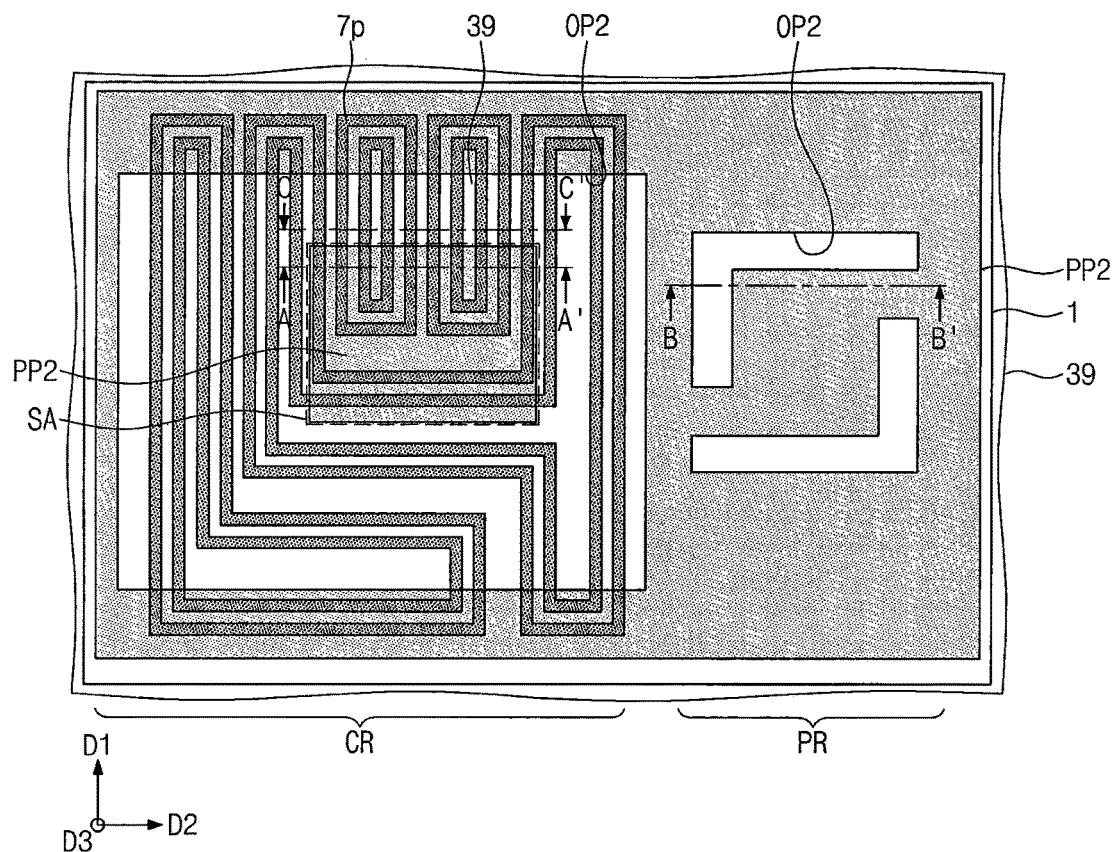
Figure 9B:
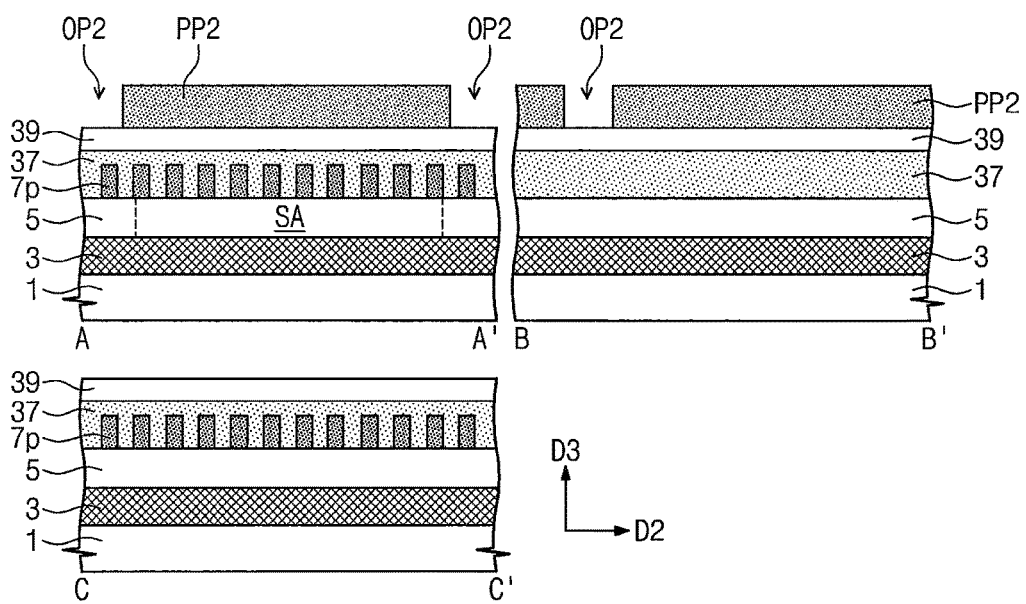

Referring to FIGS. 9A and 9B, a preliminary mold layer 37 may be formed to cover the third mold patterns 7p, and a preliminary mask layer 39 may be formed on the preliminary mold layer 37. In the peripheral circuit region PR, the preliminary mold layer 37 may cover a top surface of the lower mold layer 7. For example, the preliminary mold layer 37 may be an SOH layer or an SOC layer. The preliminary mask layer 39 may be a silicon oxynitride layer.

Second photoresist patterns PP2 may be formed on the preliminary mask layer 39. The second photoresist patterns PP2 may define second openings OP2. The second openings OP2 may expose portions of a top surface of the preliminary mask layer 39.

At least one of the second photoresist patterns PP2 may vertically overlap with the separation region SA when viewed in plan view (i.e., a line can be drawn that is perpendicular to the bottom surface of the substrate 1 that bisects at least one of the second photoresist patterns PP2 and the separation region SA). The second opening OP2 of the cell array region CR may define the conductive lines 51, 53a, 53b and 55 that are described later herein. The second openings OP2 of the peripheral circuit region PR may define peripheral interconnections 55 that are also described later herein.

Figure 10A:
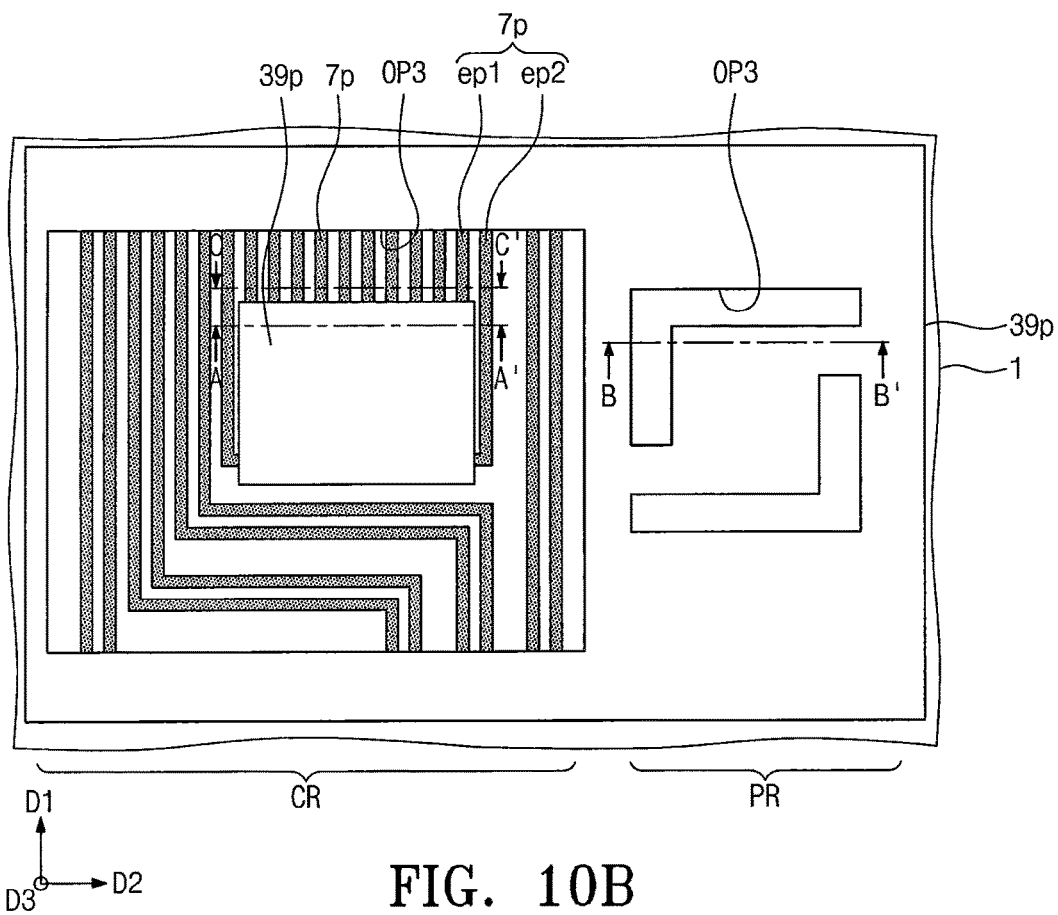
Figure 10B:
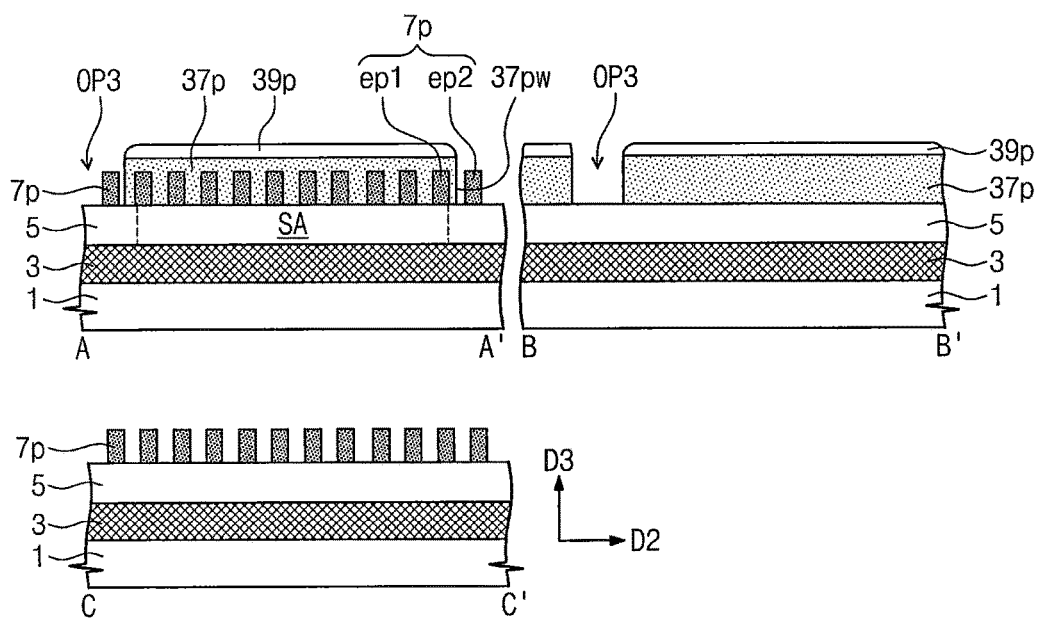

Referring to FIGS. 10A and 10B, the preliminary mask layer 39 may be etched using the second photoresist patterns PP2 as etch masks to form preliminary mask patterns 39p. Shapes of the preliminary mask patterns 39p may correspond to those of the second photoresist patterns PP2 when viewed in plan view.

Subsequently, the preliminary mold layer 37 may be etched using the preliminary mask patterns 39p as etch masks to form fourth mold patterns 37p in the cell array region CR and the peripheral circuit region PR. Shapes of the fourth mold patterns 37p may correspond to those of the preliminary mask patterns 39p when viewed in plan view.

The fourth mold patterns 37p may include third openings OP3. The third openings OP3 may overlap with the second openings OP2 described above when viewed in plan view. The third openings OP3 may expose portions of the top surface of the etch target layer 5.

In some embodiments, the third mold patterns 7p may include a first extension pattern ep1 and a second extension pattern ep2 that extend in parallel to each other along a first direction D1. The first and second extension patterns ep1 and ep2 may be adjacent one sidewall 37pw of the fourth mold pattern 37p that is disposed on the separation region SA. The first and second extension patterns ep1 and ep2 may be spaced apart from each other in a second direction D2 that intersects the first direction D1. The sidewall 37pw of the fourth mold pattern 37p may be disposed between the first and second extension patterns ep1 and ep2 when viewed in plan view.

In other embodiments, even though not shown in the drawings, the fourth mold pattern 37p may be misaligned such that the one sidewall 37pw of the fourth mold pattern 37p may be disposed on the first extension pattern ep1 or the second extension pattern ep2. However, a second dummy interconnection 53b described later may be formed in a region between the first and second extension patterns ep1 and ep2 when viewed in plan view. Thus, even though the fourth mold pattern 37p is misaligned, cell interconnections 51 between first and second dummy interconnections 53a and 53b that are described later may be completely separated from other cell interconnections 51 that are spaced apart from the cell interconnections 51 with the first and second dummy interconnections 53a and 53b. In other words, it is possible to secure an alignment margin of a photolithography process used for node separation of the cell interconnections 51.

Figure 11A:
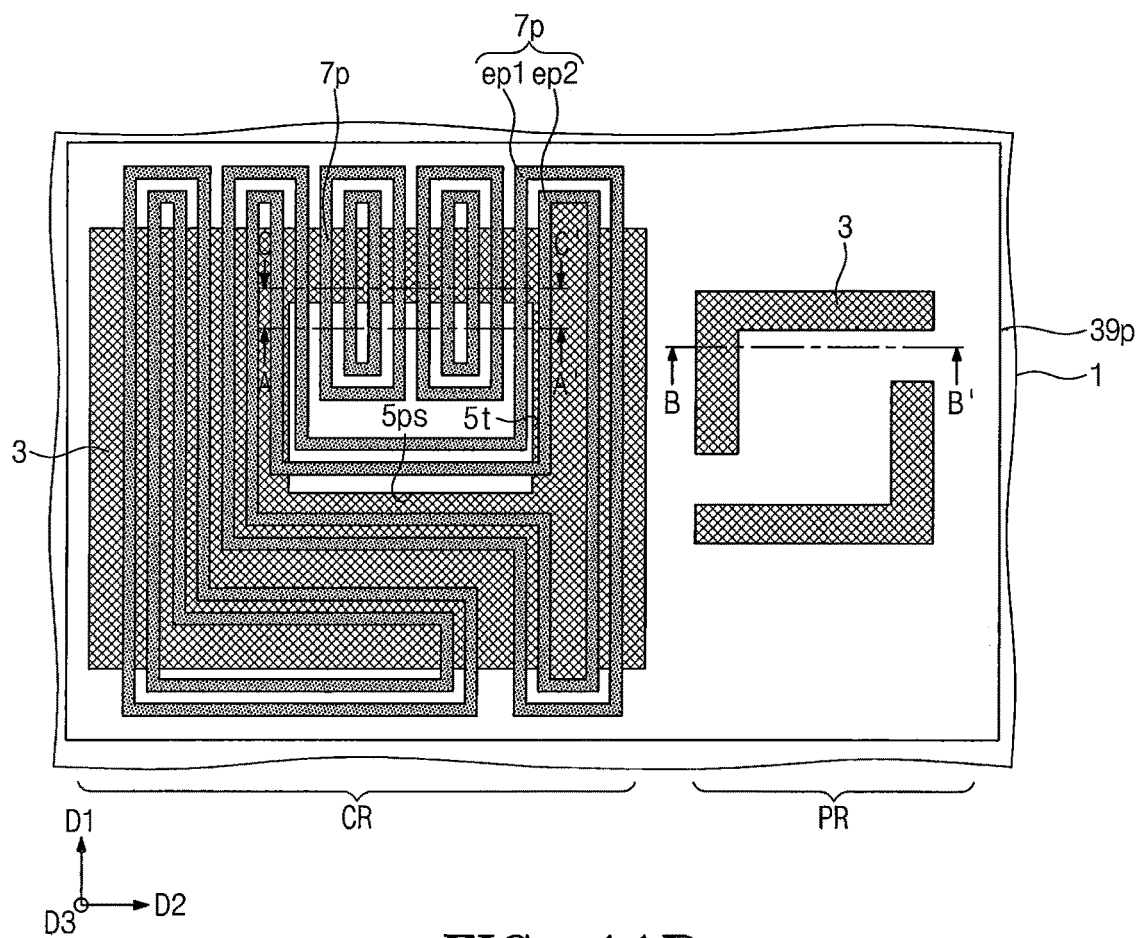
Figure 11B:
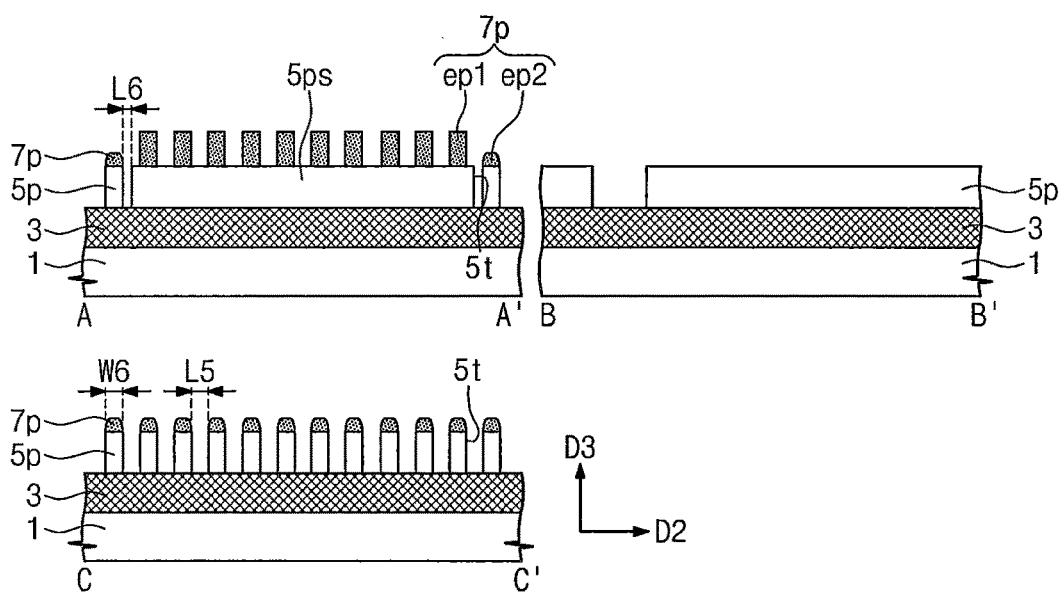

Referring to FIGS. 11A and 11B, the etch target layer 5 may be etched using the preliminary mask patterns 39p, the fourth mold patterns 37p, and the third mold patterns 7p as etch masks to form insulating patterns 5p. The preliminary mask patterns 39p and the fourth mold patterns 37p may be removed during the formation of the insulating patterns 5p. The third mold patterns 7p that are exposed by the fourth mold patterns 37p may be partially etched during the removal of the preliminary mask patterns 39p and the fourth mold patterns 37p, so portions of the third mold patterns 7p exposed by the fourth mold patterns 37p may remain on the insulating patterns 5p.

Portions of a top surface of the interlayer insulating layer 3 are exposed through the openings in the insulating patterns 5p. Shapes of the insulating patterns 5p may correspond to those of the third and fourth mold patterns 7p and 37p when viewed in plan view. The insulating patterns 5p may include a separation insulating pattern 5ps. A shape of the separation insulating pattern 5*ps* may correspond to that of the fourth mold pattern 37*p* that was disposed on the separation region SA and then subsequently removed. In other words, the separation insulating pattern 5*ps* may substantially correspond to the separation region SA.

In more detail, a portion of the etch target layer 5 between the first and second extension patterns ep1 and ep2 may be etched to form a dummy trench 5*t*. In other words, the etch target layer 5 between the second extension pattern ep2 and the portion of the fourth mold pattern 37*p* that is disposed on the separation region SA may be etched to form the dummy trench 5*t*. The dummy trench 5*t* may define one sidewall of the separation insulating pattern 5*ps*. In addition, another dummy trench 5*t* may be formed to define an opposite sidewall of the separation insulating pattern 5*ps*. In other words, a pair of the dummy trenches 5*t* may be formed at both sides of the separation insulating pattern 5*ps*, respectively.

Widths W6 of other insulating patterns 5*p* other than the separation insulating pattern 5*ps* may be substantially equal to the maximum width W2 of the first spacer 31*p* (e.g., W6=1F). A distance between L5 between adjacent ones of the insulating patterns 5*p* may be substantially equal to the maximum width W2 of the first spacer 31*p* (e.g., L5=1F). A width L5 of a portion of the dummy trench 5*t* may be substantially equal to the maximum width W2 of the first spacer 31*p* (see the cross-sectional view of the line C-C' of FIG. 11B). On the contrary, a width L6 of another portion of the dummy trench 5*t* that is adjacent the separation insulating pattern 5*ps* may be smaller than the maximum width W2 of the first spacer 31*p* (see the cross-sectional view of the line A-A' of FIG. 11B).

The insulating patterns 5*p* may also be formed on the peripheral circuit region PR. The insulating patterns 5*p* of the peripheral circuit region PR may expose a portion of the top surface of the interlayer insulating layer 3 through an opening therebetween.

Figure 12A:
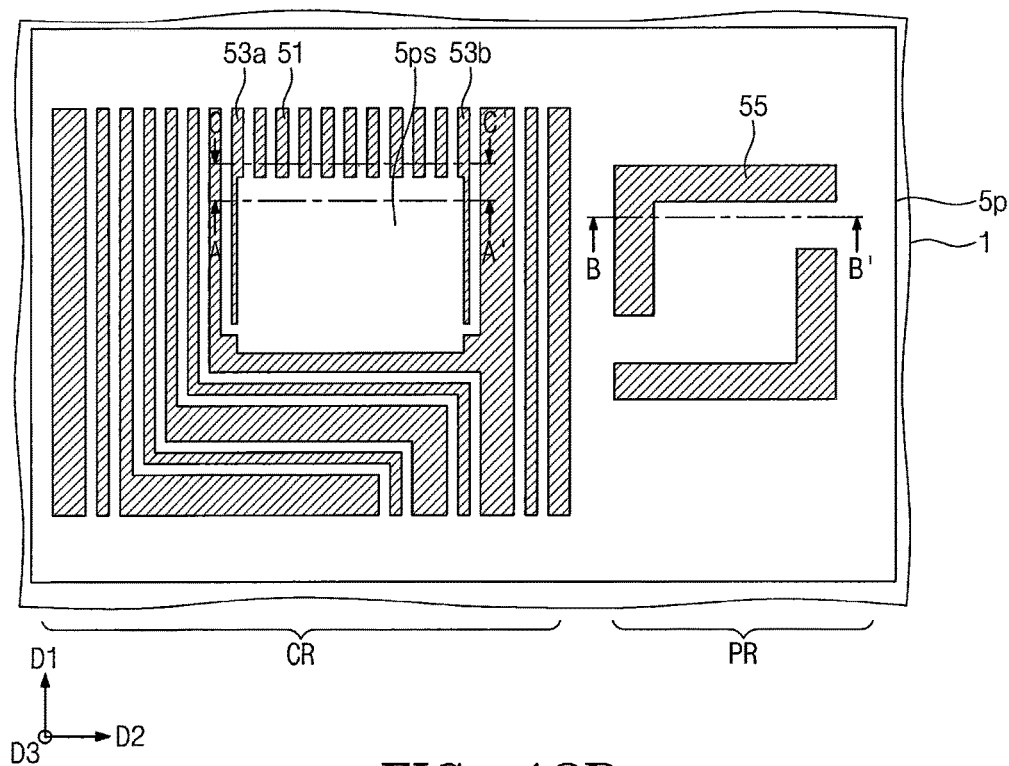
Figure 12B:
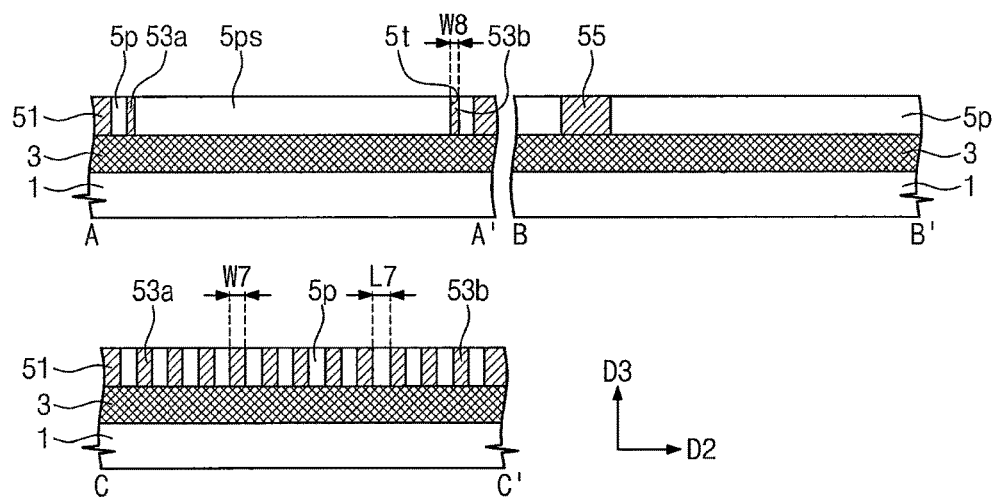

Referring to FIGS. 12A and 12B, conductive lines 51, 53*a*, 53*b* and 55 may be formed to fill spaces between the insulating patterns 5*p*. The conductive lines 51, 53*a*, 53*b* and 55 may include cell interconnections 51, first and second dummy interconnections 53*a* and 53*b*, and peripheral interconnections 55. The conductive lines 51, 53*a*, 53*b* and 55 may include at least one of doped poly-silicon, a metal nitride (e.g., titanium nitride or tantalum nitride), or a metal material (e.g., titanium, tantalum, tungsten, copper, or aluminum). In some embodiments, if the conductive lines 51, 53*a*, 53*b* and 55 include copper, the conductive lines 51, 53*a*, 53*b* and 55 may be formed by a damascene process.

The peripheral interconnections 55 may fill the spaces between the insulating patterns 5*p* in the peripheral circuit region PR.

The conductive lines 51, 53*a*, 53*b* and 55 may be formed by forming the first and second dummy interconnections 53*a* and 53*b* to fill the dummy trenches 5*t*. As described above, the pair of dummy trenches 5*t* may define both sidewalls of the separation insulating pattern 5*ps*. Thus, the first dummy interconnection 53*a* may be adjacent one sidewall of the separation insulating pattern 5*ps*, and the second dummy interconnection 53*b* may be adjacent another sidewall of the separation insulating pattern 5*ps*. In other words, the first and second dummy interconnections 53*a* and 53*b* may be spaced apart from each other with the separation insulating pattern 5*ps* interposed therebetween.

A width W7 of each of the cell interconnections 51 disposed between the first and second dummy interconnections 53*a* and 53*b* may be substantially equal to the maximum width W2 of the first spacer 31*p* (e.g., W7=1F). A distance L7 between adjacent ones of the cell interconnections 51 may be substantially equal to the maximum width W2 of the first spacer 31*p* (e.g., L7=1F). Alternatively, a width of a portion of the cell interconnections 51 may be greater than the maximum width W2 of the first spacer 31*p*. However, the inventive concepts are not limited thereto.

A width W7 of a portion of each of the first and second dummy interconnections 53*a* and 53*b* may be substantially equal to the maximum width W2 of the first spacer 31*p* (see the cross-sectional view of the line C-C' of FIG. 12B). On the contrary, a width W8 of another portion of each of the first and second dummy interconnections 53*a* and 53*b* may be smaller than the maximum width W2 of the first spacer 31*p* (see the cross-sectional view of the line A-A' of FIG. 12B). The portion having the width W7 may be spaced apart from the separation insulating pattern 5*ps*, and the portion having the width W8 may be adjacent the separation insulating pattern 5*ps*.

The cell interconnections 51 may be bit lines connected to the contacts (not shown) that penetrate the interlayer insulating layer 3. However, the first and second dummy interconnections 53*a* and 53*b* may not be connected to the contacts.

In the method for fabricating the semiconductor device according to some embodiments of the inventive concepts, conductive lines 51, 53*a*, 53*b* and 55 may be formed that have a fine pitch that is smaller than the minimum pitch realized by an exposure process. The conductive lines 51, 53*s*, 53*b* and 55 may be formed using two photolithography processes and two spacer formation processes. In addition, the separation region SA of the cell interconnections 51 may be defined simultaneously with the peripheral interconnections 55 in a second photolithography process that defines the peripheral interconnections 55, so the fabricating processes may be simplified. Furthermore, since the first and second dummy interconnections 53*a* and 53*b* are formed to be adjacent the both sidewalls of the separation region SA, it is possible to secure the alignment margin of the photolithography process used for node separation of the cell interconnections 51.

As shown in FIGS. 12A and 12B, in the semiconductor device according to the present embodiment an interlayer insulating layer 3 may be provided on a substrate 1. Insulating patterns 5*p* and conductive lines 51, 53*a*, 53*b* and 55 filling spaces between the insulating patterns 5*p* may be disposed on the interlayer insulating layer 3. The substrate 1 may include a cell array region CR and a peripheral circuit region PR. The insulating patterns 5*p* may include a separation insulating pattern 5*ps* disposed on the cell array region CR.

The conductive lines 51, 53*a*, 53*b* and 55 may include cell interconnections 51 and first and second dummy interconnections 53*a* and 53*b* which are disposed on the cell array region CR. In addition, the conductive lines 51, 53*a*, 53*b* and 55 may also include peripheral interconnections 55 disposed on the peripheral circuit region PR. The cell interconnections 51 may correspond to bit lines connected to contacts (not shown) penetrating the interlayer insulating layer 3. In some embodiments, the cell interconnections 51 may correspond to bit lines of an NAND flash memory device. The first and second dummy interconnections 53*a* and 53*b* may be spaced apart from each other with the separation insulating pattern 5*ps* interposed therebetween.

A width W7 of each of the cell interconnections 51 disposed between the first and second dummy interconnections 53*a* and 53*b* may be 1F (W7=1F). A distance L7 between adjacent ones of the cell interconnections 51 may be substantially equal to the width W7 of the cell interconnections 51 (e.g., L7=1F). On the other hand, a width of a portion of the cell interconnections 51 may be greater than 1F. However, the inventive concepts are not limited thereto.

A width W7 of a portion of each of the first and second dummy interconnections 53a and 53b may be substantially equal to the width W7 of the cell interconnection 51 (see the cross-sectional view of the line C-C' of FIG. 12B). A width W8 of another portion of each of the first and second dummy interconnections 53a and 53b may be smaller than the width W7 of the cell interconnection 51 (see the cross-sectional view of the line A-A' of FIG. 12B). The portion having the width W7 may be spaced apart from the separation insulating pattern 5ps, and the portion having the width W8 may be adjacent the separation insulating pattern 5ps.

FIGS. 13A to 22A are plan views illustrating a method for fabricating a semiconductor device according to embodiments of the inventive concepts. FIGS. 13B to 22B are cross-sectional views taken along lines A-A', B-B', and C-C' of FIGS. 13A to 22A, respectively. In the present embodiment, the same elements as described with reference to FIGS. 1A to 12A and 1B to 12B will be indicated by the same reference numerals or the same reference designators. For the purpose of ease and convenience in explanation, the descriptions to the same elements as in the first embodiment of FIGS. 1A to 12A and 1B to 12B will be omitted or mentioned briefly.

Figure 13A:
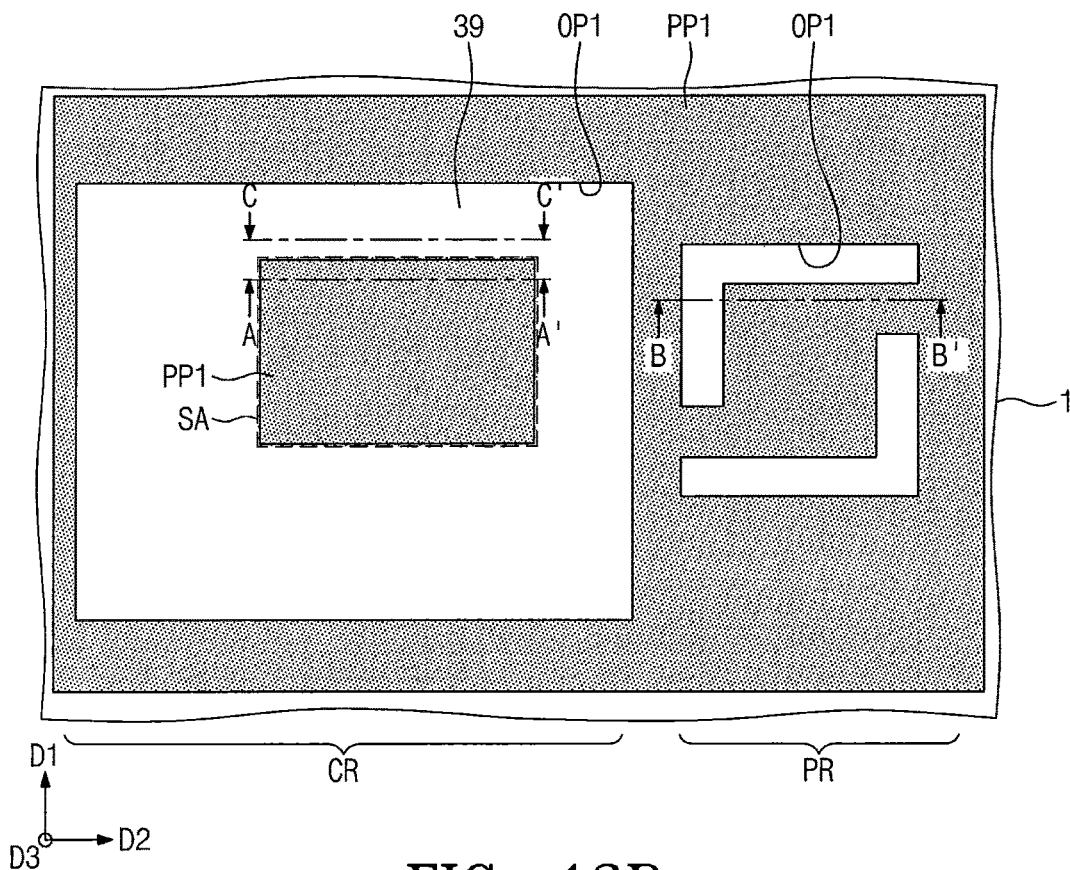
Figure 13B:
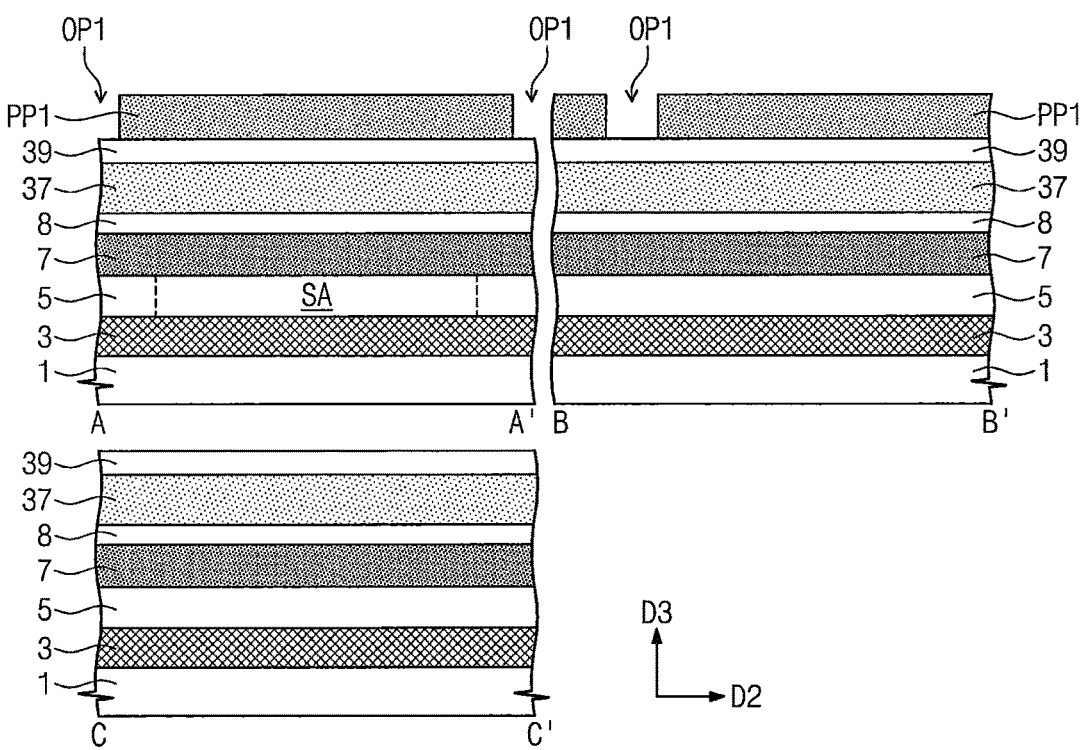

Referring to FIGS. 13A and 13B, an interlayer insulating layer 3, an etch target layer 5, a lower mold layer 7, an etch stop layer 8, a preliminary mold layer 37, and a preliminary mask layer 39 may be sequentially formed on a substrate 1.

The substrate 1 may include a cell array region CR and a peripheral circuit region PR. Even though not shown in the drawings, a plurality of transistors may be formed on the cell array region CR of the substrate 1. A plurality of contacts (not shown) may penetrate the interlayer insulating layer 3 to connect to the transistors. The portion of the etch target layer 5 that is disposed on the cell array region CR may include a separation region SA. The separation region SA may be defined as a region in which conductive lines 51 and 55 that are described later herein are not formed.

In some embodiments, the etch stop layer 8 and the preliminary mask layer 39 may comprise the same material. For example, each of the etch stop layer 8 and the preliminary mask layer 39 may each be a silicon oxynitride layer. The preliminary mold layer 37 may be an SOH layer or an SOC layer.

First photoresist patterns PP1 may be formed on the preliminary mask layer 39. The first photoresist patterns PP1 may include first openings OP1. The first openings OP1 may expose portions of a top surface of the preliminary mask layer 39.

A portion of the first photoresist patterns PP1 may overlap with the separation region SA when viewed in plan view. The first opening OP1 on the cell array region CR may define a region in which conductive lines 51 that are described later herein will be formed, and the first opening OP1 on the peripheral circuit region PR may define a region in which a peripheral interconnection 55 that is described later herein will be formed.

Figure 14A:
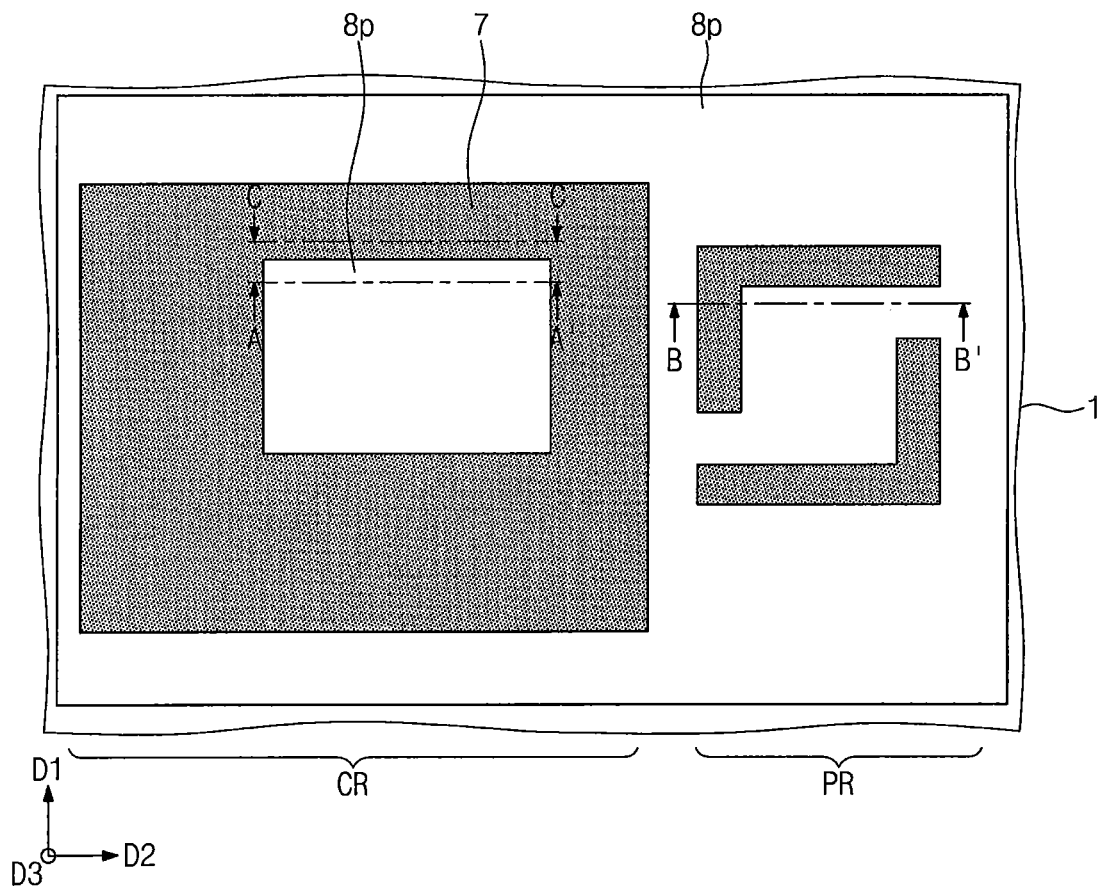
Figure 14B:
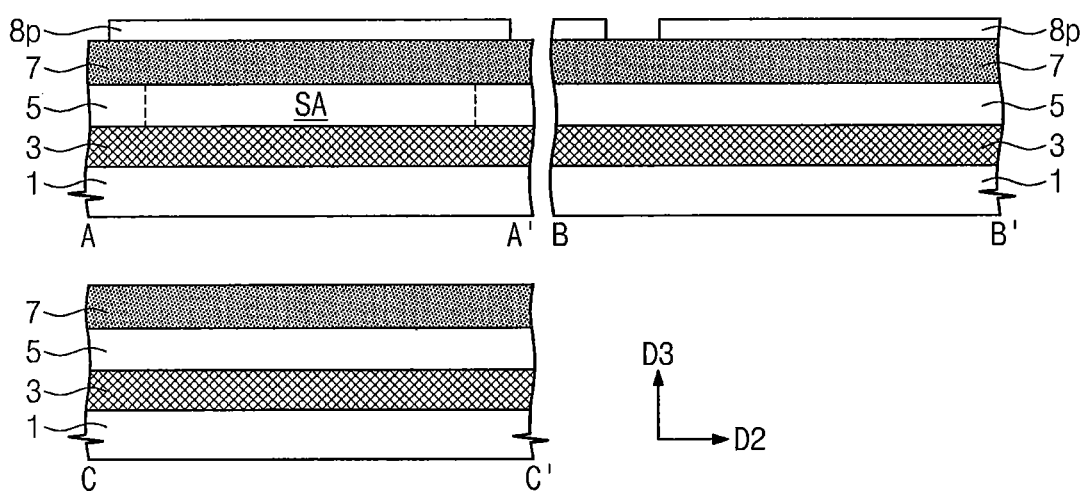

Referring to FIGS. 14A and 14B, the preliminary mask layer 39 may be etched using the first photoresist patterns PP1 as etch masks to form preliminary mask patterns (see 39p of FIGS. 10A and 10B). Next, the preliminary mold layer 37 may be etched using the preliminary mask patterns 39p as etch masks to form fourth mold patterns (see 37p of FIGS. 10A and 10B).

Next, the etch stop layer 8 may be etched using the preliminary mask patterns 39p and the fourth mold patterns 37p as etch masks to form first etch stop patterns 8p. As a result, shapes of the first etch stop patterns 8p may correspond to those of the first photoresist patterns PP1 when viewed in plan view.

Figure 15A:
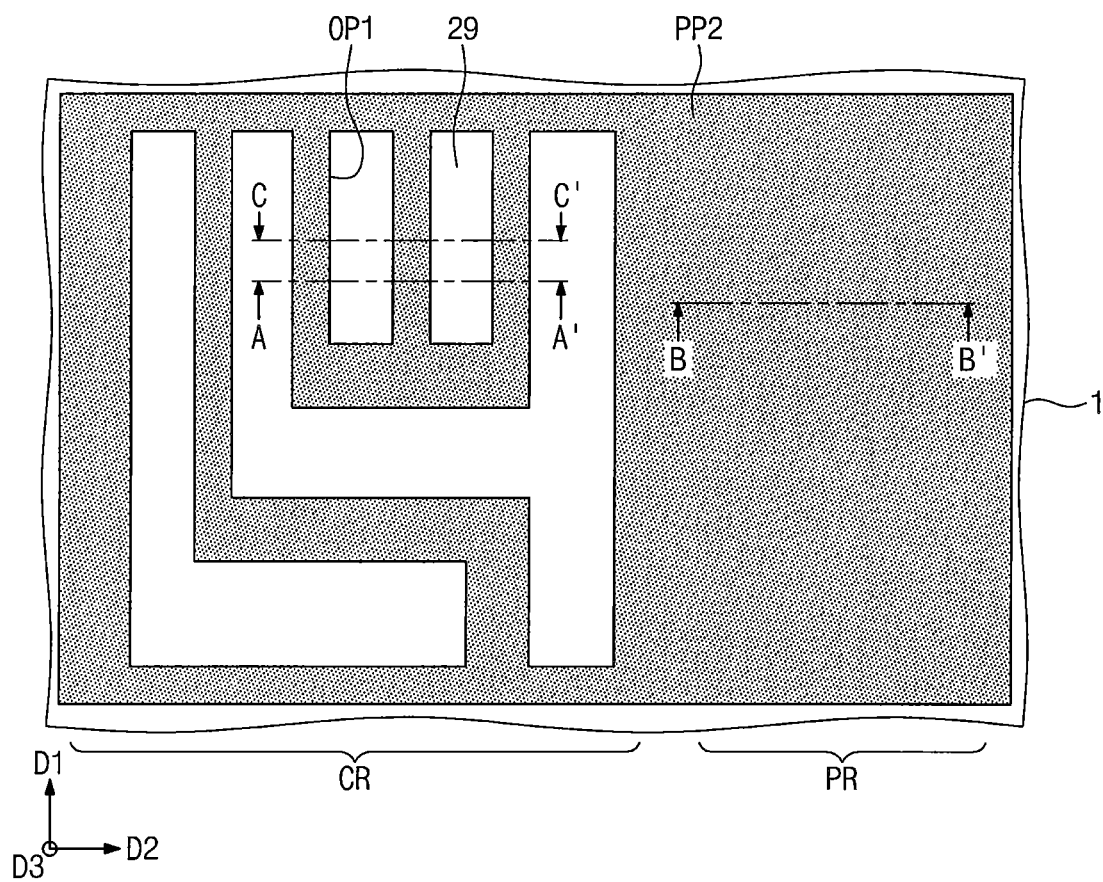
Figure 15B:
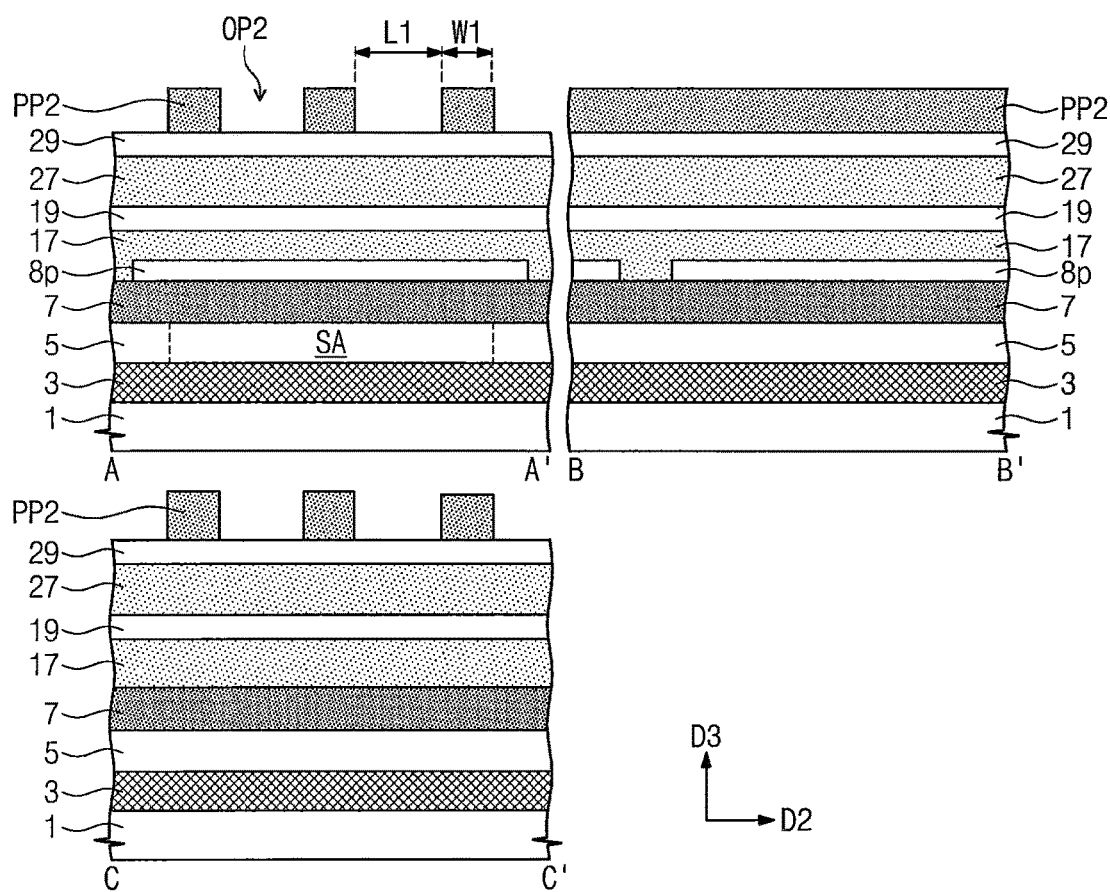

Referring to FIGS. 15A and 15B, an intermediate mold layer 17 covering the first etch stop patterns 8p may be formed on the lower mold layer 7. Subsequently, a first mask layer 19, an upper mold layer 27, and a second mask layer 29 may be sequentially formed on the intermediate mold layer 17. Second photoresist patterns PP2 may be formed on the second mask layer 29. The second photoresist pattern PP2 of the peripheral circuit region PR may completely cover the second mask layer 29 of the peripheral circuit region PR. The second photoresist patterns PP2 may include second openings OP2 on the cell array region CR.

A width W1 of a portion of the second photoresist patterns PP2 may be about three times the maximum width W2 of a first spacer 31p to be described later. A distance L1 between adjacent ones of the second photoresist patterns PP2 may be about five times the maximum width W2 of the first spacer 31p.

Figure 16A:
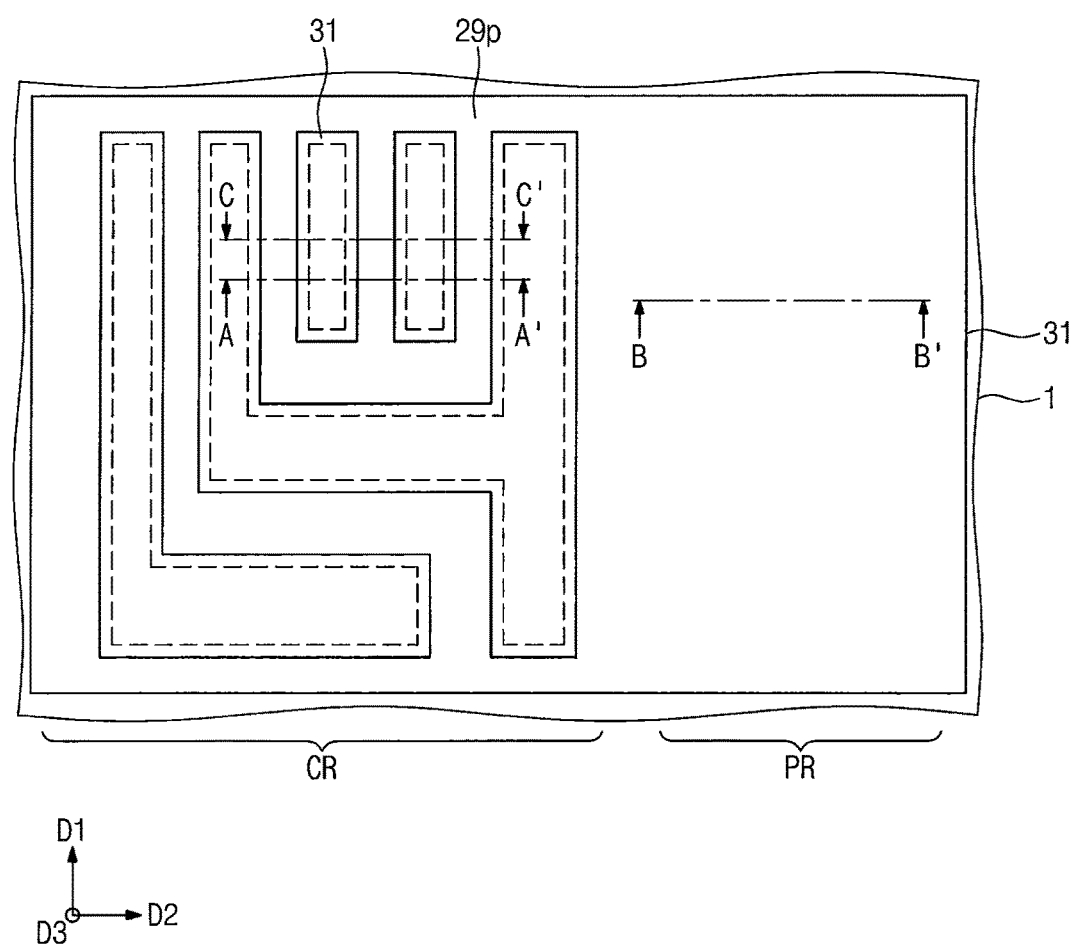
Figure 16B:
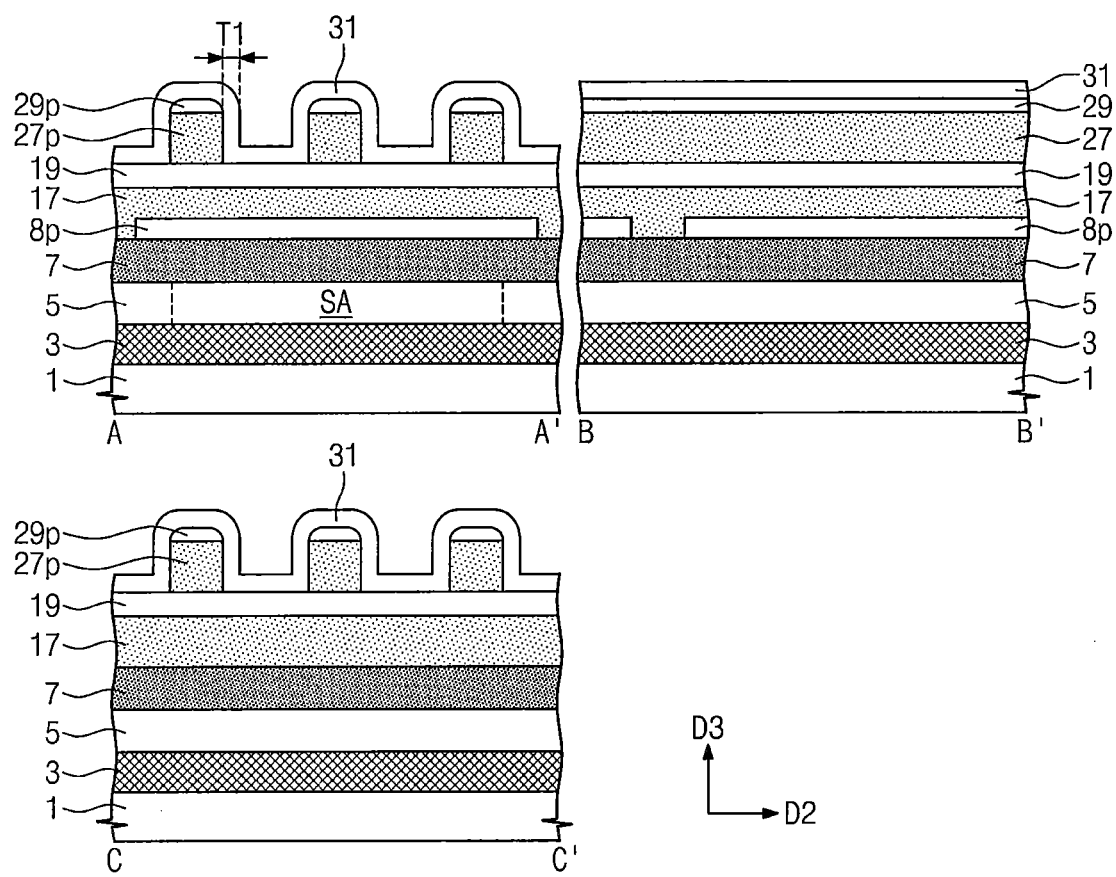

Referring to FIGS. 16A and 16B, the second mask layer 29 and the upper mold layer 27 may be etched using the second photoresist patterns PP2 as etch masks to form second mask patterns 29p and first mold patterns 27p. The second mask layer 29 of the peripheral circuit region PR may not be etched but may remain (see FIGS. 2A and 2B).

Next, a first spacer layer 31 may be conformally formed on an entire top surface of the substrate 1. A thickness T1 of the first spacer layer 31 may be substantially equal to the maximum width W2 of the first spacer 31p that is described later herein.

Figure 17A:
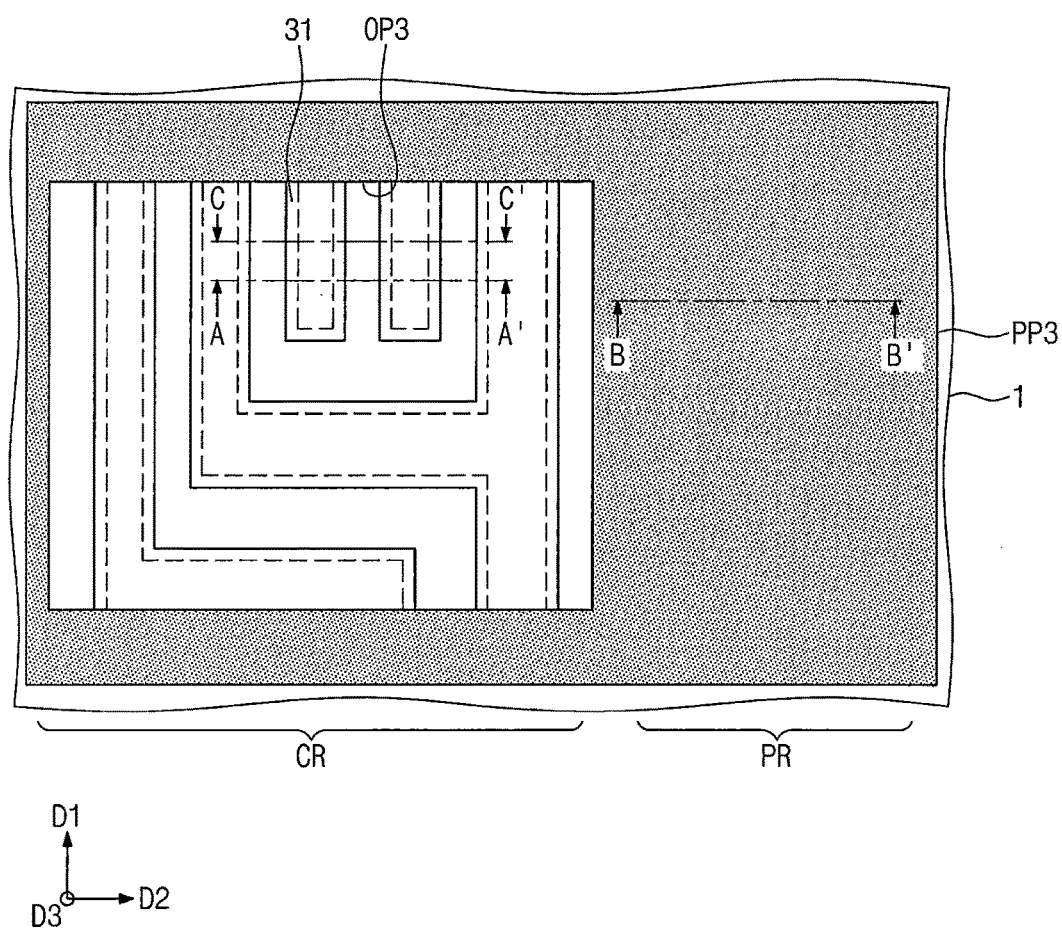
Figure 17B:
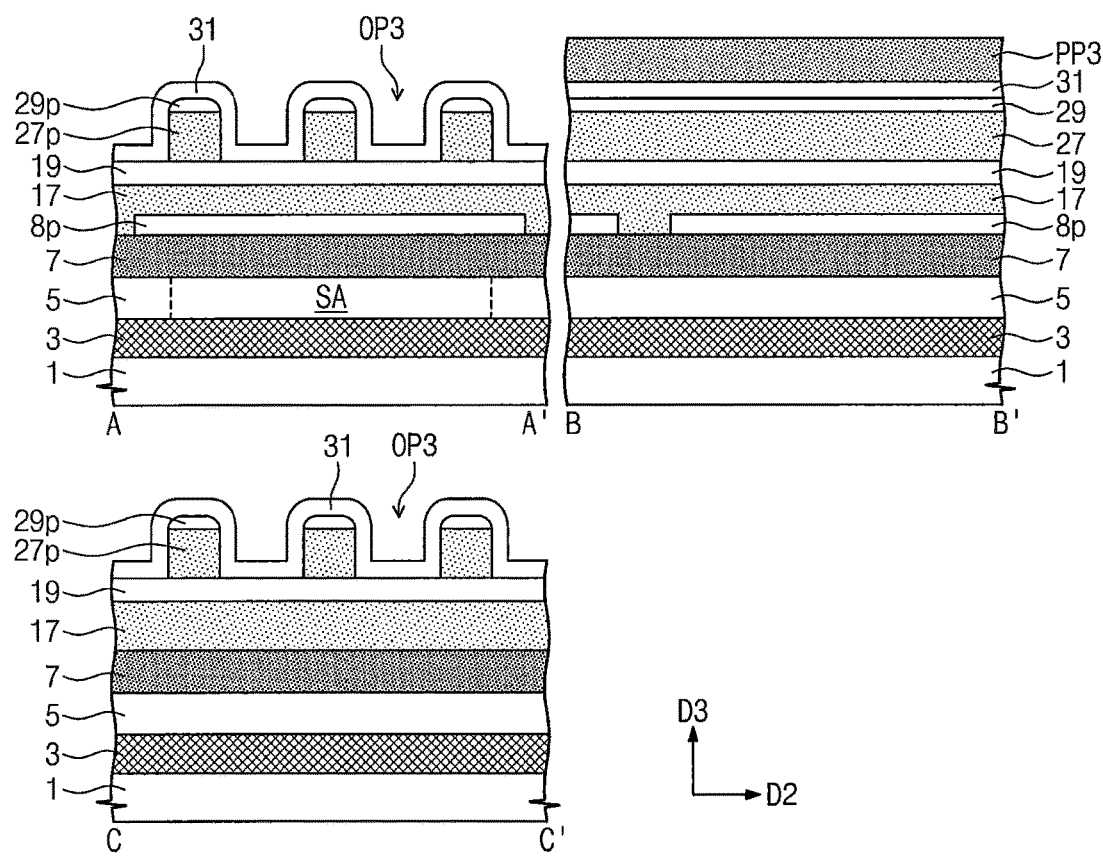

Referring to FIGS. 17A and 17B, a third photoresist pattern PP3 having a third opening OP3 may be formed on the first spacer layer 31. The third opening OP3 may be disposed on the cell array region CR. In other words, the third photoresist pattern PP3 may cover the first spacer layer 31 of the peripheral circuit region PR but may expose a portion of the first spacer layer 31 of the cell array region CR.

The third photoresist pattern PP3 may also cover end portions of the first mold patterns 27p that are disposed on the cell array region CR. Similarly to the first opening OP1, the third opening OP3 may define a region in which cell interconnections 51 will be formed.

Figure 18A:
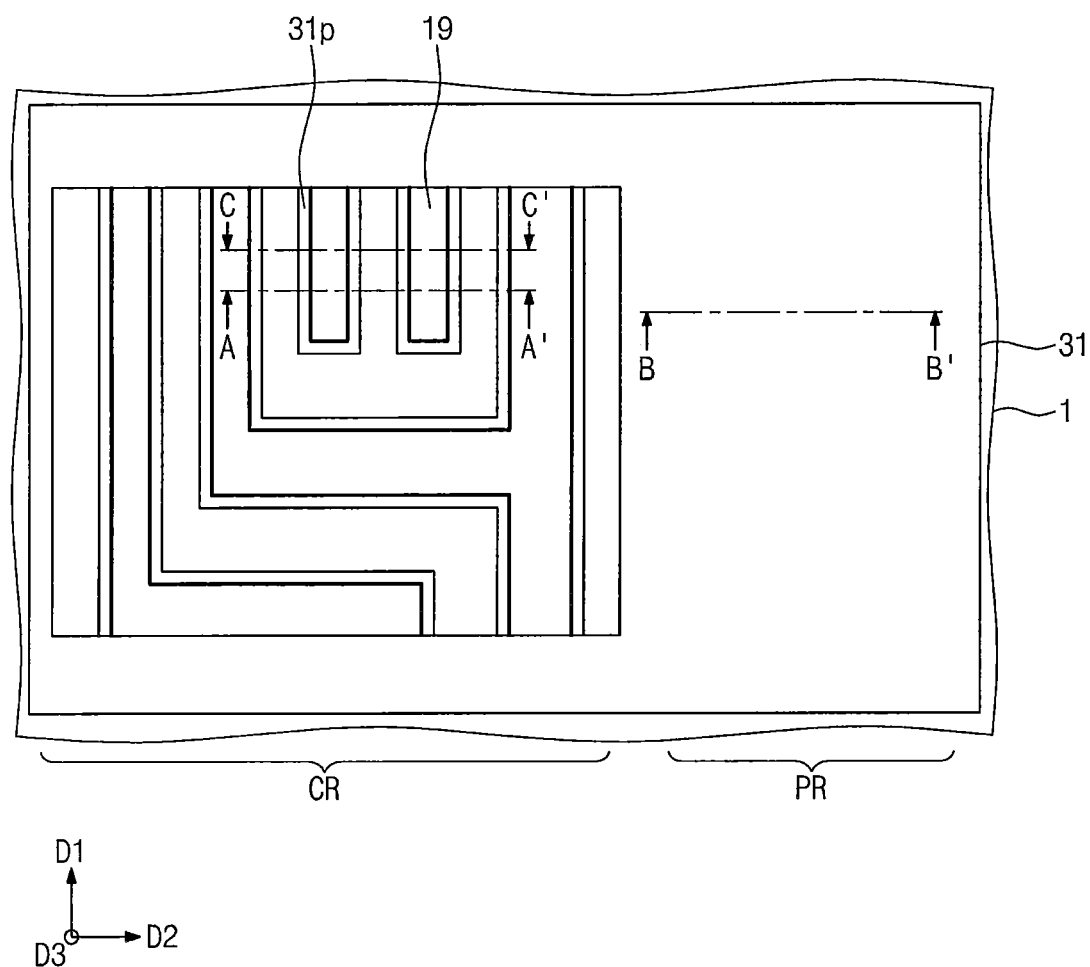
Figure 18B:
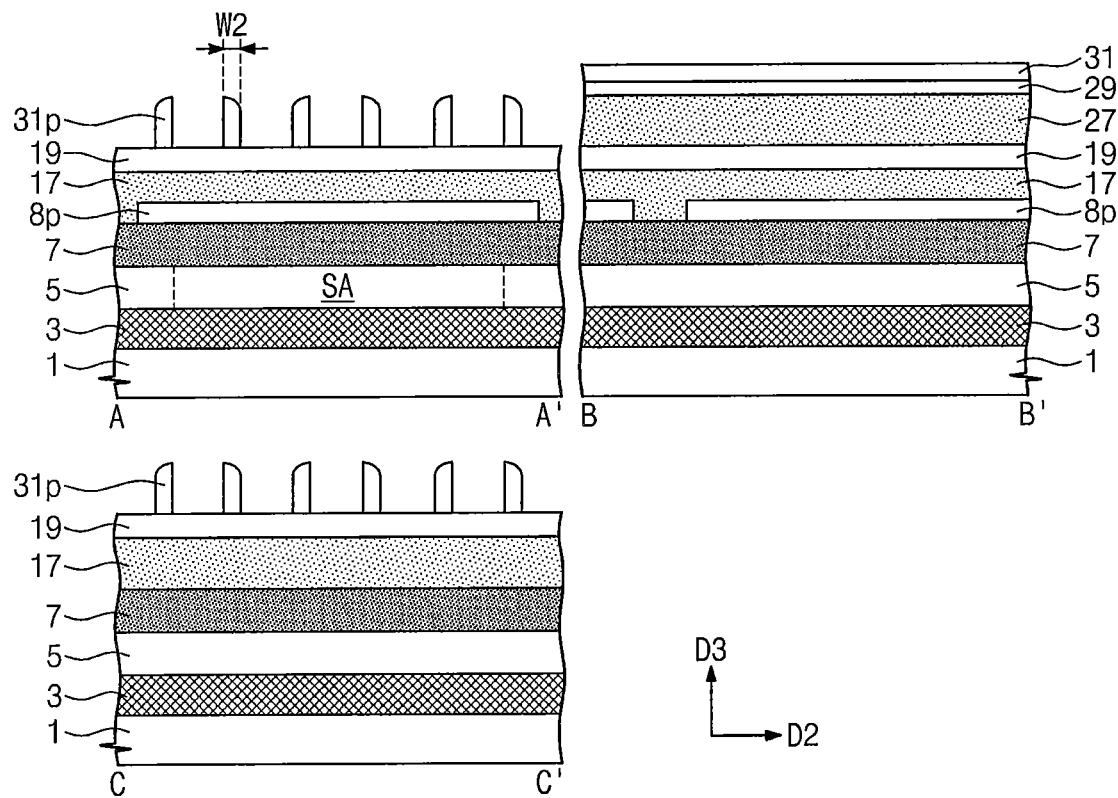

Referring to FIGS. 18A and 18B, the first spacer layer 31 may be anisotropically etched using the third photoresist pattern PP3 as an etch mask to form first spacers 31p. The first spacers 31p may cover sidewalls of the first mold patterns 27p that are exposed through the third opening OP3. The maximum width W2 of each of the first spacers 31p may be defined as 1F.

Subsequently, the second mask patterns 29p that are exposed through the third opening OP3 may be selectively removed to expose top surfaces of the first mold patterns 27p. Then, the first mold patterns 27p may be removed.

The first spacer 31, the second mask layer 29, and the upper mold layer 27 which are covered by the third photoresist pattern PP3 may remain under the third photoresist pattern PP3. For example, the first spacer layer 31, the second mask layer 29 and the upper mold layer 27 of the peripheral circuit region PR may not be etched.

Figure 19A:
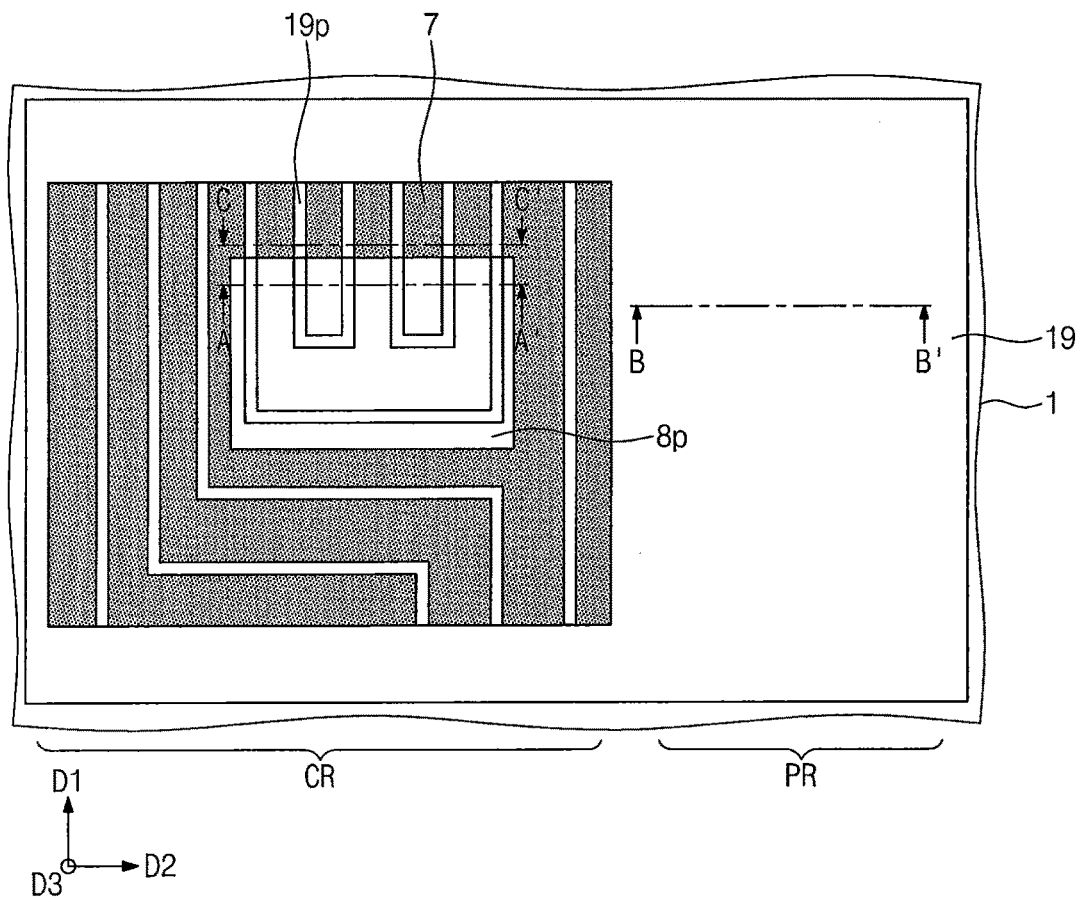
Figure 19B:
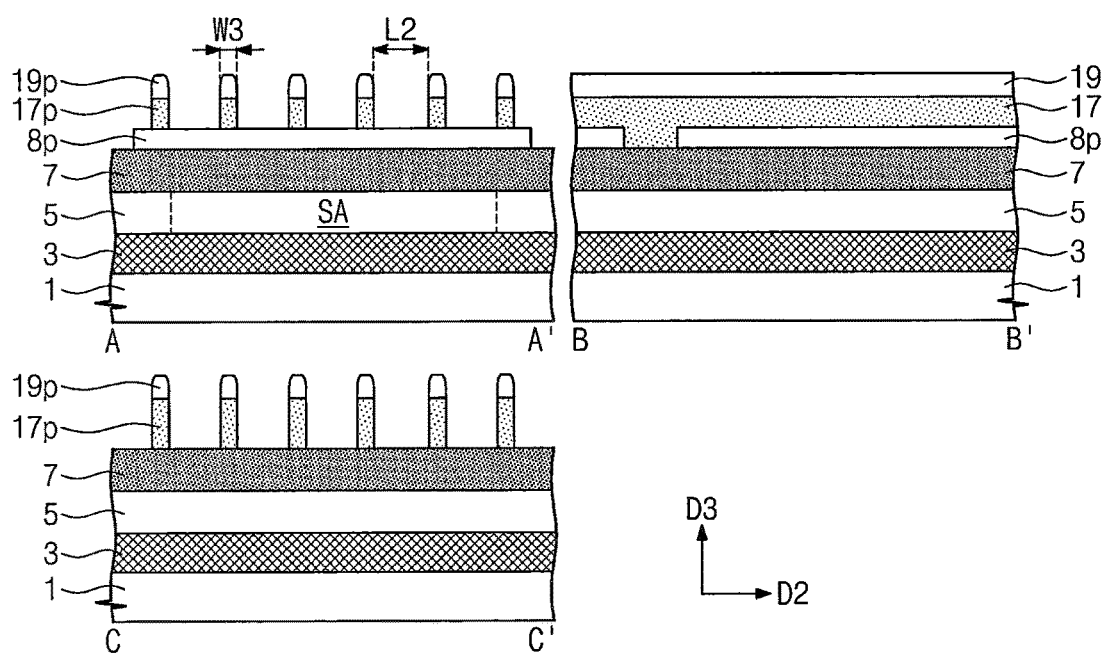

Referring to FIGS. 19A and 19B, the first mask layer 19 may be etched using the first spacers 31p as etch masks to form first mask patterns 19p on the cell array region CR. The first spacer layer 31 and the second mask layer 29 of the peripheral circuit region PR may be removed.

Next, the intermediate mold layer 17 may be etched using the first mask patterns 19p as etch masks to form second mold patterns 17p. The first etch stop pattern 8p of the cell array region CR may be exposed through openings between the second mold patterns. Shapes of the second mold patterns 17p may correspond to those of the first spacers 31p when viewed in plan view. The second mold patterns 17p may be formed in a region exposed through the third opening OP3. The upper mold layer 27 of the peripheral circuit region PR may be removed to expose a top surface of the first mask layer 19 of the peripheral circuit region PR.

A width W3 of each of the second mold patterns 17p may be substantially equal to the maximum width W2 of the first spacer 31p (W3=1F). A distance L2 between adjacent ones of the second mold patterns 17p may be equal to about three times the maximum width W2 of the first spacer 31p (L2=3F).

Figure 20A:
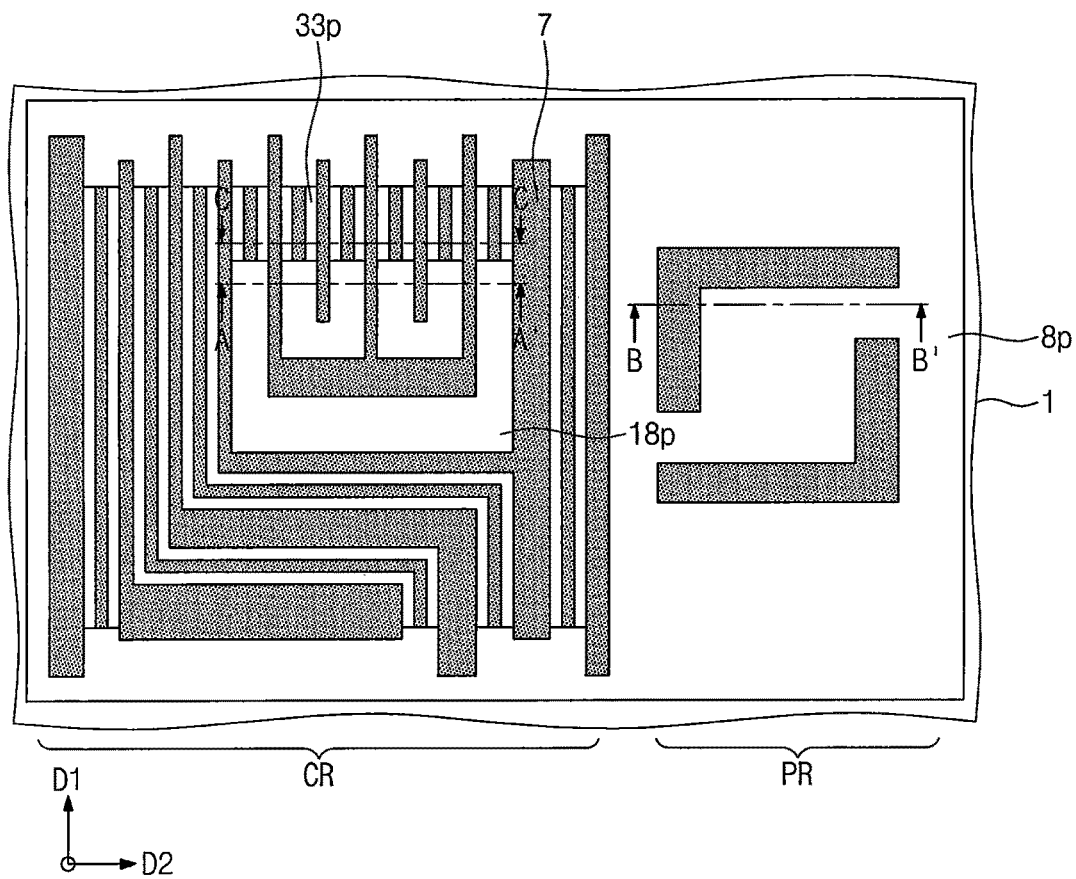
Figure 20B:
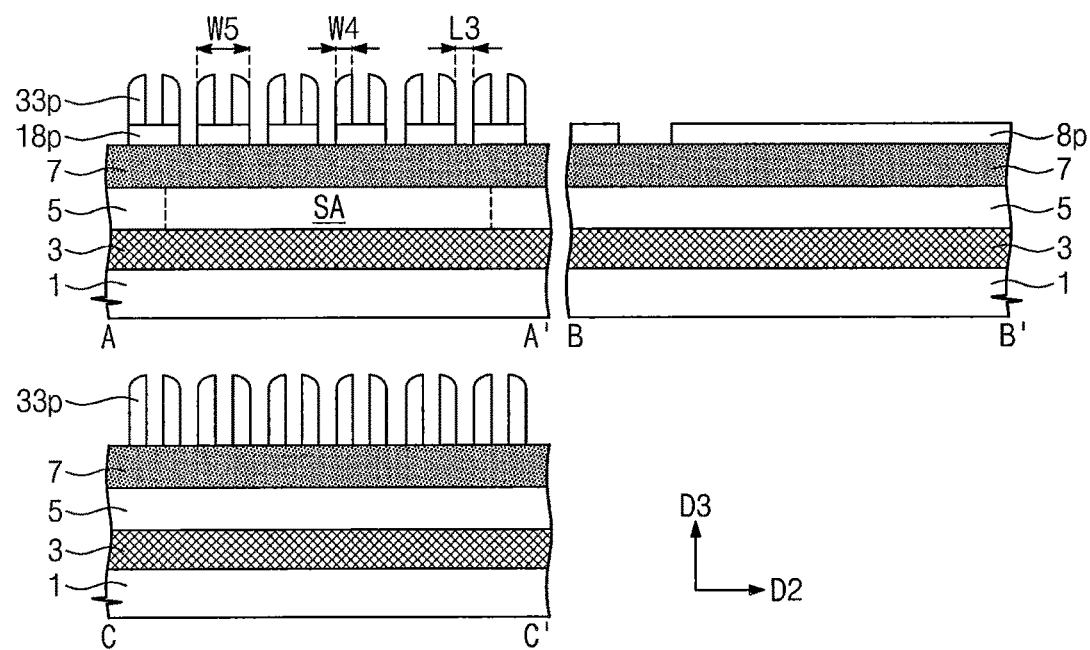

Referring to FIGS. 20A and 20B, second spacers 33p may be formed to cover sidewalls of the second mold patterns 17p. The second spacers 33p may be formed by conformally forming a second spacer layer on an entire top surface of the substrate 1, and then anisotropically etching the second spacer layer until the first mask patterns 19p are exposed.

When the second spacers 33p are formed, portions of the first etch stop pattern 8p of the cell array region CR may also be etched. Thus, second etch stop patterns 18p may be formed. The second etch stop patterns 18p may be formed on the separation region SA.

Figure 23A:
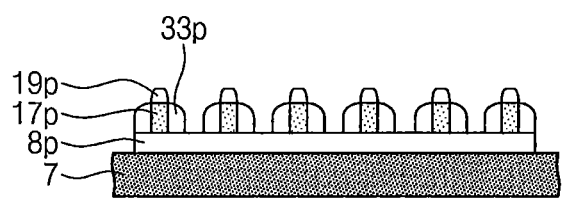
FIGS. 23A and 23B are cross-sectional views illustrating a method of forming second spacers and second etch stop patterns in a method for fabricating a semiconductor device according to other embodiments of the inventive concepts.
Figure 23B:
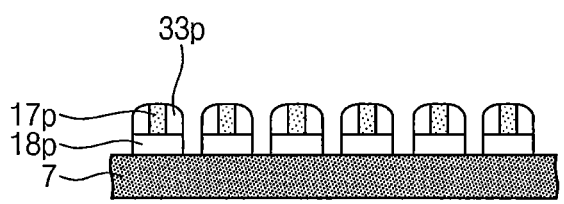

FIGS. 23A and 23B are cross-sectional views illustrating a method of forming the second spacers 33p and the second etch stop patterns 18p according to the present embodiment.

In more detail, as illustrated in FIG. 23A, the second spacer layer may be anisotropically etched to form the second spacers 33p that cover the second mold patterns 17p. The first mask patterns 19p may remain on the second mold patterns 17p after this etching step is completed.

Referring to FIG. 23B, the first mask patterns 19p may be anisotropically etched to expose top surfaces of the second mold patterns 17p. When the first mask patterns 19p are removed, portions of the first etch stop pattern 8p that are exposed through openings between the second spacers 33p may also be removed. In some embodiments, the first etch stop pattern 8p may comprise the same material (e.g., silicon oxynitride) as the first mask patterns 19p, so the first mask patterns 19p and the portions of the first etch stop pattern 8p may be etched at the same time by the anisotropic etching process.

Meanwhile, the first mask layer 19 of the peripheral circuit region PR may also be removed by the anisotropic etching process, so that the top surface of the intermediate mold layer 17 of the peripheral circuit region PR may be exposed. However, when the second etch stop patterns 18p are formed on the cell array region CR, the first etch stop pattern 8p of the peripheral circuit region PR may be protected by the intermediate mold layer 17 and hence may remain on the lower mold layer 7 in the peripheral circuit region PR.

Referring again to FIGS. 20A and 20B, the second mold patterns 17p may be selectively removed. The intermediate mold layer 17 of the peripheral circuit region PR may also be removed at the same time to expose the first etch stop pattern 8p of the peripheral circuit region PR.

The maximum width W4 of each of the second spacers 33p may be substantially equal to the maximum width W2 of the first spacer 31p (W4=1F). A width W5 of each of the second etch stop patterns 18p may be equal to about three times the maximum width W2 of the first spacer 31p (W5=3F). A distance L3 between adjacent ones of the second etch stop patterns 18p may be substantially equal to the maximum width W2 of the first spacer 31p (L3=1F).

In more detail, a pair of the second spacers 33p may be disposed on each of the second etch stop patterns 18p. Outer sidewalls of the pair of second spacers 33p may be aligned with outer sidewalls of the respective underlying second etch stop pattern 18p. In other words, the outer sidewalls of the pair of second spacers 33p may be coplanar with the outer sidewalls of the second etch stop pattern 18p. A distance between the pair of second spacers 33p may be substantially equal to the maximum width W4 of each second spacer 33p. In the present embodiment, the second etch stop patterns 18p may define a region in which cell interconnections 51 that are described later herein are provided.

Figure 21A:
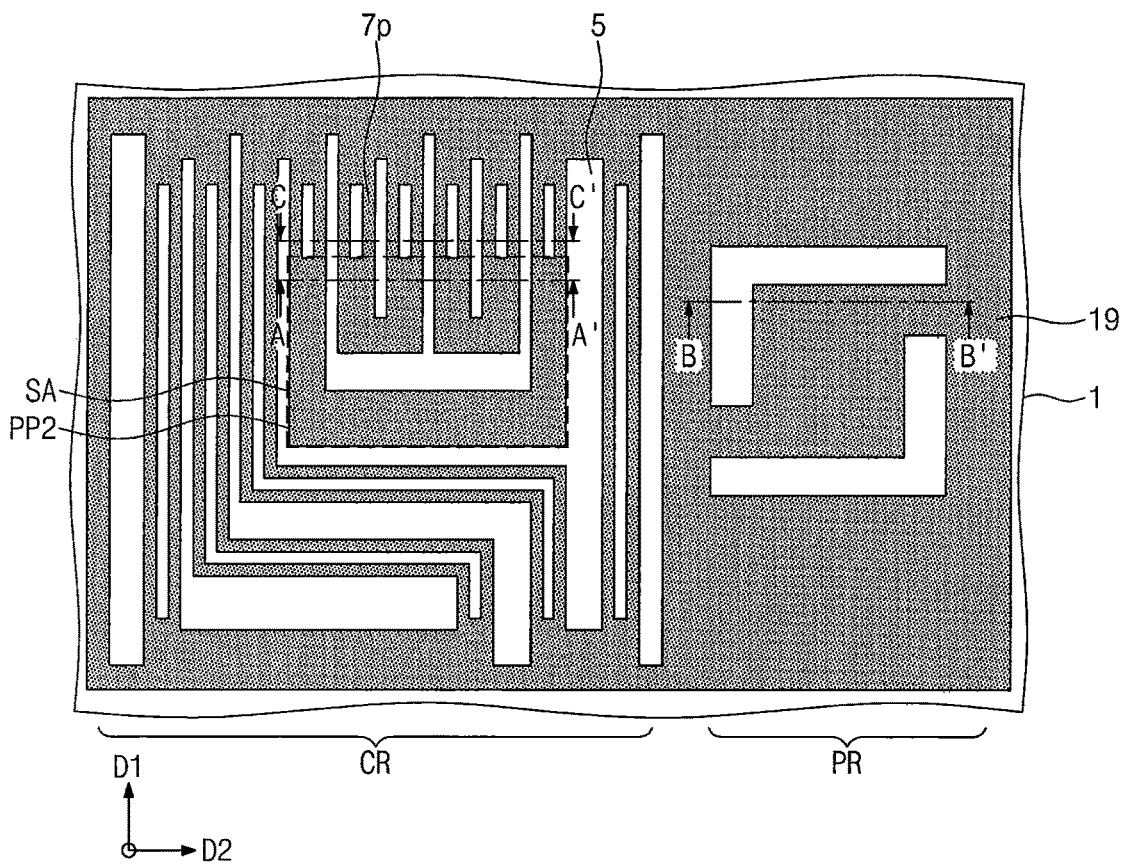
Figure 21B:
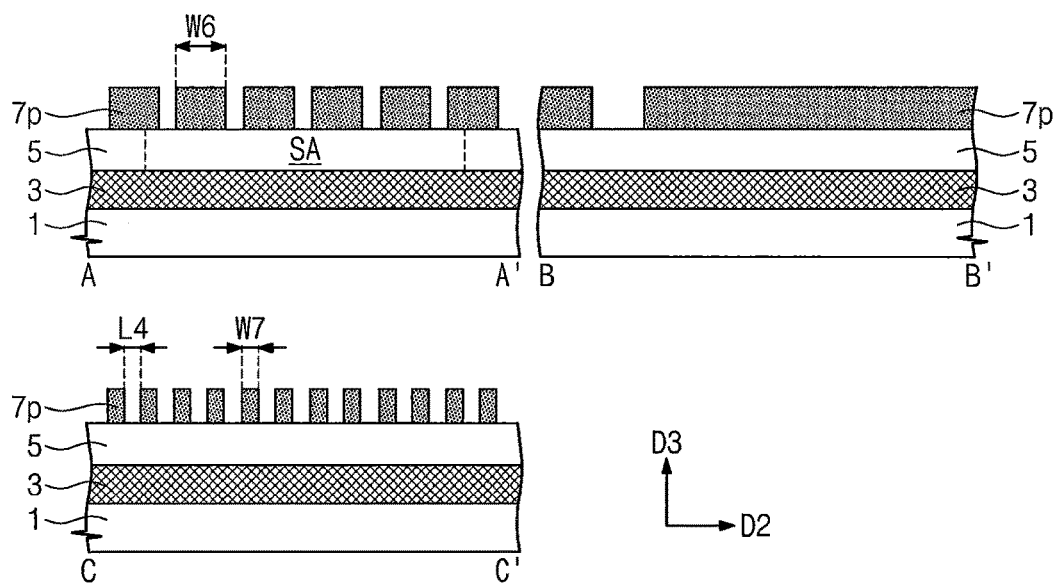

Referring to FIGS. 21A and 21B, the lower mold layer 7 may be etched using the second spacers 33p and the second etch stop patterns 18p as etch masks to form third mold patterns 7p. Unlike FIGS. 8A and 8B, the third mold patterns 7p may be formed on the peripheral circuit region PR as well as the cell array region CR. The third mold patterns 7p of the peripheral circuit region PR may define a region in which a peripheral interconnection 55 that is described later herein is formed. The third mold patterns 7p of the cell array region CR may have different widths W6 and W7 from each other depending upon their positions in the device structure.

In more detail, a width W6 of the third mold pattern 7p corresponding to the second etch stop pattern 18p may be about three times the maximum width W2 of the first spacer 31p (W6=3F). This is because the second etch stop patterns 18p are etched by the second spacers 33p, the first mask patterns 19p, and the second mold patterns 17p to have the width W5 substantially equal to 3F. For example, the width W6 of the third mold patterns 7p that are disposed on the separation region SA may be about three times the maximum width W2 of the first spacer 31p (W6=3F). A distance L4 between the third mold patterns 7p which correspond to the second etch stop patterns 18p and are adjacent to each other may be substantially equal to the maximum width W2 of the first spacer 31p (L4=1F). A width W7 of the third mold patterns 7p outside of the separation region SA may be substantially equal to the maximum width W2 of the first spacer 31p (W7=1F). This is because the third mold patterns 7p that are outside the separation region SA are etched by the second spacers 33p to have the width W2 substantially equal to 3F.

Figure 22A:
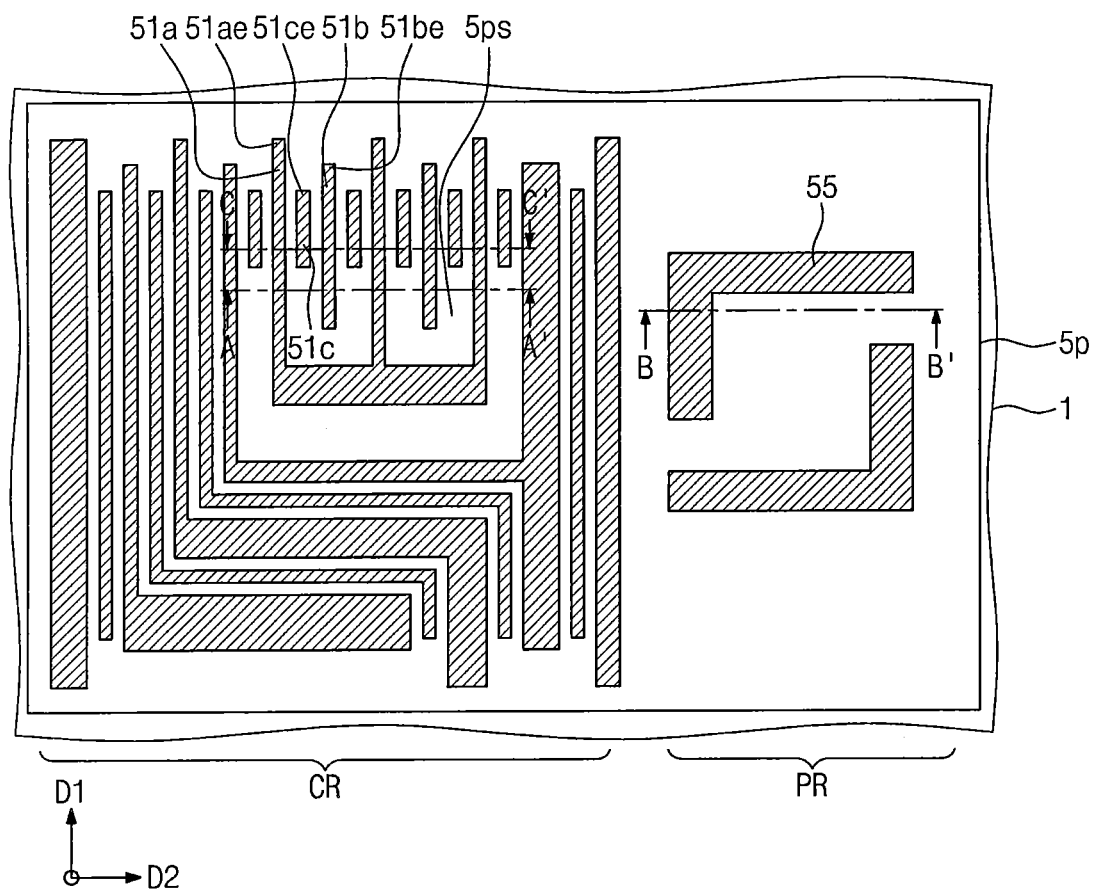
Figure 22B:
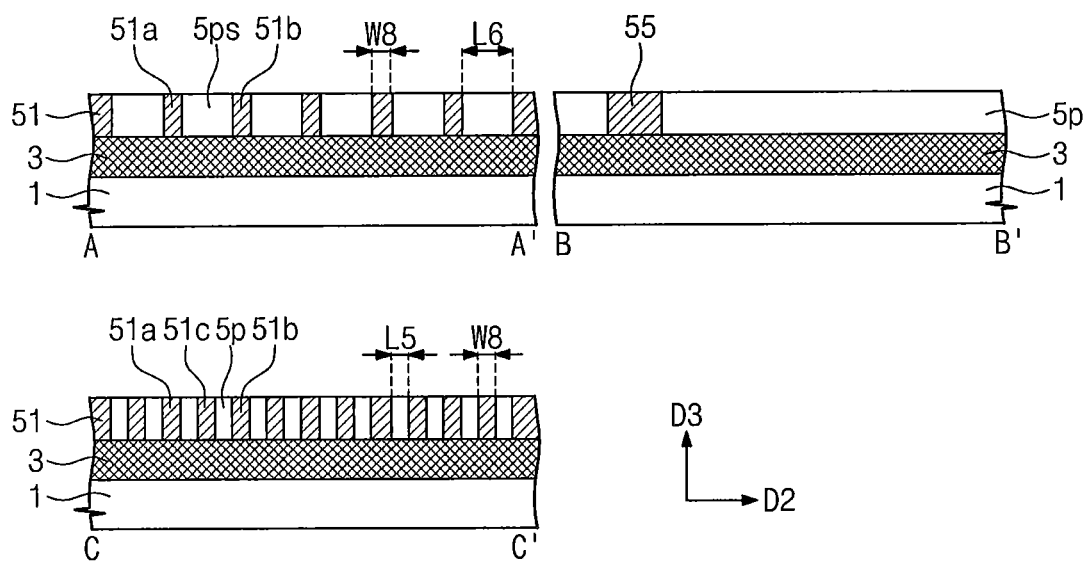

Referring to FIGS. 22A and 22B, the etch target layer 5 may be etched using the third mold patterns 7p as etch masks to form insulating patterns 5p. The insulating patterns 5p may expose portions of the top surface of the interlayer insulating layer 3 through spaces therebetween. Shapes of the insulating patterns 5p may correspond to those of the third mold patterns 7p when viewed in plan view.

The insulating patterns 5p may include separation insulating patterns 5ps formed in the separation region SA. In some embodiments, shapes of the separation insulating patterns 5ps may correspond to those of the third mold patterns 7p formed on the separation region SA when viewed in plan view.

Conductive lines 51 and 55 may be formed to fill spaces between the insulating patterns 5p. The conductive lines 51 and 55 may include cell interconnections 51 and peripheral interconnections 55. In some embodiments, if the conductive lines 51 and 55 include copper, the conductive lines 51 and 55 may be formed by a damascene process. The peripheral interconnections 55 filling the spaces between the insulating patterns 5*p* may be formed on the peripheral circuit region PR.

The cell interconnections 51 adjacent to the separation insulating patterns 5*ps* may be spaced apart from each other by the separation insulating patterns 5*ps*. For example, the cell interconnections 51 in the separation region SA may be spaced apart from each other with the separation insulating pattern 5*ps* interposed therebetween.

In more detail, the cell interconnections 51 on the cell array region CR may include first, second and third cell interconnections 51*a*, 51*b* and 51*c* that extend in parallel to each other in a first direction D1. The third cell interconnection 51*c* may be disposed between the first and second cell interconnections 51*a* and 51*b*. The separation insulating pattern 5*ps* may also be disposed between the first and second cell interconnections 51*a* and 51*b*. One end portion 51*be* of the second cell interconnection 51*b* may protrude more than one end portion 51*ce* of the third cell interconnection 51*c* in the first direction D1 when viewed in plan view. One end portion 51*ae* of the first cell interconnection 51*a* may protrude more than the one end portion 51*be* of the second cell interconnection 51*b* in the first direction D1 when viewed in plan view.

A width W8 of each of the cell interconnections 51 may be substantially equal to the maximum width W2 of the first spacer 31*p* (W8=1F). A distance L5 between adjacent ones of the cell interconnections 51 may be substantially equal to the maximum width W2 of the first spacer 31*p* (L5=1F). However, a distance L6 between the cell interconnections 51 which are adjacent to each other with the separation insulating pattern 5*ps* interposed therebetween may be about three times the maximum width W2 of the first spacer 31*p* (L6=3F). For example, a distance between the first and second cell interconnections 51*a* and 51*b* may be about 3F. Meanwhile, a width of a portion of the cell interconnections 51 may be greater than the maximum width W2 of the first spacer 31*p*. However, the inventive concepts are not limited thereto.

The cell interconnections 51 may correspond to bit lines that are connected to the contacts (not shown) that penetrate the interlayer insulating layer 3.

In the method for fabricating the semiconductor device according to the present embodiment, the conductive lines 51 and 55 having a fine pitch that is smaller than the minimum pitch realized by an exposure process may be formed using three photolithography processes and two spacer formation processes. In addition, the separation region SA of the cell interconnections 51 may be defined by the first etch stop pattern 8*p* during a first photolithography process defining the peripheral interconnections 55, so the fabricating processes may be simplified. Furthermore, since the separation insulating patterns 5*ps* used for node separation of the cell interconnections 51 are formed to be self-aligned by the first etch stop pattern 8*p*, it is possible to reduce or prevent misalignment of the cell interconnections 51.

As shown in FIGS. 22A and 22B, in the semiconductor device according to the present embodiment, insulating patterns 5*p* and conductive lines 51 and 55 filling spaces between the insulating patterns 5*p* may be disposed on the substrate 1. The insulating patterns 5*p* may include separation insulating patterns 5*ps* on a cell array region CR. The conductive lines 51 and 55 may include cell interconnections 51 disposed on the cell array region CR and peripheral interconnections 55 disposed on a peripheral circuit region PR.

The cell interconnections 51 that are adjacent the separation insulating patterns 5*ps* may be spaced apart from each other by the separation insulating patterns 5*ps*. In particular, the cell interconnections 51 disposed on the cell array region CR may include first, second and third cell interconnections 51*a*, 51*b* and 51*c* that extend in parallel to each other in a first direction D1. The third cell interconnection 51*c* may be disposed between the first and second cell interconnections 51*a* and 51*b*. The separation insulating pattern 5*ps* may also be disposed between the first and second cell interconnections 51*a* and 51*b*. An end portion 51*be* of the second cell interconnection 51*b* may protrude more than an end portion 51*ce* of the third cell interconnection 51*c* in the first direction D1 when viewed in plan view. An end portion 51*ae* of the first cell interconnection 51*a* may protrude more than the above-referenced end portion 51*be* of the second cell interconnection 51*b* in the first direction D1 when viewed in plan view.

A width W8 of each of the cell interconnections 51 may be substantially equal to 1F (W8=1F). A distance L5 between adjacent ones of the cell interconnections 51 may be substantially equal to the width W8 of the cell interconnection 51 (L5=1F). However, a distance L6 between the cell interconnections 51 which are adjacent to each other with the separation insulating pattern 5*ps* interposed therebetween may be about three times the width W8 of the cell interconnection 51 (L6=3F). For example, a distance between the first and second cell interconnections 51*a* and 51*b* may be about 3F. Meanwhile, a width of a portion of the cell interconnections 51 may be greater than 1F. However, the inventive concepts are not limited thereto.

FIGS. 24A to 29A are plan views illustrating a method for fabricating a semiconductor device according to still further embodiments of the inventive concepts. FIGS. 24B to 29B are cross-sectional views taken along lines A-A', B-B', and C-C' of FIGS. 24A to 29A, respectively. In the present embodiment, the same elements as described with reference to FIGS. 13A to 22A and 13B to 22B will be referred to using the same reference numerals or the same reference designators. For the purpose of ease and convenience in explanation, descriptions of elements already described above with respect to the embodiment of FIGS. 13A to 22A and 13B to 22B will be omitted or mentioned briefly.

Figure 24A:
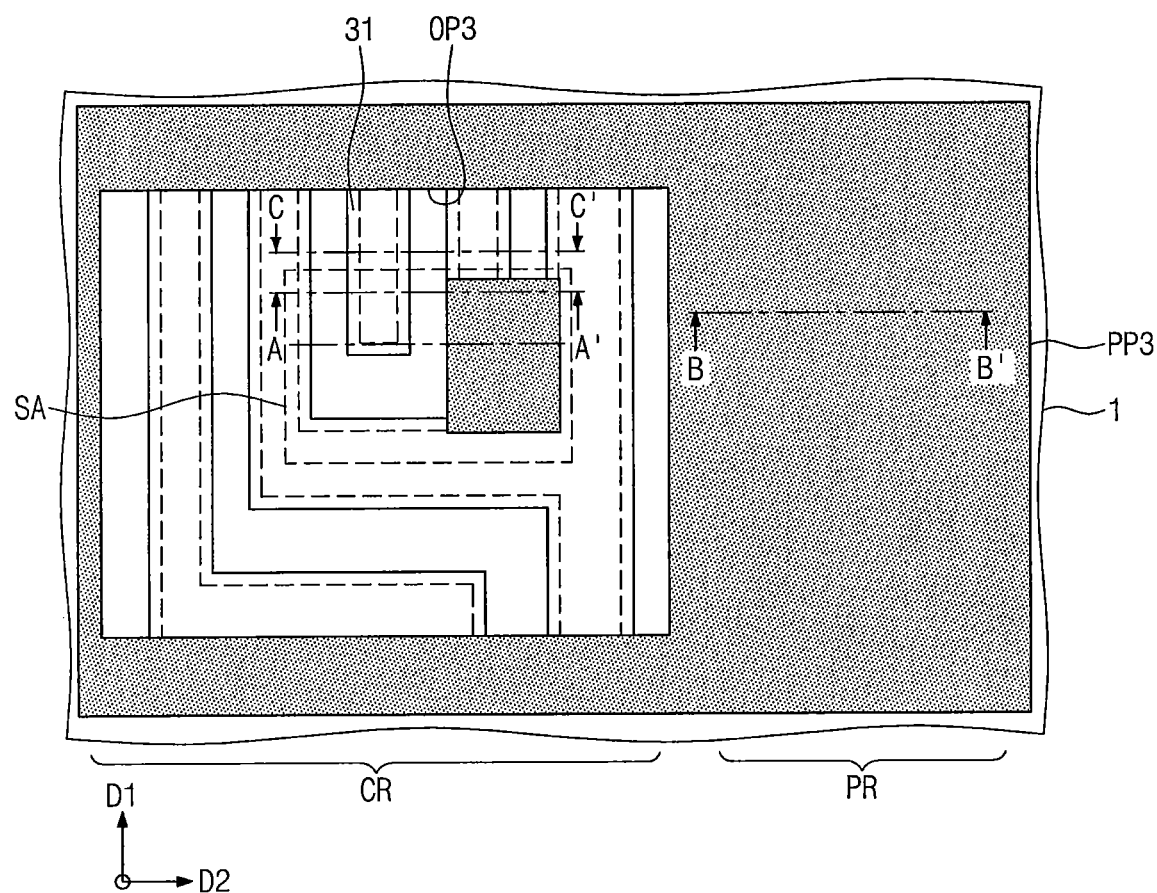
Figure 24B:
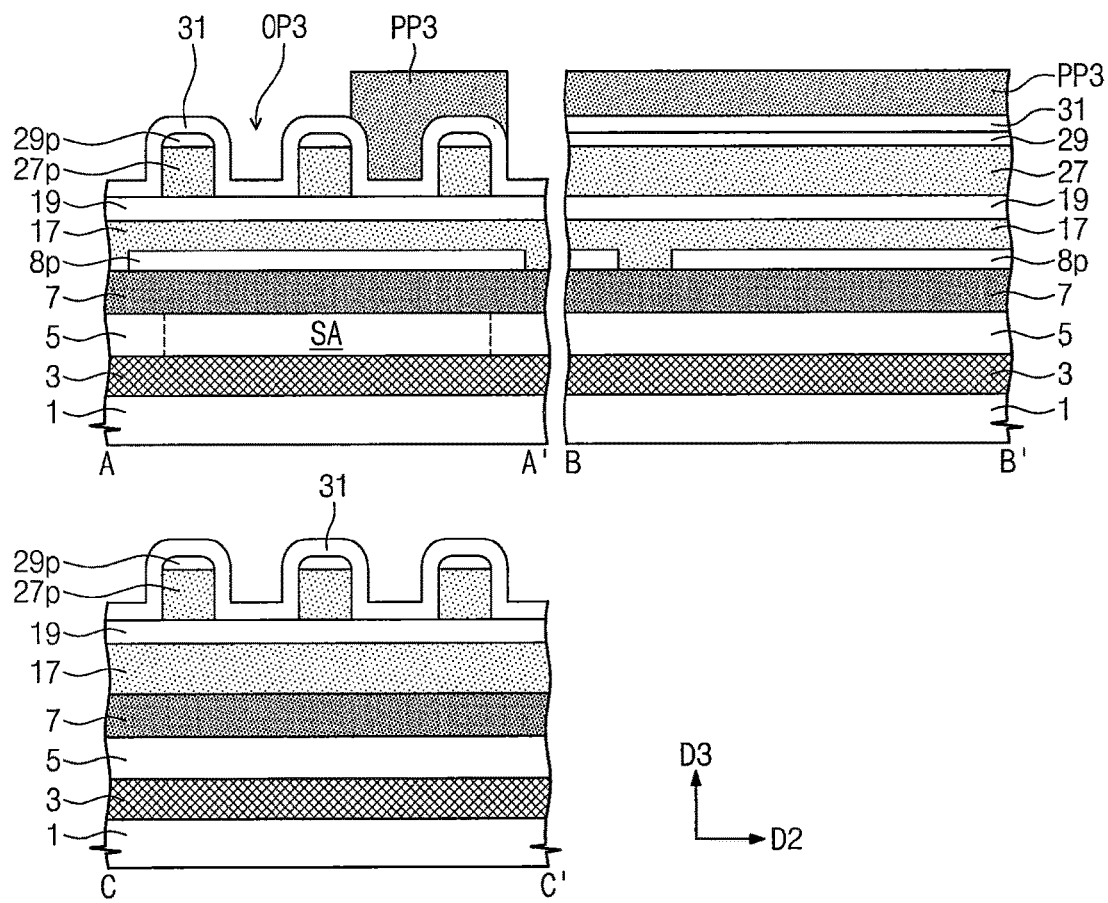

Referring to FIGS. 24A and 24B, third photoresist patterns PP3 may be formed on the structure that is described above with reference to FIGS. 16A and 16B. The third photoresist patterns PP3 may be formed on the first spacer layer 31 and may have a third opening OP3. The third opening OP3 may be disposed on the cell array region CR. In other words, the third photoresist patterns PP3 may cover the first spacer layer 31 of the peripheral circuit region PR but may expose a portion of the first spacer layer 31 of the cell array region CR.

In the present embodiment, unlike FIGS. 17A and 17B, at least one of the third photoresist patterns PP3 may vertically overlap a portion the separation region SA (i.e., a line can be drawn that is perpendicular to the bottom surface of the substrate 1 that bisects both the separation region SA and the third photoresist patterns PP3). The third photoresist pattern PP3 disposed on the separation region SA may define a second separation insulating pattern 5*psb* which will be described later.

Figure 25A:
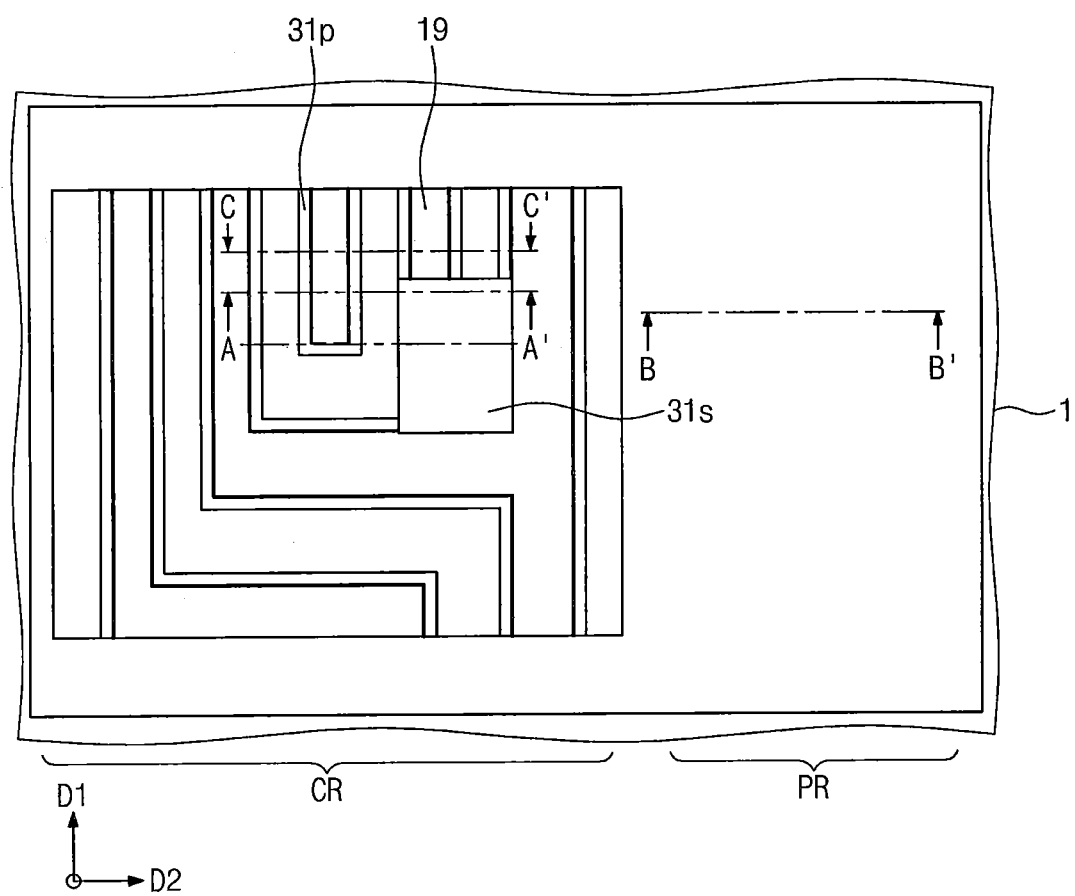
Figure 25B:
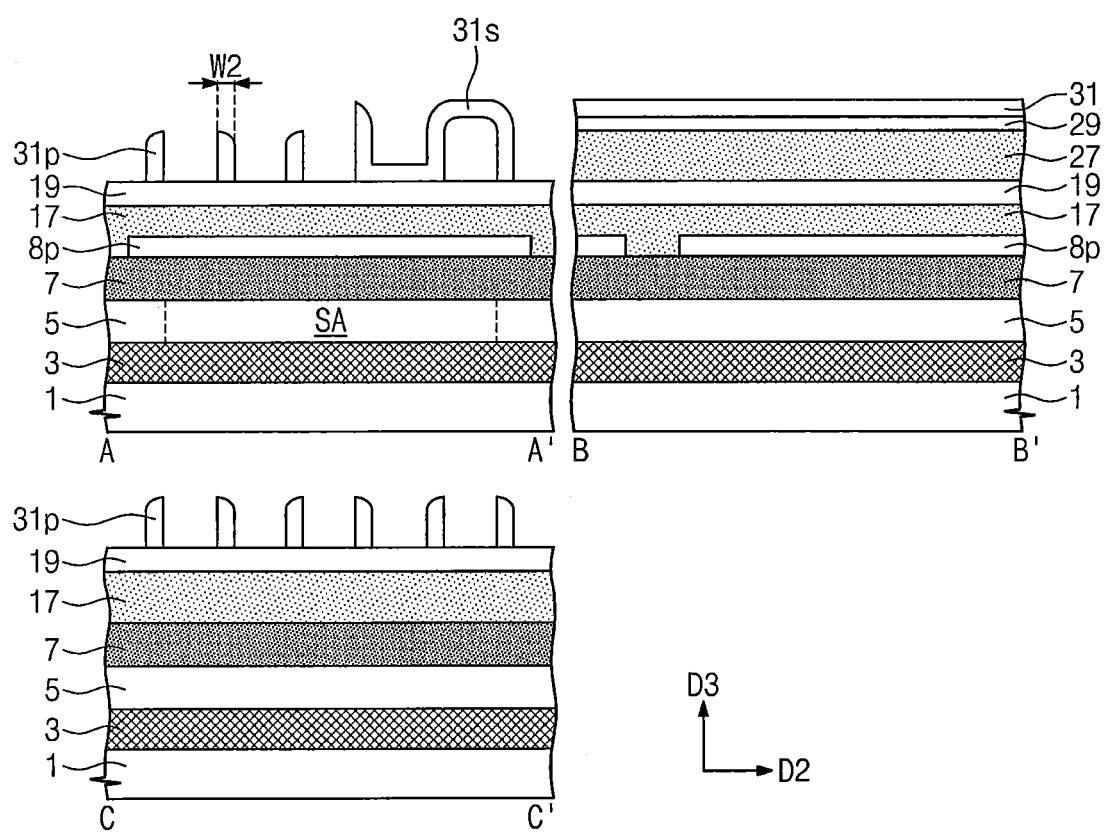

Referring to FIGS. 25A and 25B, the first spacer layer 31 may be anisotropically etched using the third photoresist patterns PP3 as etch masks to form first spacers 31p. The first spacers 31p may cover sidewalls of the first mold patterns 27p that are exposed through the third opening OP3. The maximum width W2 of each of the first spacers 31p may be defined as 1F.

Subsequently, the second mask patterns 29p exposed through the third opening OP3 may be selectively removed to expose top surfaces of the first mold patterns 27p that are not covered by the third photoresist patterns PP3. Next, the exposed first mold patterns 27p may be removed.

During the above processing steps, the first spacer layer 31, the second mask layer 29, and the upper mold layer 27 which are disposed under the third photoresist patterns PP3 may remain on the first mask layer 19. For example, the first spacer layer 31, the second mask layer 29 and the upper mold layer 27 of the peripheral circuit region PR may not be etched. In addition, a portion of the first spacer layer 31 disposed under the third photoresist pattern PP3 overlapping with the separation region SA may not be etched. The portion of the first spacer layer 31 which is not etched by the third photoresist pattern PP3 overlapping with the separation region SA may be defined as a separation spacer layer 31s (see the cross-sectional view of the line A-A' of FIG. 25B). The third photoresist patterns PP3 may then be removed.

Figure 26A:
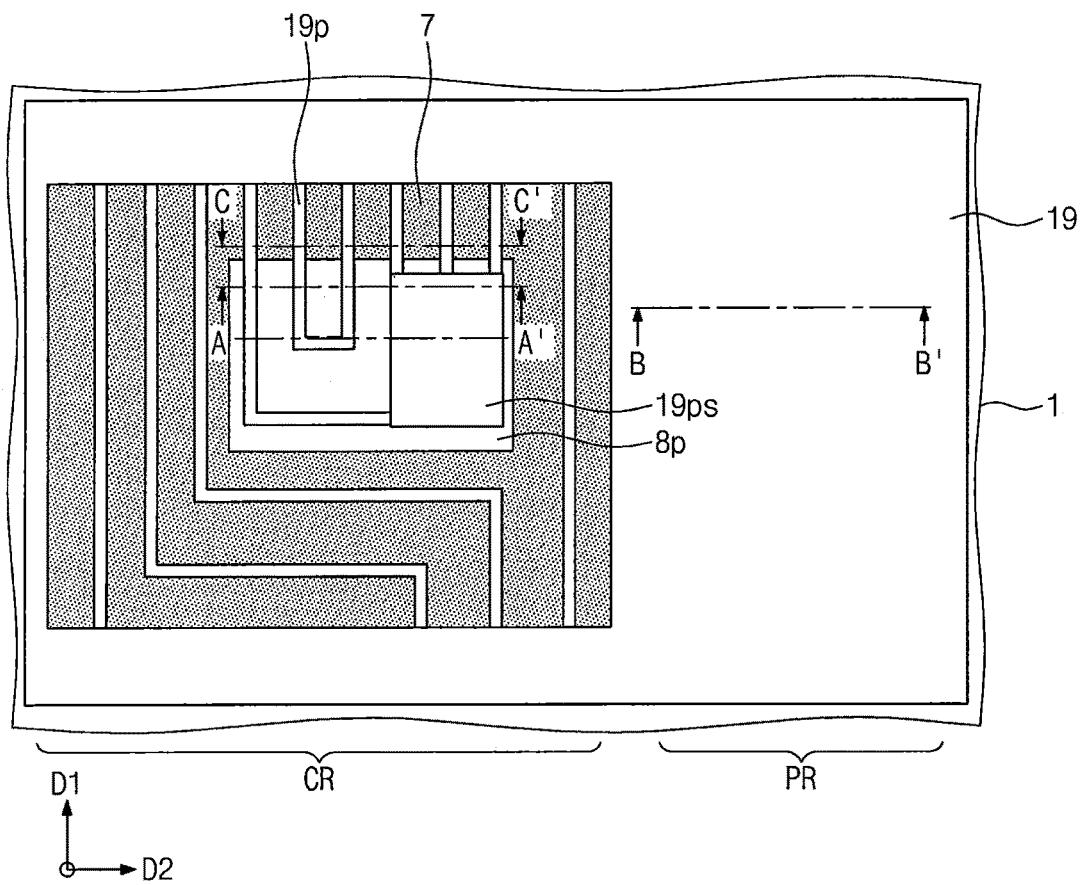
Figure 26B:
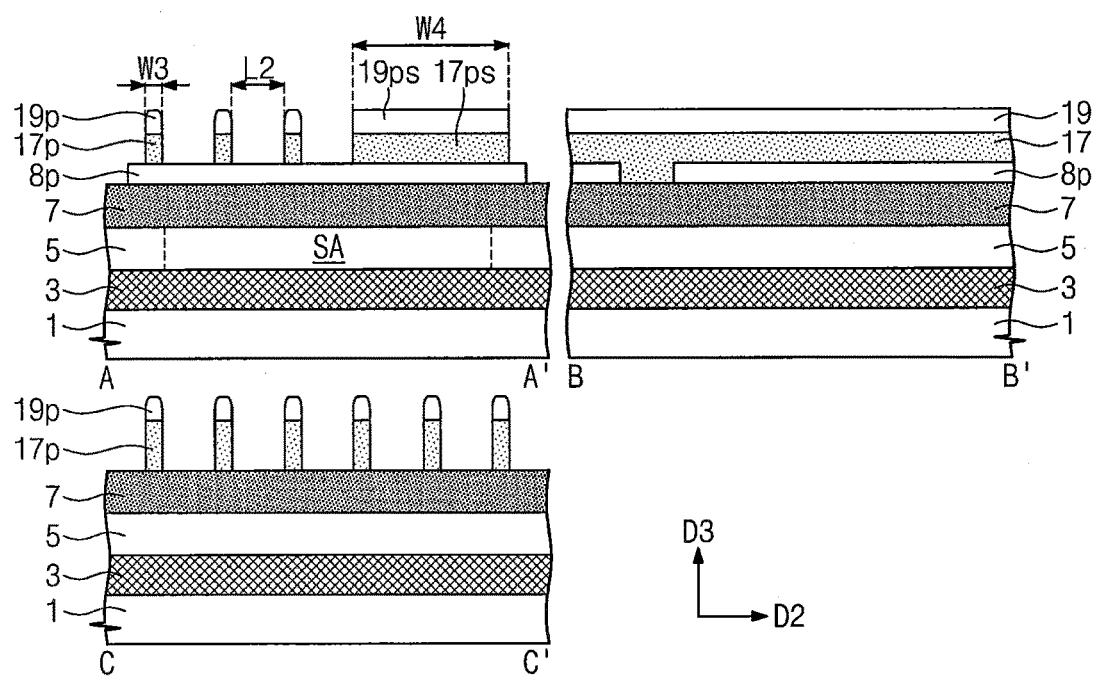

Referring to FIGS. 26A and 26B, the first mask layer 19 may be etched using the first spacers 31p and the separation spacer layer 31s as etch masks to form first mask patterns 19p and a separation mask pattern 19ps on the cell array region CR. At this time, the first spacer layer 31 and the second mask layer 29 of the peripheral circuit region PR may be removed.

Next, the intermediate mold layer 17 may be etched using the first mask patterns 19p and the separation mask pattern 19ps as etch masks to form second mold patterns 17p and a first separation mold pattern 17ps.

When viewed in plan view, shapes of the second mold patterns 17p may correspond to those of the first spacers 31p and a shape of the first separation mold pattern 17ps may correspond to that of the separation spacer layer 31s. The first separation mold pattern 17ps may be formed on the first etch stop pattern 8p. Meanwhile, the upper mold layer 27 of the peripheral circuit region PR may be removed to expose the top surface of the first mask layer 19 of the peripheral circuit region PR.

A width W3 of each of the second mold patterns 17p may be substantially equal to the maximum width W2 of the first spacer 31p (W3=1F). A distance L2 between adjacent ones of the second mold patterns 17p may be about three times the maximum width W2 of the first spacer 31p (L2=3F). A width W4 of the first separation mold pattern 17ps may be greater than about three times the maximum width W2 of the first spacer 31p.

Figure 27A:
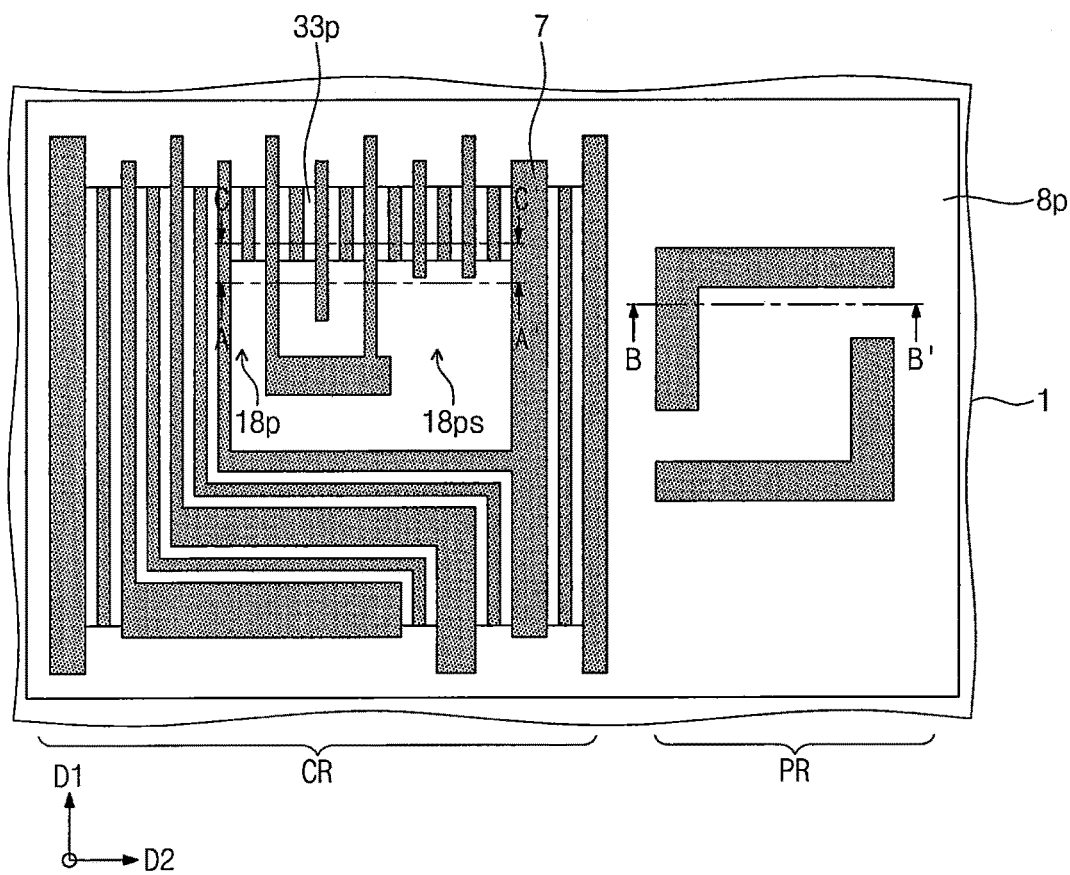
Figure 27B:
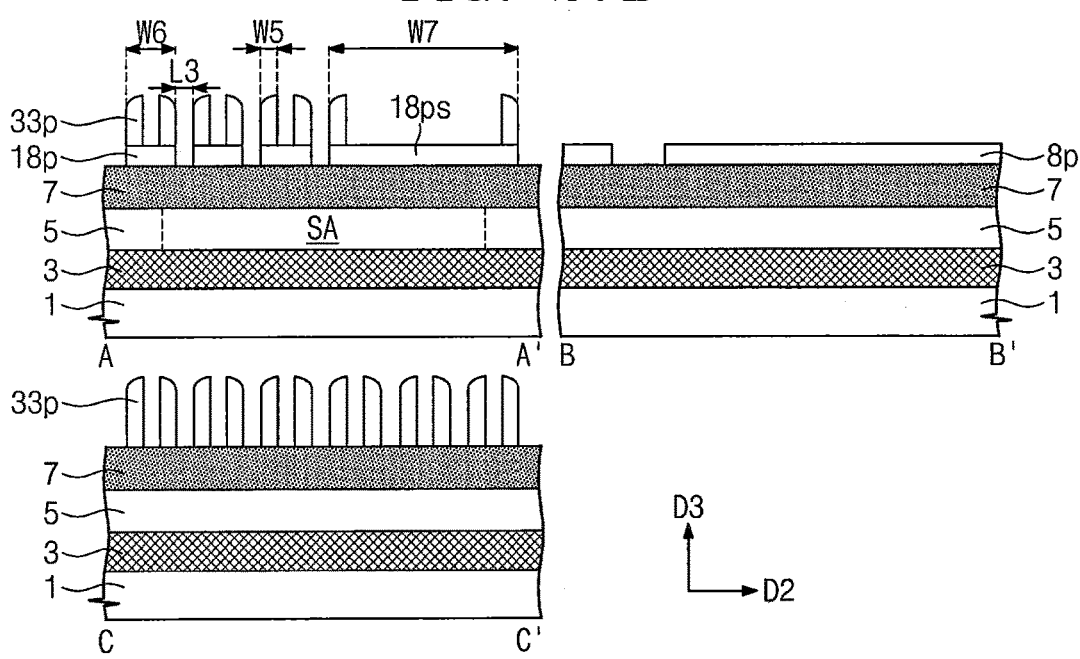

Referring to FIGS. 27A and 27B, second spacers 33p may be formed to cover sidewalls of the second mold patterns 17p and the first separation mold pattern 17ps. When the second spacers 33p are formed, portions of the first etch stop pattern 8p of the cell array region CR may also be etched. Thus, second etch stop patterns 18p may be formed on the separation region SA.

However, unlike FIGS. 23A and 23B, the first etch stop pattern 8p under the first separation mold pattern 17ps may not be etched to be formed into a separation etch stop pattern 18ps. In other words, the separation etch stop pattern 18ps may overlap with the first separation mold pattern 17ps and the second spacers 33p covering both sidewalls of the first separation mold pattern 17ps when viewed in plan view.

The second mold patterns 17p and the first separation mold pattern 17ps may be selectively removed. The intermediate mold layer 17 of the peripheral circuit region PR may be removed during this processing step to expose the first etch stop pattern 8p of the peripheral circuit region PR.

The maximum width W5 of each of the second spacers 33p may be substantially equal to the maximum width W2 of the first spacer 31p (W5=1F). A width W6 of each of the second etch stop patterns 18p may be about three times the maximum width W2 of the first spacer 31p (W6=3F). A distance L3 between adjacent ones of the second etch stop patterns 18p may be substantially equal to the maximum width W2 of the first spacer 31p (L3=1F).

A pair of the second spacers 33p may be disposed on each separation etch stop pattern 18ps. Outer walls of each pair of second spacers 33p may be coplanar with the outer sidewalls of the underlying separation etch stop pattern 18ps. A distance between the pair of spacers 33p that are on the separation etch stop pattern 18ps may be greater than the maximum width W2 of the first spacer 31p as a width W7 of the separation etch stop pattern 18ps may be greater than about three times the maximum width W2 of the first spacer 31p (W7>3F).

In the method for fabricating the semiconductor device according to the present embodiment, the third photoresist pattern PP3 overlapping with the portion of the separation region SA is further formed unlike FIGS. 23A and 23B, so the separation etch stop pattern 18ps having the width W7 that is greater than the width W6 of the second etch stop pattern 18p may be formed.

Figure 28A:
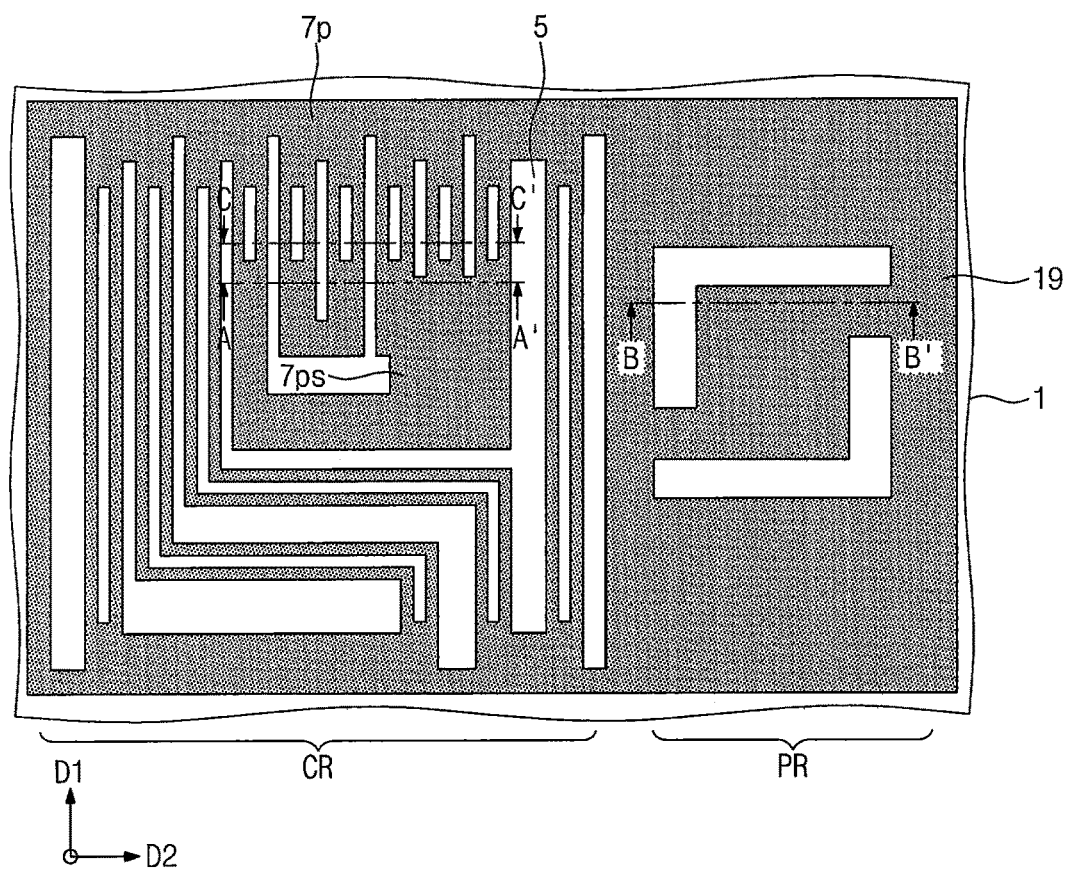
Figure 28B:
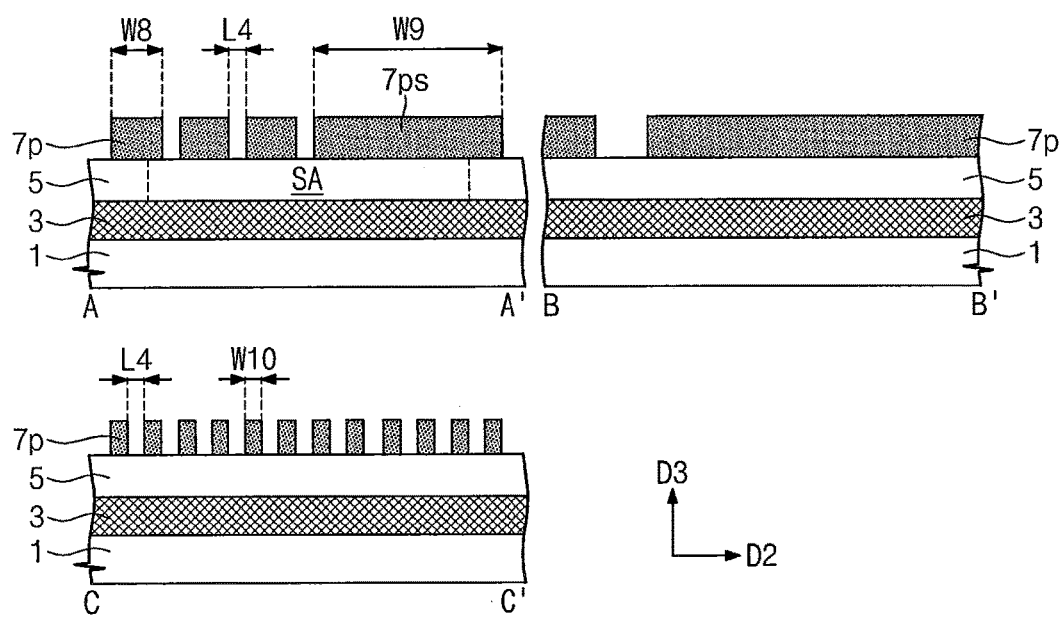

Referring to FIGS. 28A and 28B, the lower mold layer 7 may be etched using the second spacers 33p, the second etch stop patterns 18p, and the separation etch stop pattern 18ps as etch masks to form third mold patterns 7p. The third mold patterns 7p may be formed on the peripheral circuit region PR as well as the cell array region CR. The third mold patterns 7p may include a second separation mold pattern 7ps. A shape of the second separation mold pattern 7ps may correspond to that of the separation etch stop pattern 18ps when viewed in plan view.

In more detail, a width W8 of the third mold pattern 7p corresponding to the second etch stop pattern 18p may be about three times the maximum width W2 of the first spacer 31p (W8=3F). A width W9 of the second separation mold pattern 7ps corresponding to the separation etch stop pattern 18ps may be greater than about three times the maximum width W2 of the first spacer 31p (W9>3F). For example, the width W8 of the third mold pattern 7p on the separation region SA may be equal to about three times the maximum width W2 of the first spacer 31p (W6=3F), and the width W9 of the second separation mold pattern 7ps on the separation region SA may be equal to nine times the maximum width W2 of the first spacer 31p (W9=9F). A distance L4 between adjacent ones of the third mold patterns 7p that correspond to the second etch stop patterns 18p may be substantially equal to the maximum width W2 of the first spacer 31p (L4=1F).

Figure 29A:
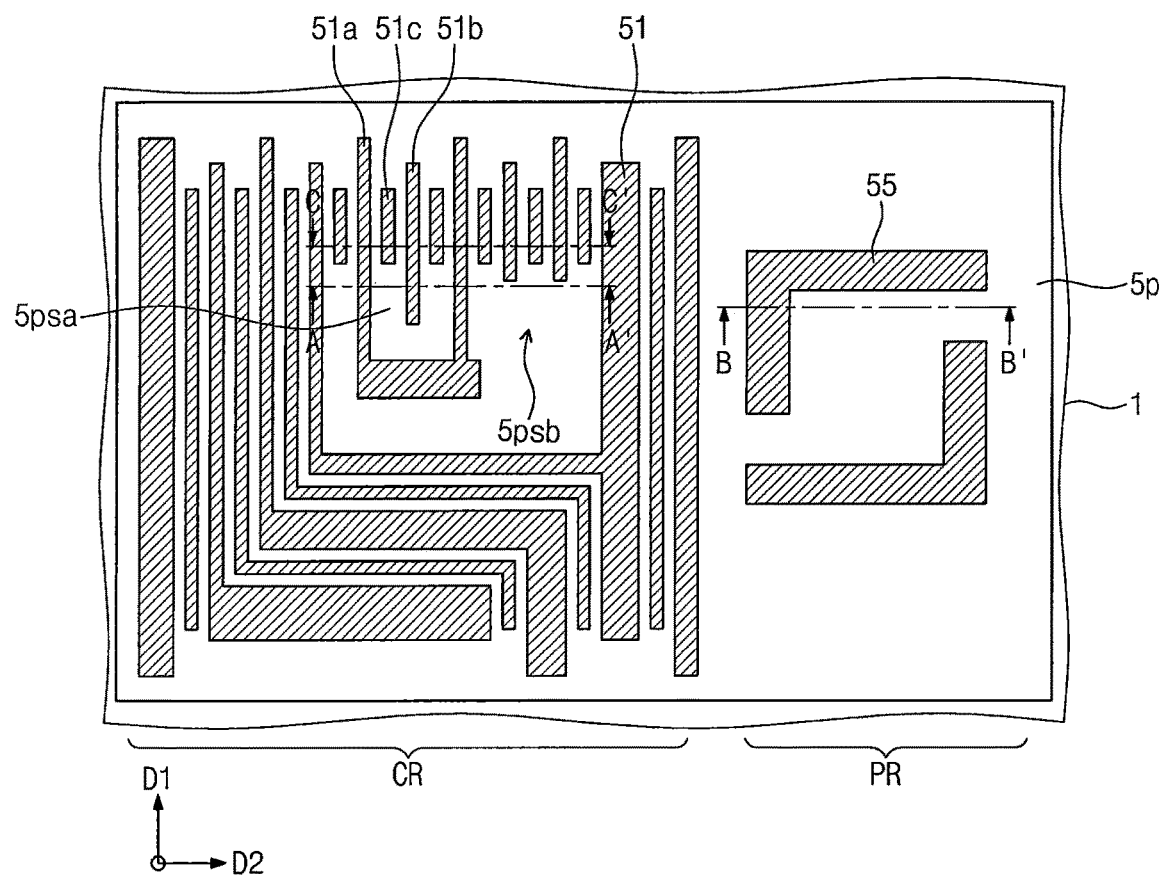
Figure 29B:
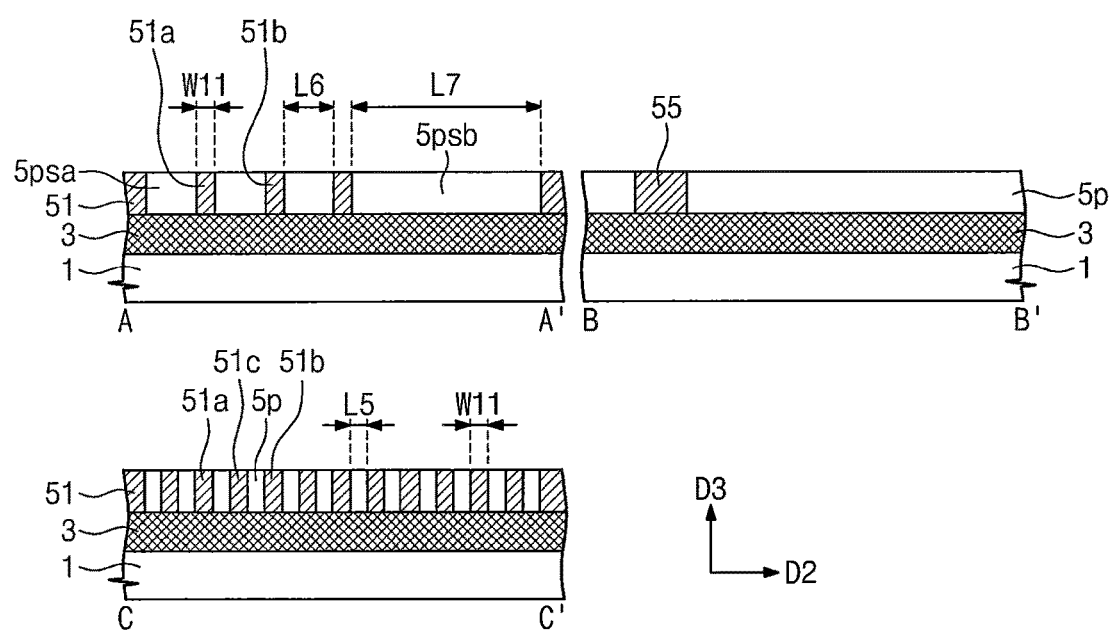

Referring to FIGS. 29A and 29B, the etch stop layer 5 may be etched using the third mold patterns 7p as etch masks to form insulating patterns 5p. Shapes of the insulating patterns 5p may correspond to those of the third mold patterns 7p when viewed in plan view.

The insulating patterns 5p may include first separation insulating patterns 5psa and a second separation insulating pattern 5psb that are in the separation region SA. Shapes of the first separation insulating patterns 5*psa* may correspond to the third mold patterns 7*p* on the separation region SA when viewed in plan view. A shape of the second separation insulating pattern 5*psb* may correspond to that of the second separation mold pattern 7*ps* when viewed in plan view.

Conductive lines 51 and 55 may be formed to fill spaces between the insulating patterns 5*p*. The conductive lines 51 and 55 may include cell interconnections 51 and peripheral interconnections 55. The peripheral interconnections 55 may fill the spaces between the insulating patterns 5*p* disposed on the peripheral circuit region PR.

The cell interconnections 51 adjacent the first separation insulating patterns 5*psa* may be spaced apart from each other by the first separation insulating patterns 5*psa*. The cell interconnections 51 adjacent the second separation insulating pattern 5*psb* may be spaced apart from each other by the second separation insulating pattern 5*psb*. In more detail, the cell interconnections 51 on the cell array region CR may include first, second and third cell interconnections 51*a*, 51*b*, 51*c* that extend in parallel to each other in a first direction D1. The first separation insulating pattern 5*psa* may be disposed between the first and second cell interconnections 51*a*, 51*b*.

A width W11 of each of the cell interconnections 51 may be substantially equal to the maximum width W2 of the first spacer 31*p* (W11=1F). A distance L5 between adjacent ones of the cell interconnections 51 may be substantially equal to the maximum width W2 of the first spacer 31*p* (L5=1F). However, a distance L6 between adjacent ones of the cell interconnections 51 that have the first separation insulating pattern 5*psa* interposed therebetween may be about three times the maximum width W2 of the first spacer 31*p* (L6=3F). In addition, a distance L7 between adjacent ones of the cell interconnections 51 that have the second separation insulating pattern 5*psb* interposed therebetween may be greater than about three times the maximum width W2 of the first spacer 31*p* (L7>3F).

In the method for fabricating the semiconductor device according to the present embodiment, conductive lines 51 and 55 having a fine pitch that is smaller than the minimum pitch realized by an exposure process may be formed using three photolithography processes and two spacer formation processes. In addition, the third photoresist pattern PP3 overlapping with the portion of the separation region SA may formed in a third photolithography process unlike the embodiment of FIGS. 13A to 22A and 13B to 22B, so a node separation region may be further defined. As a result, it is possible to increase the width of one or some of the separation insulating patterns (e.g., the width of the second separation insulating pattern 5*psb*).

As shown in FIGS. 29A and 29B, in the semiconductor device according to the present embodiment, the insulating patterns 5*p* may include first separation insulating patterns 5*psa* and a second separation insulating pattern 5*psb* which are disposed on the cell array region CR. Cell interconnections 51 may be spaced apart from each other with each of the first and second separation insulating patterns 5*psa* and 5*psb* interposed therebetween.

A distance L6 between adjacent ones of the cell interconnections 51 that have the first separation insulating pattern 5*psa* interposed therebetween may be about three times the maximum width W2 of the first spacer 31*p* (L6=3F). For example, a distance between first and second cell interconnections 51*a*, 51*b* may be about 3F. A distance L7 between adjacent ones of the cell interconnections 51 that have the second separation insulating pattern 5*psb* interposed therebetween may be greater than about three times a width W11 of the cell interconnection 51 (L7>3F).

Descriptions to other elements of the semiconductor device according to the present embodiment may be similar to those to corresponding elements of the semiconductor device described with reference to FIGS. 22A and 22B.

Figure 30:
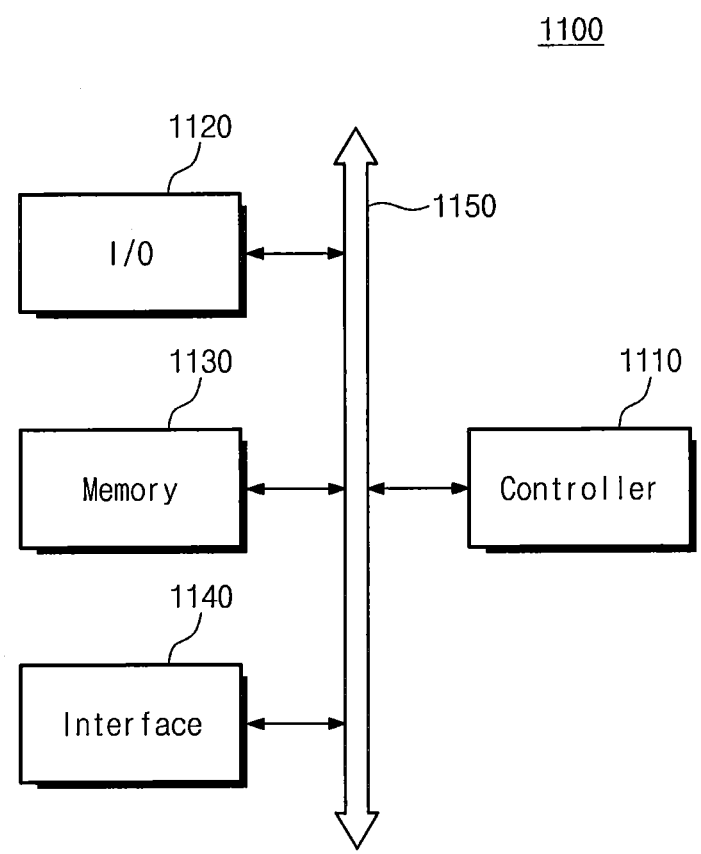
FIG. 30 is a schematic block diagram illustrating an embodiment of an electronic system including a semiconductor device according to embodiments of the inventive concepts.

FIG. 30 is a schematic block diagram illustrating an embodiment of an electronic system including a semiconductor device according to embodiments of the inventive concepts.

Referring to FIG. 30, an electronic system 1100 may be applied to a personal digital assistant (PDA), a portable computer, a web tablet, a wireless phone, a mobile phone, a digital music player, a memory card, or other electronic products receiving and/or transmitting information data by wireless.

The electronic system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150.

The controller 1110 may include at least one of a microprocessor, a digital signal processor, a microcontroller, or other logic devices having a similar function to any one thereof. The memory device 1130 may store data and/or commands executed by the controller 1110. The I/O unit 1120 may receive data or signals from the outside of the system 1100 or may transmit data or signals to the outside of the system 1100. For example, the I/O unit 1120 may include a keypad, a keyboard, and/or a display device.

The memory device 1130 may include at least one of the semiconductor devices according to the above mentioned embodiments of the inventive concepts. In addition, the memory device 1130 may further include at least one other memory device.

The interface unit 1140 may transmit electrical data to a communication network and/or may receive electrical data from a communication network.

Figure 31:
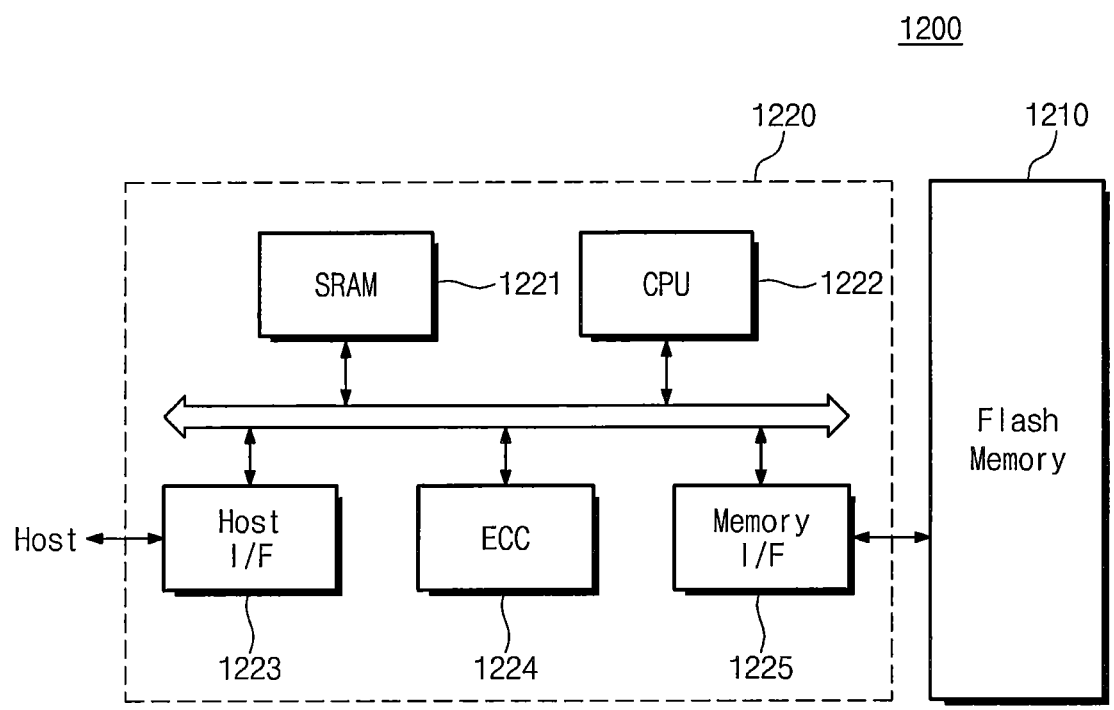
FIG. 31 is a schematic block diagram illustrating an embodiment of a memory card including a semiconductor device according to embodiments of the inventive concepts.

FIG. 31 is a schematic block diagram illustrating an embodiment of a memory card including a semiconductor device according to embodiments of the inventive concepts.

Referring to FIG. 31, a memory card 1200 used for storing massive data may include a flash memory device 1210 implemented with at least one of the semiconductor devices according to the aforementioned embodiments of the inventive concepts. The memory card 1200 may include a memory controller 1220 that controls data communication between a host and the flash memory device 1210.

A static random access memory (SRAM) device 1221 may be used as a working memory of a central processing unit (CPU) 1222. A host interface (I/F) unit 1223 may be configured to include a data communication protocol between the memory card 1200 and the host. An error check and correction (ECC) block 1224 may detect and correct errors of data which are read out from the memory device 1210. A memory interface unit 1225 may interface with the flash memory device 1210. The CPU 1222 may control overall operations for data communication of the memory controller 1220. Even though not shown in the drawings, the memory card 1200 may further include a read only memory (ROM) device that stores code data used for interfacing with the host.

The flash memory device according to the above mentioned embodiments may be provided into a memory system such as a solid state disk (SSD).

Figure 32:
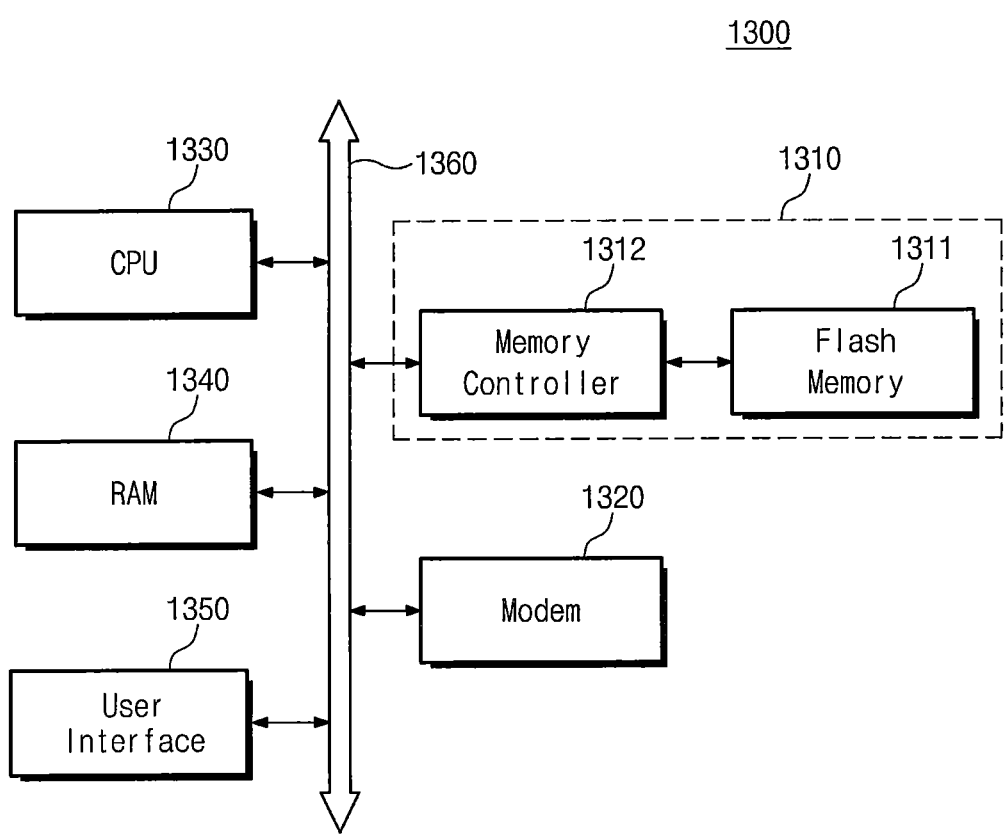
FIG. 32 is a schematic block diagram illustrating an embodiment of an information processing system including a semiconductor device according to embodiments of the inventive concepts.

FIG. 32 is a schematic block diagram illustrating an embodiment of an information processing system including a semiconductor device according to embodiments of the inventive concepts.

Referring to FIG. 32, a flash memory system 1310 according to the inventive concepts may be installed in an information processing system 1300 such as a mobile device or a desk top computer. The information processing system 1300 according to the inventive concepts may include a modem 1320, a central processing unit (CPU) 1330, a random access memory (RAM) 1340, and a user interface unit 1350 which are electrically connected to the flash memory system 1310 through a system bus 1360. The flash memory system 1310 may have the substantially same structure as the memory card 1200 described above. In other words, the flash memory system 1310 may include a flash memory device 1311 and a memory controller 1312. The flash memory system 1310 may store data processed by the CPU 1330 or data inputted from an external system. In some embodiments, the flash memory system 1310 may be realized as a solid state disk (SSD). In this case, the information processing system 1300 may stably store large amounts of data in the flash memory system 1310. In addition, as reliability of the flash memory system 1310 increases, the flash memory system 1310 may reduce processing resources that are consumed in performing error correction operations. Thus, the information processing system 1300 may perform a fast data communication function. Even though not shown in the drawings, the information processing system 1300 may further include, for example, an application chipset, a camera image processor (CIS), and/or an input/output (I/O) unit.

The semiconductor devices and/or the memory system described above may be encapsulated using various packaging techniques. For example, the semiconductor devices and/or the memory system according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

In the methods for fabricating the semiconductor device according to the inventive concepts, conductive lines having a fine pitch that is smaller than the minimum pitch that can be realized by the exposure process may be formed using two or three photolithography processes and two spacer formation processes. In addition, it is possible to improve the alignment margin of the node separation region of the conductive lines.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for fabricating a semiconductor device, the method comprising:
    sequentially forming an etch target layer, a lower mold layer, and an intermediate mold layer on a substrate, the etch target layer including a separation region;
    forming first mold patterns on the intermediate mold layer;
    forming first spacers on sidewalls of the first mold patterns;
    etching the intermediate mold layer using the first spacers as etch masks to form second mold patterns;
    forming second spacers on sidewalls of the second mold patterns;
    etching the lower mold layer using the second spacers as etch masks to form third mold patterns;
    forming a fourth mold pattern that at least partially covers at least one of the third mold patterns, the fourth mold pattern vertically overlapping the separation region;
    etching the etch target layer using the fourth mold pattern and ones of the third mold patterns that are exposed by the fourth mold pattern as etch masks to form insulating patterns; and
    forming conductive lines in spaces between the insulating patterns.

2. The method of claim 1, wherein the substrate includes a cell array region and a peripheral circuit region,
    wherein the separation region is on the cell array region,
    wherein the fourth mold pattern includes a plurality of fourth mold patterns, and
    wherein a one of the fourth mold patterns that is on the peripheral circuit region exposes a portion of the etch target layer that is on the peripheral circuit region.

3. The method of claim 2, wherein the first, second and third mold patterns are formed on the cell array region.

4. The method of claim 2, wherein forming the first mold patterns comprises:
    forming an upper mold layer on the intermediate mold layer;
    forming photoresist patterns on the upper mold layer, the photoresist patterns covering the upper mold layer of the peripheral circuit region but exposing portions of the upper mold layer of the cell array region; and
    etching the upper mold layer using the photoresist patterns as etch masks to form the first mold patterns on the cell array region.

5. The method of claim 2, wherein the portion of the lower mold layer that is on the peripheral circuit region is completely etched when the third mold patterns are formed.

6. The method of claim 2, wherein forming the fourth mold patterns comprises:
    forming a preliminary mold layer on the third mold patterns;
    forming photoresist patterns on the preliminary mold layer; and
    etching the preliminary mold layer using the photoresist patterns as etch masks to form fourth mold patterns,
    wherein the photoresist pattern on the cell array region vertically overlaps the separation region.

7. The method of claim 1, wherein the third mold patterns include a first extension pattern and a second extension pattern that extend in parallel to each other in one direction, and wherein one sidewall of the fourth mold pattern is disposed between the first extension pattern and the second extension pattern.

8. The method of claim 7, wherein etching the etch target layer to form the insulating patterns comprises:
etching a portion of the etch target layer, which is exposed by the fourth mold pattern between the first and second extension patterns, to form a dummy trench.

9. The method of claim 8, wherein a width of a portion of the dummy trench is substantially equal to a maximum width of the first spacer, and
wherein a width of another portion of the dummy trench is smaller than the maximum width of the first spacer.

10. The method of claim 8, wherein forming the conductive lines comprises: forming a dummy interconnection in the dummy trench,
wherein the dummy interconnection is between the separation region and a first of the insulating patterns that is adjacent the separation region.

11. The method of claim 1, further comprising:
forming a first mask layer on the intermediate mold layer before forming the first mold patterns; and
etching the first mask layer using the first spacers as etch masks to form first mask patterns,
wherein the first mask patterns are also used as etch masks when the intermediate mold layer is etched.

12. The method of claim 1, wherein a width of at least one of the first mold patterns is about three times a maximum width of one of the first spacers.

13. The method of claim 1, wherein a distance between adjacent ones of the first mold patterns is about five times a maximum width of the one of the first spacers.

14. The method of claim 1, wherein a width of at least one of the second mold patterns and a width of at least one of the third mold patterns are substantially equal to a maximum width of one of the first spacers.

15. The method of claim 1, wherein a distance between adjacent ones of the second mold patterns is about three times a maximum width of one of the first spacers.

16. The method of claim 1, wherein a distance between adjacent ones of the third mold patterns is substantially equal to a maximum width of one of the first spacers.

17. The method of claim 1, wherein a maximum width of at least one of the second spacers is substantially equal to a maximum width of one of the first spacers.

18. A method for fabricating a semiconductor device, the method comprising:
forming an etch target layer on a substrate, the etch target layer including a separation region;
forming a lower mold layer on the etch target layer opposite the substrate;
forming an intermediate mold layer on the lower mold layer opposite the etch target layer;
forming first mold patterns on the intermediate mold layer;
forming first spacers on sidewalls of the first mold patterns, wherein a first of the first spacers that is on a sidewall of a first of the first mold patterns has a maximum width that is about one third a maximum width of the first of the first mold patterns;
etching the intermediate mold layer using the first spacers as etch masks to form second mold patterns, wherein a first of the second mold patterns has a width that is substantially equal to the maximum width of the first of the first spacers;
forming second spacers on sidewalls of the second mold patterns, wherein a first of the second spacers has a width that is substantially equal to the maximum width of the first of the first spacers;
etching the lower mold layer using at least the second spacers as etch masks to form third mold patterns;
forming a fourth mold pattern on at least one of the third mold patterns, the fourth mold pattern vertically overlapping the separation region;
etching the etch target layer using at least some of the third mold patterns as etch masks to form etch target layer patterns; and
forming conductive lines in spaces between the etch target layer patterns,
wherein etching the etch target layer using at least some of the third mold patterns as the etch masks to form the etch target layer patterns comprises etching the etch target layer using the fourth mold pattern and ones of the third mold patterns that are exposed by the fourth mold pattern as etch masks to form the etch target layer patterns.

19. The method of claim 18, wherein a distance between adjacent ones of the first mold patterns is about five times a maximum width of the first of the first spacers, and
wherein a distance between adjacent ones of the second mold patterns is about three times a maximum width of the first of the first spacers.

20. A method for fabricating a semiconductor device, the method comprising:
sequentially forming an etch target layer and a lower mold layer on a substrate, the etch target layer including a separation region;
forming a first etch stop pattern on the lower mold layer, the first etch stop pattern vertically overlapping the separation region;
forming an intermediate mold layer on the lower mold layer, the intermediate mold layer at least partially covering the first etch stop pattern;
forming first mold patterns on the intermediate mold layer;
forming first spacers on sidewalls of the first mold patterns;
etching the intermediate mold layer using the first spacers as etch masks to form second mold patterns, where portions of the second mold patterns are on the first etch stop pattern;
forming second spacers on sidewalls of the second mold patterns;
etching portions of the first etch stop pattern to form second etch stop patterns during the formation of the second spacers;
etching the lower mold layer using the second spacers and the second etch stop patterns as etch masks to form third mold patterns;
etching the etch target layer using the third mold patterns as etch masks to form insulating patterns; and
forming conductive lines in spaces between the insulating patterns.

* * * * *